(12) United States Patent
Or-Bach et al.

(10) Patent No.: US 11,374,042 B1
(45) Date of Patent: *Jun. 28, 2022

(54) 3D MICRO DISPLAY SEMICONDUCTOR DEVICE AND STRUCTURE

(71) Applicant: Monolithic 3D Inc., Klamath Falls, OR (US)

(72) Inventors: Zvi Or-Bach, Haifa (IL); Deepak C. Sekar, Sunnyvale, CA (US)

(73) Assignee: MONOLITHIC 3D INC., Klamath Falls, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/699,099

(22) Filed: Mar. 19, 2022

Related U.S. Application Data

(63) Continuation of application No. 17/487,369, filed on Sep. 28, 2021, now Pat. No. 11,315,965, which is a
(Continued)

(51) Int. Cl.

| | | |
|---|---|---|
| *H01L 27/146* | (2006.01) | |
| *H01L 33/16* | (2010.01) | |
| *H01L 25/075* | (2006.01) | |
| *H01L 27/15* | (2006.01) | |
| *H01L 33/62* | (2010.01) | |

(52) U.S. Cl.
CPC .... *H01L 27/14603* (2013.01); *H01L 25/0756* (2013.01); *H01L 27/156* (2013.01); *H01L 33/16* (2013.01); *H01L 33/62* (2013.01)

(58) Field of Classification Search
CPC ........... H01L 27/1214; H01L 27/14603; H01L 27/156; H01L 27/2409; H01L 27/2436; H01L 27/281; H01L 27/283; H01L 27/30; H01L 27/32; H01L 27/3206; H01L 25/042; H01L 25/0756; H01L 31/02327; H01L 31/0248; H01L 31/0352; H01L 31/16; H01L 33/16; H01L 33/62
See application file for complete search history.

(56) References Cited

U.S. PATENT DOCUMENTS 3,007,090 A   10/1961   Rutz
3,819,959 A   6/1974   Chang et al.
(Continued)

FOREIGN PATENT DOCUMENTS

EP         1267594 A2       12/2002
WO  PCT/US2008/063483      5/2008

OTHER PUBLICATIONS

Colinge, J. P., et al., "Nanowire transistors without Junctions", Nature Nanotechnology, Feb. 21, 2010, pp. 1-5.
(Continued)

*Primary Examiner* — Cheung Lee
(74) *Attorney, Agent, or Firm* — PatentPC; Bao Tran

(57) ABSTRACT

A 3D micro display, the 3D micro display including: a first level including a first single crystal layer, the first single crystal layer includes at least one LED driving circuit; a second level including a first plurality of light emitting diodes (LEDs), the first plurality of LEDs including a second single crystal layer, where the second level is disposed on top of the first level, where the second level includes at least ten individual first LED pixels; and a bonding structure, where the bonding structure includes oxide to oxide bonding.

20 Claims, 27 Drawing Sheets

Related U.S. Application Data continuation-in-part of application No. 17/216,597, filed on Mar. 29, 2021, now Pat. No. 11,164,898, which is a continuation-in-part of application No. 17/113,045, filed on Dec. 5, 2020, now Pat. No. 10,998,374, which is a continuation-in-part of application No. 17/027,217, filed on Sep. 21, 2020, now Pat. No. 10,943,934, which is a continuation-in-part of application No. 16/860,027, filed on Apr. 27, 2020, now Pat. No. 10,833,108, which is a continuation-in-part of application No. 15/920,499, filed on Mar. 14, 2018, now Pat. No. 10,679,977, which is a continuation-in-part of application No. 14/936,657, filed on Nov. 9, 2015, now Pat. No. 9,941,319, which is a continuation-in-part of application No. 13/274,161, filed on Oct. 14, 2011, now Pat. No. 9,197,804, which is a continuation-in-part of application No. 12/904,103, filed on Oct. 13, 2010, now Pat. No. 8,163,581.

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strife |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |

(56) References Cited

U.S. PATENT DOCUMENTS

| | | |
|---|---|---|
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B1 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu et al. |
| 7,402,897 B2 | 7/2008 | Leedy |

(56) References Cited

U.S. PATENT DOCUMENTS

| | | |
|---|---|---|
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,266,560 B2 | 8/2012 | McIlrath |
| 8,264,065 B2 | 9/2012 | Su et al. |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,566,762 B2 | 8/2013 | Morimoto et al. |
| 8,525,342 B2 | 10/2013 | Chandrasekaran |
| 8,546,956 B2 | 10/2013 | Nguyen |
| 8,603,888 B2 | 12/2013 | Liu |
| 8,611,388 B2 | 12/2013 | Krasulick et al. |

(56) References Cited

U.S. PATENT DOCUMENTS

| | | |
|---|---|---|
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0108627 A1 | 5/2006 | Choi |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |

(56) References Cited

U.S. PATENT DOCUMENTS

| | | |
|---|---|---|
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1* | 5/2007 | Kashiwabara ...... H01L 27/3206 257/291 |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | Mcllrath |
| 2009/0057879 A1 | 3/2009 | Garrou et al. |
| 2009/0061572 A1 | 3/2009 | Hareland et al. |
| 2009/0064058 A1 | 3/2009 | Mcllrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |

(56) References Cited

U.S. PATENT DOCUMENTS

| | | |
|---|---|---|
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146193 A1 | 6/2012 | Stuber et al. |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0207243 A1 | 8/2013 | Fuergut |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |

(56) References Cited

U.S. PATENT DOCUMENTS

| | | |
|---|---|---|
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0021785 A1 | 1/2015 | Lin |
| 2015/0034898 A1 | 2/2015 | Wang |
| 2015/0243871 A1 | 8/2015 | Saitoh |
| 2015/0255418 A1 | 9/2015 | Gowda |
| 2015/0279829 A1 | 10/2015 | Kuo |
| 2015/0340369 A1 | 11/2015 | Lue |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278858 A1 | 9/2017 | Walker |
| 2018/0090219 A1 | 3/2018 | Harari |
| 2018/0090368 A1 | 3/2018 | Kim |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner |
| 2019/0157296 A1 | 5/2019 | Harari et al. |
| 2020/0020408 A1 | 1/2020 | Norman |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.

Burr, G. W., et al., "Overview of candidate device technologies for storage-class memory," IBM Journal of Research and Development, vol. 52, No. 4.5, pp. 449-464, Jul. 2008.

Bez, R., et al., "Introduction to Flash memory," Proceedings IEEE, 91(4), 489-502 (2003).

Auth, C., et al., "45nm High-k + Metal Gate Strain-Enchanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et.al., "NiSi Salicide Technology for Scaled CMOS," Microelectronic Engineering, 60 (2002), pp157-169;.

Froment, B., et.al., "Nickel vs. Cobalt Silicide integration forsub-50nm CMOS", IMEC ESS Circuits, 2003. pp. 215-219.

James, D., "65 and 45-nm Devices—an Overview", Semicon West, Jul. 2008, paper No. ctr_024377.

Davis, J.A., et.al., "Interconnect Limits on Gigascale Integration(GSI) in the 21st Century", Proc. IEEE, vol. 89, No. 3, pp. 305-324, Mar. 2001.

Shino, T., et al., "Floating Body RAM Technology and its Scalability to 32nm Node and Beyond," Electron Devices Meeting, 2006, IEDM '06, International, pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

Okhonin, S., et al., "New Generation of Z-RAM", Electron Devices Meeting, 2007. IEDM 2007. IEEE International, pp. 925-928, Dec. 10-12, 2007.

Henttinen, K et al., "Mechanically Induced Si Layer Transfer in Hydrogen-Implanted Si Wafers," Applied Physics Letters, Apr. 24, 2000, p. 2370-2372, vol. 76, No. 17.

Lee, C.-W., et al., "Junctionless multigate field-effect transistor," Applied Physics Letters, vol. 94, p. 053511-1 to -2, 2009.

Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518,13-15, Dec. 2004.

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.

Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.

Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.

Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.

Henttinen, K. et al., "Cold ion-cutting of hydrogen implanted Si," J. Nucl. Instr, and Meth, in Phys. Res. B, 2002, pp. 761-766, vol. 190.

Brumfiel, G., "Solar cells sliced and diced", May 19, 2010, Nature News.

Dragoi, et al., "Plasma-activated wafer bonding: the new low-temperature tool for MEMS fabrication", Proc. SPIE, vol. 6589, 65890T (2007).

(56) References Cited

OTHER PUBLICATIONS

Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, p. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AIGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, p. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulatorand Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qul, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions On Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings - Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on yourFPGA", (2004) Journal of FPGA and Structured ASIC, 2 (3).

(56) References Cited

OTHER PUBLICATIONS

Nicolici, N., et al., "Design-for-debug for post-silicon validation: Can high-level descriptions help?", (2009) Proceedings—IEEE International High-Level Design Validation and Test Workshop, HLDVT, pp. 172-175.

Park, S.-B., et al., "IFRA: Instruction Footprint Recording and Analysis for Post-Silicon Bug Localization", (2008) Design Automation Conference (DAC08), Jun. 8-13, 2008, Anaheim, Ca, USA, pp. 373-378.

Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.

Moore, B., et al., "High Throughput Non-contact SiP Testing", (2007) Proceedings—International Test Conference, paper 12.3.

Riley, M.W., et al., "Cell broadband engine debugging for unknown events", (2007) IEEE Design and Test of Computers, 24 (5), pp. 486-493.

Vermeulen, B., "Functional debug techniques for embedded systems", (2008) IEEE Design and Test of Computers, 25 (3), pp. 208-215.

Vermeulen, B., et al., "Automatic Generation of Breakpoint Hardware for Silicon Debug", Proceeding of the 41st Design Automation Conference, Jun. 7-11, 2004, p. 514-517.

Vermeulen, B., et al., "Design for debug: Catching design errors in digital chips", (2002) IEEE Design and Test of Computers, 19 (3), pp. 37-45.

Vermeulen, B., et al., "Core-based scan architecture for silicon debug", (2002) IEEE International Test Conference (TC), pp. 638-647.

Vanrootselaar, G. J., et al., "Silicon debug: scan chains alone are not enough", (1999) IEEE International Test Conference (TC), pp. 892-902.

Kim, G.-S., et al., "A 25-mV-sensitivity 2-GB/s optimum-logic-threshold capacitive-coupling receiver for wireless wafer probing systems", (2009) IEEE Transactions on Circuits and Systems II: Express Briefs, 56 (9), pp. 709-713.

Sellathamby, C.V., et al., "Non-contact wafer probe using wireless probe cards", (2005) Proceedings—International Test Conference, 2005, pp. 447-452.

Jung, S.-M., et al., "Soft Error Immune 0.46pm2 SRAM Cell with MIM Node Capacitor by 65nm CMOS Technology for Ultra High Speed SRAM", IEDM 2003, pp. 289-292.

Brillouet, M., "Emerging Technologies on Silicon", IEDM 2004, pp. 17-24.

Meindl, J. D., "Beyond Moore'S Law: The Interconnect Era", IEEE Computing in Science & Engineering, Jan./Feb. 2003, pp. 20-24.

Lin, X., et al., "Local Clustering 3-D Stacked CMOS Technology for Interconnect Loading Reduction", IEEE Transactions on electron Devices, vol. 53, No. 6, Jun. 2006, pp. 1405-1410.

He, T., et al., "Controllable Molecular Modulation of Conductivity in Silicon-Based Devices", J. Am. Chem. Soc. 2009, 131, 10023-10030.

Henley, F., "Engineered Substrates Using the Nanocleave Process", SemiconWest, TechXPOT Conference—Challenges in Device Scaling, Jul. 19, 2006, San Francisco.

Diamant, G., et al., "Integrated Circuits based on Nanoscale Vacuum Phototubes", Applied Physics Letters 92, 262903-1 to 262903-3 (2008).

Landesberger, C., et al., "Carrier techniques for thin wafer processing", CS Mantech Conference, May 14-17, 2007 Austin, Texas, pp. 33-36.

Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.

Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.

Borland, J.O., "Low Temperature Activation Of Ion Implanted Dopants: A Review", International Workshop on Junction technology 2002, S7-3, Japan Society of Applied Physics, pp. 85-88.

Vengurlekar, A., et al., "Hydrogen Plasma Enhancement of Boron Activation in Shallow Junctions", Applied Physics Letters, vol. 85, No. 18, Nov. 1, 2004, pp. 4052-4054.

El-Maleh, A. H., et al., "Transistor-Level Defect Tolerant Digital System Design at the Nanoscale", Research Proposal Submitted to Internal Track Research Grant Programs, 2007. Internal Track Research Grant Programs.

Austin, T., et al., "Reliable Systems on Unreliable Fabrics", IEEE Design & Test of Computers, Jul./Aug. 2008, vol. 25, issue 4, pp. 322-332.

Borkar, S., "Designing Reliable Systems from Unreliable Components: The Challenges of Transistor Variability and Degradation", IEEE Micro, IEEE Computer Society, Nov.-Dec. 2005, pp. 10-16.

Zhu, S., et al., "N-Type Schottky Barrier Source/Drain MOSFET Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.

Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.

Awano, M., et al., "Advanced DSS MOSFET Technology for Ultrahigh Performance Applications", 2008 Symposium on VLSI Technology Digest of Technical Papers, pp. 24-25.

Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.

Zhang, M., et al., "Schottky barrier height modulation using dopant segregation in Schottky-barrier SOI-MOSFETs", Proceeding of ESSDERC, Grenoble, France, 2005, pp. 457-460.

Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.

Ko, C.H., et al., "NiSi Schottky Barrier Process-Strained Si (SB-PSS) CMOS Technology for High Performance Applications", 2006 Symposium on VLSI Technology Digest of Technical Papers.

Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.

Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.

Kaneko, A., et al., "High-Performance FinFET with Dopant-Segregated Schottky Source/Drain", IEDM 2006.

Kinoshita, A., et al., "Ultra Low Voltage Operations in Bulk CMOS Logic Circuits with Dopant Segregated Schottky Source/Drain Transistors", IEDM 2006.

Kinoshita, A., et al., "Comprehensive Study on Injection Velocity Enhancement in Dopant-Segregated Schottky MOSFETs", IEDM 2006.

Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.

Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.

Unipixel Displays, Inc. white paper, "Time Multi-plexed Optical Shutter (TMOS) Displays", Jun. 2007, pp. 1-49.

(56) References Cited

OTHER PUBLICATIONS

Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+'" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.

Kim, S.D., et al., "Advanced source/drain engineering forbox-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Yang, M., et al., "High Performance CMOS Fabricated on Hybrid Substrate with Different Crystal Orientation," Proceedings IEDM 2003.
Yin, H., et al., "Scalable 3-D finlike poly-Si TFT and its nonvolatile memory application," IEEE Trans. Electron Devices, vol. 55, No. 2, pp. 578-584, Feb. 2008.
Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.
Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.
Khakifirooz, A., "Etsoi Technology for 20nm and Beyond", SOI Consortium Workshop: Fully Depleted SOI, Apr. 28, 2011, Hsinchu Taiwan.
Kim, I.-K., et al.."Advanced Integration Technology for a Highly Scalable Soi Dram with SOC (Silicon-On-Capacitors)", IEDM 1996, pp. 96-605-608, 22.5.4.
Lee, B.H., et al., "A Novel CMP Method for cost-effective Bonded SOI Wafer Fabrication," Proceedings 1995 IEEE International SOI Conference, Oct. 1995, pp. 60-61.
Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.
Chang, Wei, et al., "Drain-induced Schottky barrier source-side hot carriers and its application to program local bits of nanowire charge-trapping memories," Japanese Journal of Applied Physics 53, 094001 (2014) p. 094001-1 to 094001-5.
Topol, A.W., et al., "Enabling SOI-Based Assembly Technology for Three-Dimensional (3D) Integrated Circuits (ICs)," IEDM Tech. Digest, Dec. 5, 2005, pp. 363-366.
Demeester, P. et al., "Epitaxial lift-off and its applications," Semicond. Sci. Technol., 1993, pp. 1124-1135, vol. 8.
Yoon, J., et al., "GaAs Photovoltaics and optoelectronics using releasable multilayer epitaxial assemblies", Nature, vol. 465, May 20, 2010, pp. 329-334.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.
Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.
Kim, W., et al., "Multi-layered Vertical Gate NAND Flash overcoming stacking limit for terabit density storage", Symposium on VLSI Technology Digest of Technical Papers, 2009, pp. 188-189.
Dicioccio, L., et al., "Direct bonding for wafer level 3D integration", ICICDT 2010, pp. 110-113.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.

(56) References Cited

OTHER PUBLICATIONS

Celler, G.K. et al., "Frontiers of silicon-on-insulator," J. App. Phys., May 1, 2003, pp. 4955-4978, vol. 93, No. 9.
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Hui, K. N., et al., "Design of vertically-stacked polychromatic light-emitting diodes," Optics Express, Jun. 8, 2009, pp. 9873-9878, vol. 17, No. 12.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Flamand, G. et al., "Towards Highly Efficient 4-Terminal Mechanical Photovoltaic Stacks," III-Vs Review, Sep.-Oct. 2006, pp. 24-27, vol. 19, Issue 7.
Zahler, J.M et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, p. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P. D. et al., "Design and CAD for 3D Integrated Circuits," 45th ACM/IEEE Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D Ic Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S et al., "CELONCEL: Effective Design Technique for 3-D Monolithic Integration targeting High Performance Integrated Circuits", Asia pacific DAC 2011, paper 4A-4.
Choudhury, D., "3D Integration Technologies for Emerging Microsystems", IEEE Proceedings of the IMS 2010, pp. 1-4.
Lee, Y.-J., et al., "3D 65nm CMOS with 320°C Microwave Dopant Activation", IEDM 2010, pp. 1-4.
Crnogorac, F., et al., "Semiconductor crystal islands for three-dimensional integration", J. Vac. Sci. Technol. B28(6), Nov./Dec. 2010, pp. C6P53-58.
Park, J.-H., et al., "N-Channel Germanium MOSFET Fabricated Below 360 °C by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3(Stacked Single-crystal Si) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu-Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.

(56) References Cited

OTHER PUBLICATIONS

Souri, S. J., "Interconnect Performance in 3-Dimensional Integrated Circuits", PhD Thesis, Stanford, Jul. 2003.

Uemoto, Y., et al., "A High-Performance Stacked-CMOS SRAM Cell by Solid Phase Growth Technique", Symposium on VLSI Technology, 2010, pp. 21-22.

Jung, S.-M., et al., "Highly Cost Effective and High Performance 65nm S3( Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.

Steen, S.E., et al., "Overlay as the key to drive wafer scale 3D integration", Microelectronic Engineering 84 (2007) 1412-1415.

Maeda, N., et al., "Development of Sub 10-µm Ultra-Thinning Technology using Device Wafers for 3D Manufacturing of Terabit Memory", 2010 Symposium on VLSI Technology Digest of Technical Papers, pp. 105-106.

Chan, M., et al., "3-Dimensional Integration for Interconnect Reduction in for Nano-CMOS Technologies", IEEE Tencon, Nov. 23, 2006, Hong Kong.

Dong, X., et al., "Chapter 10: System-Level 3D Ic Cost Analysis and Design Exploration", in Xie, Y., et al., "Three-Dimensional Integrated Circuit Design", book in series "Integrated Circuits and Systems" ed. A. Andrakasan, Springer 2010.

Naito, T. et al., "World's first monolithic 3D-FPGA with TFT SRAM over 90nm 9 layer Cu CMOS", 2010 Symposium on VLSI Technology Digest of Technical Papers, pp. 219-220.

Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.

Cong, J., et al., "Quantitative Studies of Impact of 3D IC Design on Repeater Usage", Proceedings of International VLSI/ULSI Multilevel Interconnection Conference, pp. 344-348, 2008.

Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.

Crnogorac, F., et al., "Nano-graphoepitaxy of semiconductors for 3D integration", Microelectronic Engineering 84 (2007) 891-894.

Koyanagi, M, "Different Approaches to 3D Chips", 3D IC Review, Stanford University, May 2005.

Koyanagi, M, "Three-Dimensional Integration Technology and Integrated Systems", ASPDAC 2009 presentation.

Koyanagi, M., et al., "Three-Dimensional Integration Technology and Integrated Systems", ASPDAC 2009, paper 4D-1, pp. 409-415.

Hayashi, Y., et al., "A New Three Dimensional IC Fabrication Technology Stacking Thin Film Dual-CMOS Layers", IEDM 1991, paper 25.6.1, pp. 657-660.

Clavelier, L., et al., "Engineered Substrates for Future More Moore and More Than Moore Integrated Devices", IEDM 2010, paper 2.6.1, pp. 42-45.

Kim, K., "From The Future Si Technology Perspective: Challenges and Opportunities", IEDM 2010, pp. 1.1.1 -1.1.9.

Ababei, C., et al., "Exploring Potential Benefits of 3D FPGA Integration", in book by Becker, J. et al. Eds., "Field Programmable Logic 2004", LNCS 3203, pp. 874-880, 2004, Springer-Verlag Berlin Heidelberg.

Ramaswami, S., "3D TSV IC Processing", 3DIC Technology Forum Semicon Taiwan 2010, Sep. 9, 2010.

Davis, W.R., et al., "Demystifying 3D Ics: Pros and Cons of Going Vertical", IEEE Design and Test of Computers, Nov.-Dec. 2005, pp. 498-510.

Lin, M., et al., "Performance Benefits of Monolithically Stacked 3DFPGA", FPGA06, Feb. 22-24, 2006, Monterey, California, pp. 113-122.

Dong, C., et al., "Performance and Power Evaluation of a 3D CMOS/Nanomaterial Reconfigurable Architecture", ICCAD 2007, pp. 758-764.

Gojman, B., et al., "3D Nanowire-Based Programmable Logic", International Conference on Nano-Networks (Nanonets 2006), Sep. 14-16, 2006.

Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.

Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.

Rajendran, B., et al., "Thermal Simulation of laser Annealing for 3D Integration", Proceedings VMIC 2003.

Woo, H.-J., etaL., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.

Sadaka, M., et al., "Building Blocks for wafer level 3D integration",www.electroiq.com, Aug. 18, 2010, last accessed Aug. 18, 2010.

Madan, N., et al., "Leveraging 3D Technology for Improved Reliability," Proceedings of the 40th Annual IEEE/ACM International Symposium on Microarchitecture (MICRO 2007), IEEE Computer Society.

Hayashi, Y., et al., "Fabrication of Three Dimensional IC Using "Cumulatively Bonded IC" (CUBIC) Technology", 1990 Symposium on VLSI Technology, pp. 95-96.

Akasaka, Y., "Three Dimensional IC Trends," Proceedings of the IEEE, vol. 24, No. 12, Dec. 1986.

Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.

Kunio, T., et al., "Three Dimensional Ics, Having Four Stacked Active Device Layers," IEDM 1989, paper 34.6, pp. 837-840.

Gaillardon, P. E., et al., "Can We Go Towards True 3-D Architectures?," DAC 2011, paper 58, pp. 282-283.

Yun, J-G., et al., "Single-Crystalline Si Stacked Array (STAR) NAND Flash Memory," IEEE Transactions on Electron Devices, vol. 58, No. 4, Apr. 2011, pp. 1006-1014.

Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.

Goplen, B., et al., "Thermal Via Placement in 3DICs," Proceedings of the International Symposium on Physical Design, Apr. 3-6, 2005, San Francisco.

Bobba, S., et al., "Performance Analysis of 3-D Monolithic Integrated Circuits," 2010 IEEE International 3D Systems Integration Conference (3DIC), Nov. 2010, Munich, pp. 1-4.

Batude, P., et al., "Demonstration of low temperature 3D sequential FDSOI integration down to 50nm gate length," 2011 Symposium on VLSI Technology Digest of Technical Papers, pp. 158-159.

Batude, P., et al., "Advances, Challenges and Opportunities in 3D CMOS Sequential Integration," 2011 IEEE International Electron Devices Meeting, paper 7.3, Dec. 2011, pp. 151-154.

Yun, C. H., et al., "Transfer of patterned ion-cut silicon layers", Applied Physics Letters, vol. 73, No. 19, Nov. 1998, pp. 2772-2774.

Ishihara, R., et al., "Monolithic 3D-ICs with single grain Si thin film transistors," Solid-State Electronics 71 (2012) pp. 80-87.

Lee, S. Y., et al., "Architecture of 3D Memory Cell Array on 3D IC," IEEE International Memory Workshop, May 20, 2012, Monterey, CA.

Lee, S. Y., et al., "3D IC Architecture for High Density Memories," IEEE International Memory Workshop, p. 1-6, May 2010.

Rajendran, B., et al., "CMOS transistor processing compatible with monolithic 3-D Integration," Proceedings VMIC 2005.

Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.

(56) References Cited

OTHER PUBLICATIONS

Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.

Kim, J., et al., "A Stacked Memory Device on Logic 3D Technology for Ultra-high-density Data Storage," Nanotechnology, vol. 22, 254006 (2011).

Lee, K. W., et al., "Three-dimensional shared memory fabricated using wafer stacking technology," IEDM Tech. Dig., 2000, pp. 165-168.

Chen, H. Y., et al., "HfOx Based Vertical Resistive Random Access Memory for Cost Effective 3D Cross-Point Architecture without Cell Selector," Proceedings IEDM 2012, pp. 497-499.

Huet, K., et al., "Ultra Low Thermal Budget Anneals for 3D Memories: Access Device Formation," Ion Implantation Technology 2012, AIP Conf Proceedings 1496, 135-138 (2012).

Batude, P., et al., "3D Monolithic Integration," ISCAS 2011 pp. 2233-2236.

Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.

Vinet, M., et.al., "Germanium on Insulator and new 3D architectures opportunities for integration", International Journal of Nanotechnology, vol. 7, No. 4, (Aug. 2010) pp. 304-319.

Bernstein, K., et al., "Interconnects in the Third Dimension: Design Challenges for 3DICs," Design Automation Conference, 2007, DAC'07, 44th ACM/IEEE, vol. No., pp. 562-567, Jun. 4-8, 2007.

Kuroda, T., "ThruChip Interface for Heterogeneous Chip Stacking," ElectroChemicalSociety Transactions, 50 (14) 63-68 (2012).

Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).

Kuroda, T., "Wireless Proximity Communications for 3D System Integration," Future Directions in IC and Package Design Workshop, Oct. 29, 2007.

Qiang, J-Q, "3-D Hyperintegration and Packaging Technologies for Micro-Nano Systems," Proceedings of the IEEE, 97.1 (2009) pp. 18-30.

Lee, B.H., et al., "A Novel Pattern Transfer Process for Bonded SOI Giga-bit DRAMs," Proceedings 1996 IEEE International SOI Conference, Oct. 1996, pp. 114-115.

Wu, B., et al., "Extreme ultraviolet lithography and three dimensional circuits," Applied Phyisics Reviews, 1, 011104 (2014).

Delhougne, R., et al., "First Demonstration of Monocrystalline Silicon Macaroni Channel for 3-D NAND Memory Devices" IEEE VLSI Tech Digest, 2018, pp. 203-204.

Kim, J., et al.; "A stacked memory device on logic 3D technology for ultra-high-density data storage"; Nanotechnology 22 (2011) 254006 (7pp).

Hsieh, P-Y, et al.."Monolithic 3D BEOL FinFET switch arrays using location-controlled-grain technique in voltage regulator with better FOM than 2D regulators", IEDM paper 3.1, pp. IEDM19-46 to -49.

Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to 405.

Rachmady, W., et al.,"300mm Heterogeneous 3D Integration of Record Performance Layer Transfer Germanium PMOS with Silicon NMOS for Low Power High Performance Logic Applications", IEDM 2019, paper 29.7, pp. IEDM19-697 to 700.

\* cited by examiner

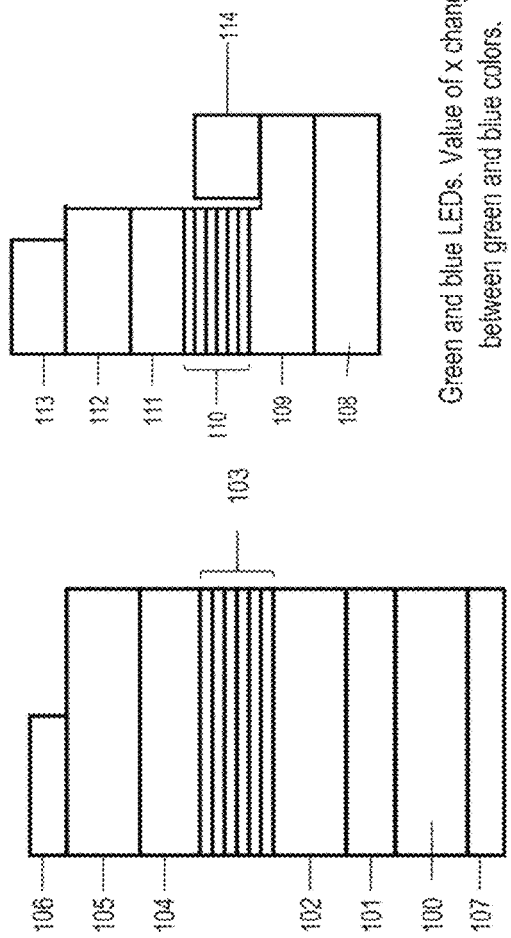
Fig. 1A (Prior Art)
Fig. 1B (Prior Art)
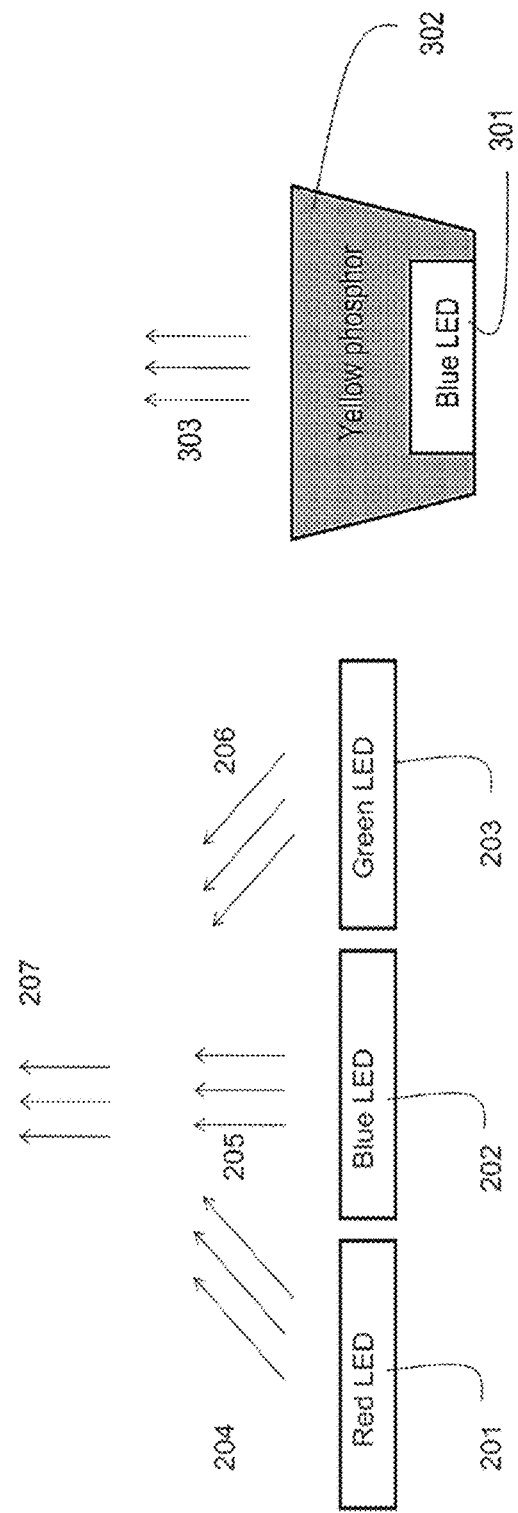
Fig. 2 (Prior Art)
Fig. 3 (Prior Art)

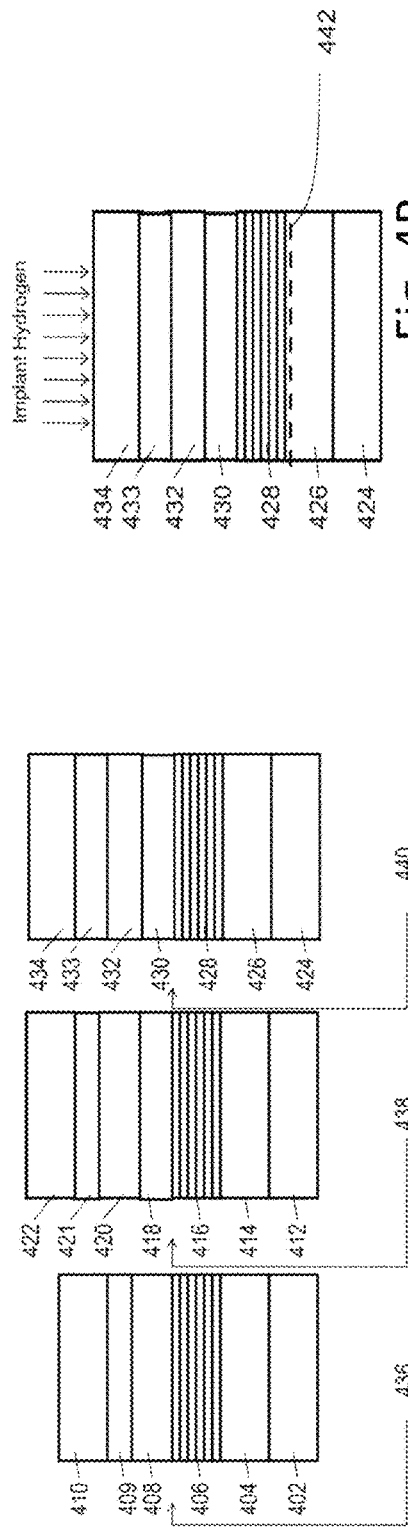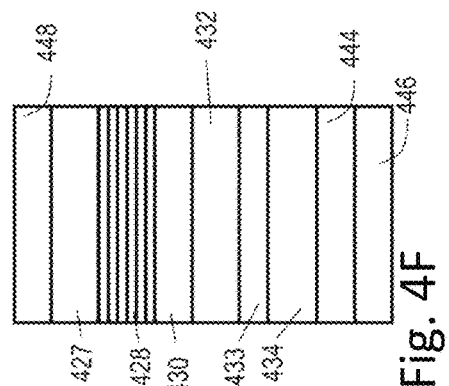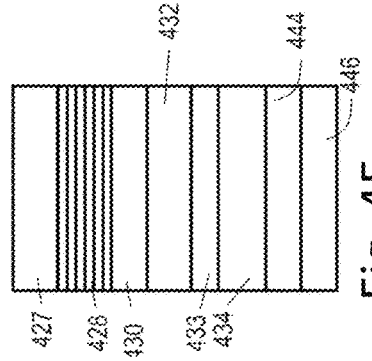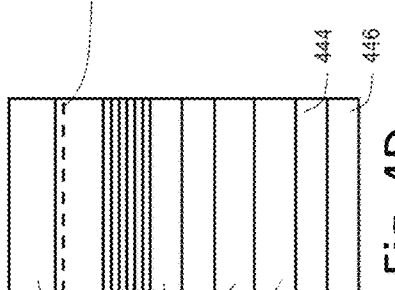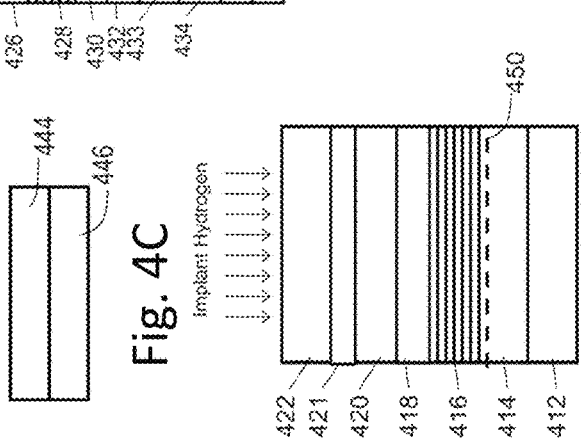

Figures 4H, 4I, 4J, 4K, 4L, 4M, 4N, 4O:
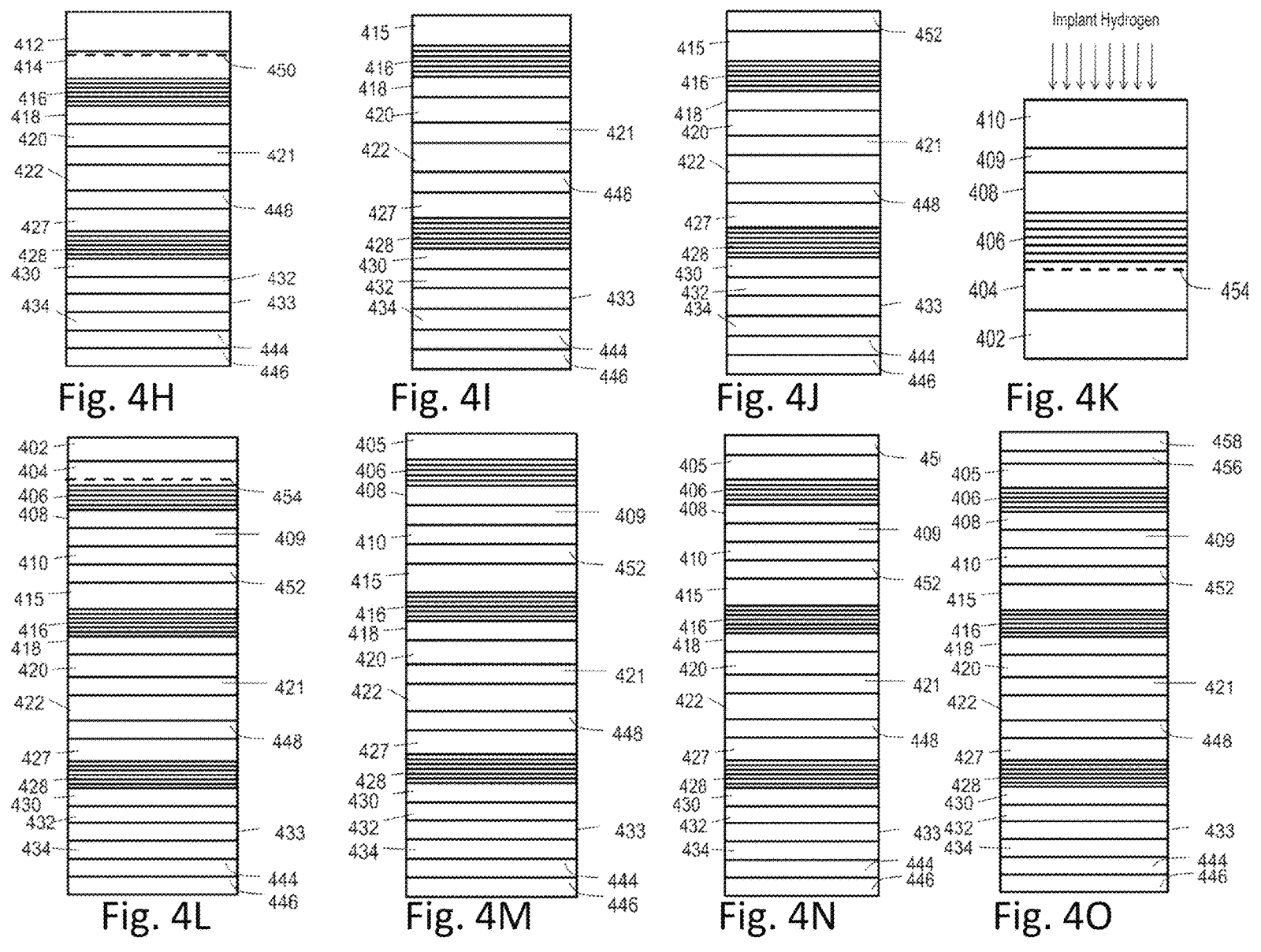

Fig. 4H, Fig. 4I, Fig. 4J, Fig. 4K, Fig. 4L, Fig. 4M, Fig. 4N, Fig. 4O

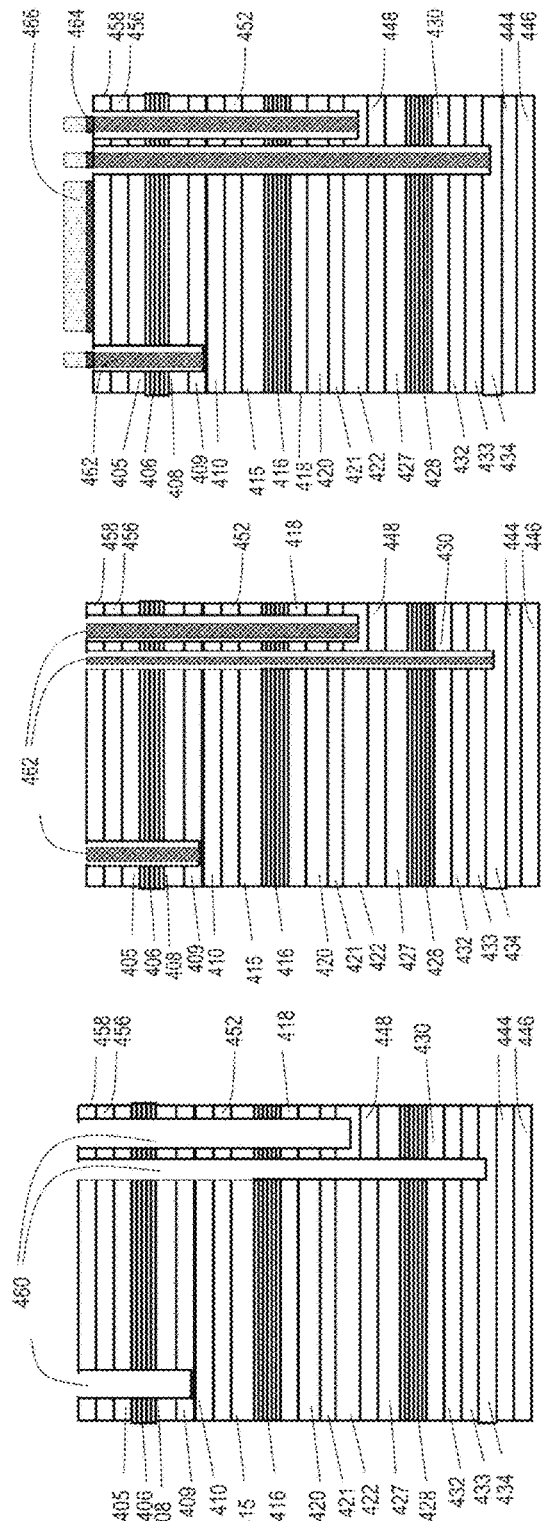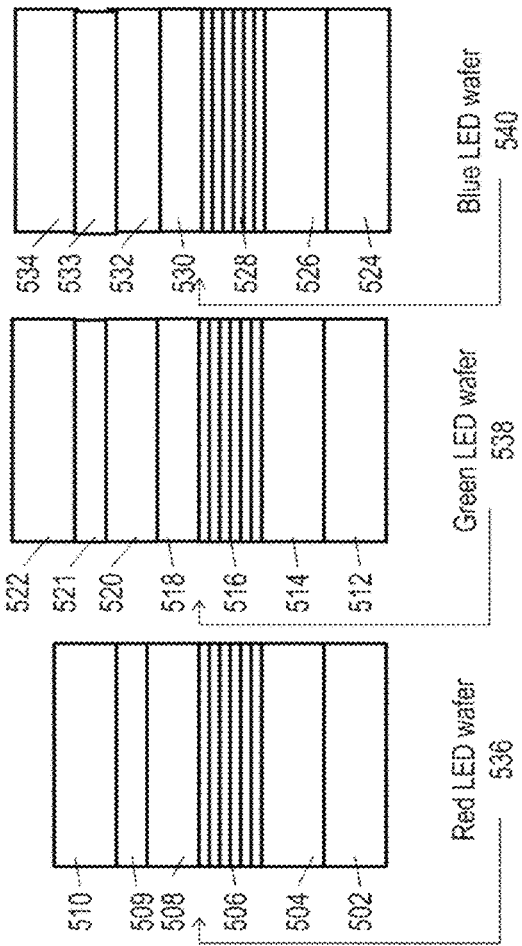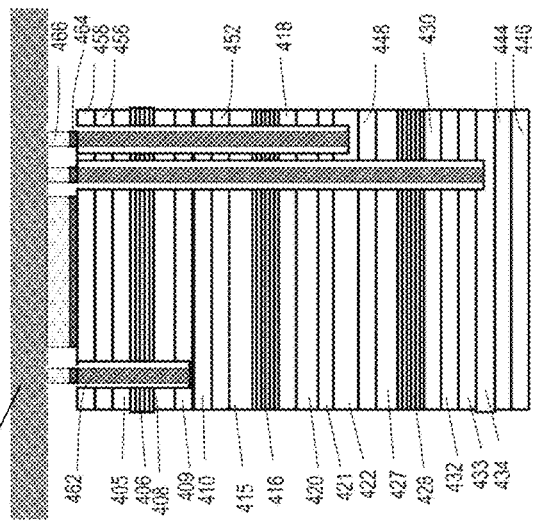

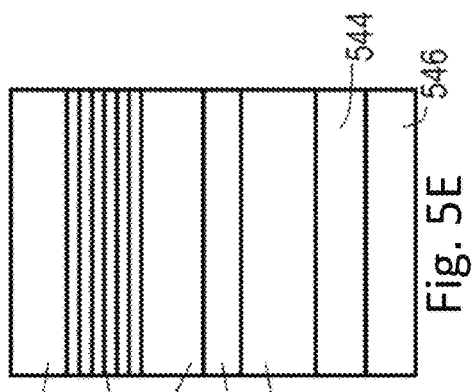
Fig. 5B
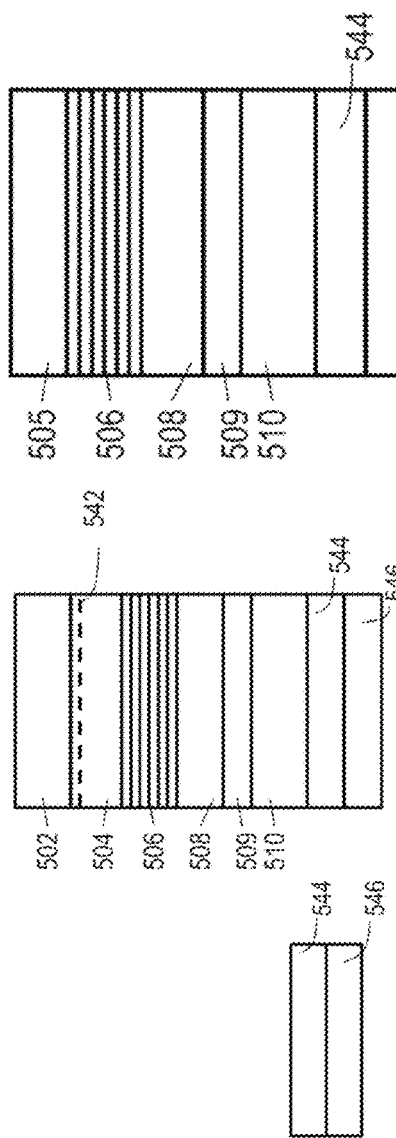
Fig. 5C / Fig. 5D / Fig. 5E
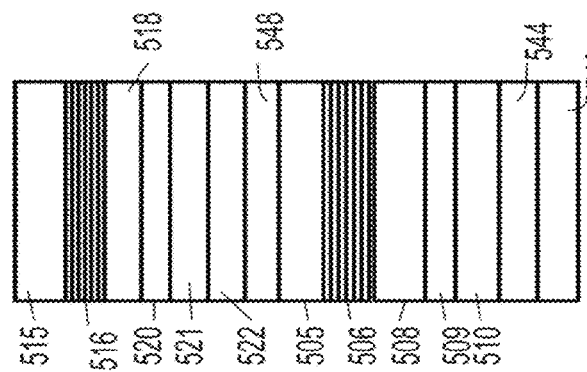
Fig. 5I
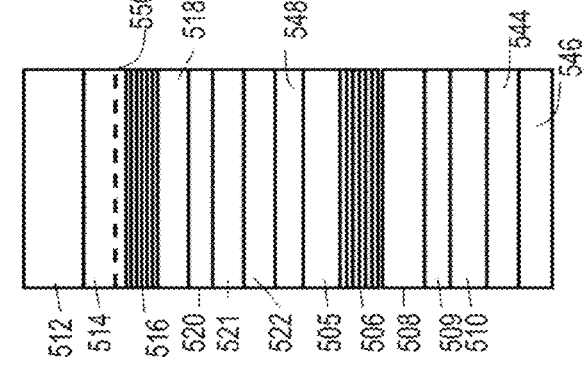
Fig. 5H
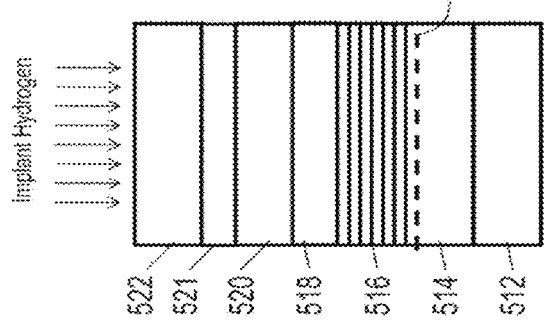
Fig. 5G
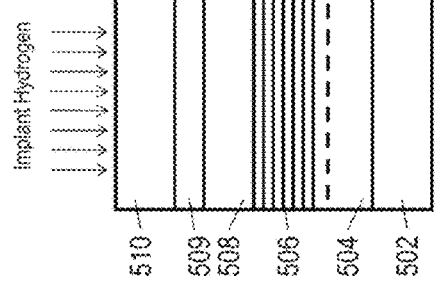
Fig. 5F
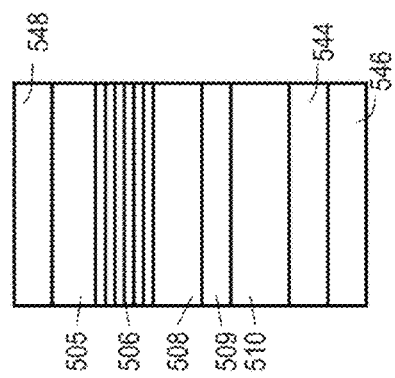

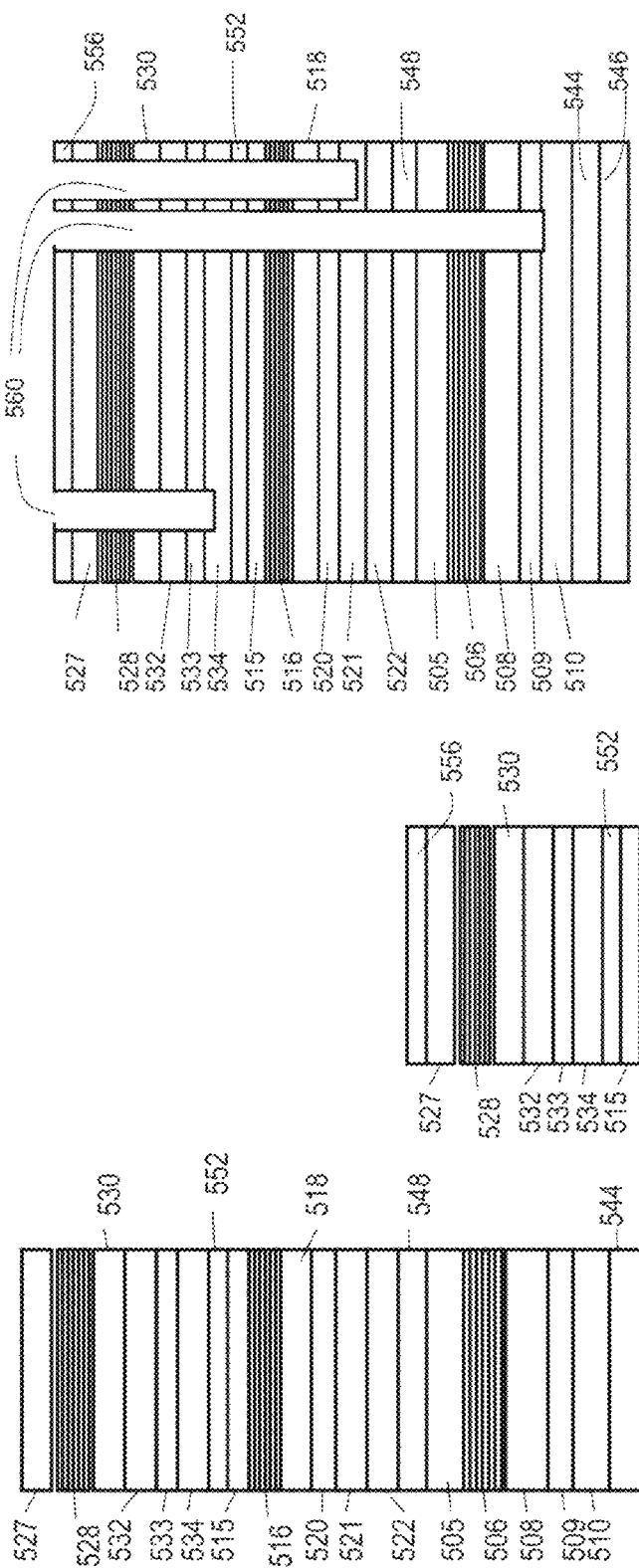

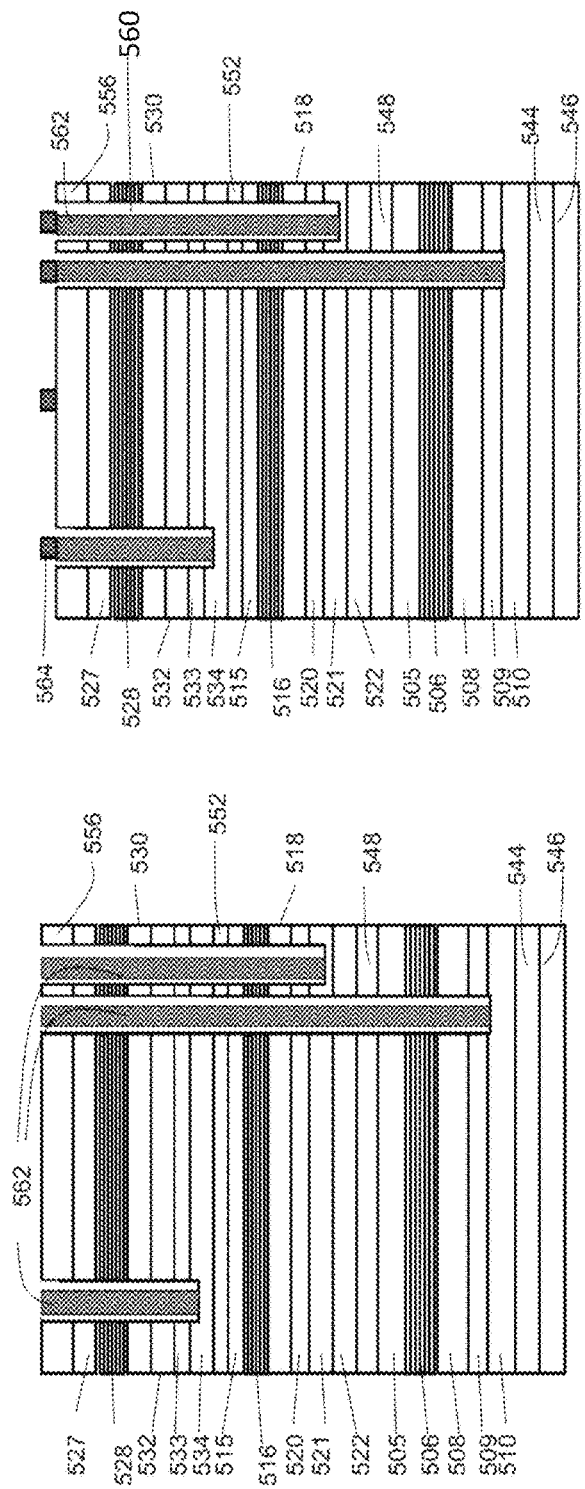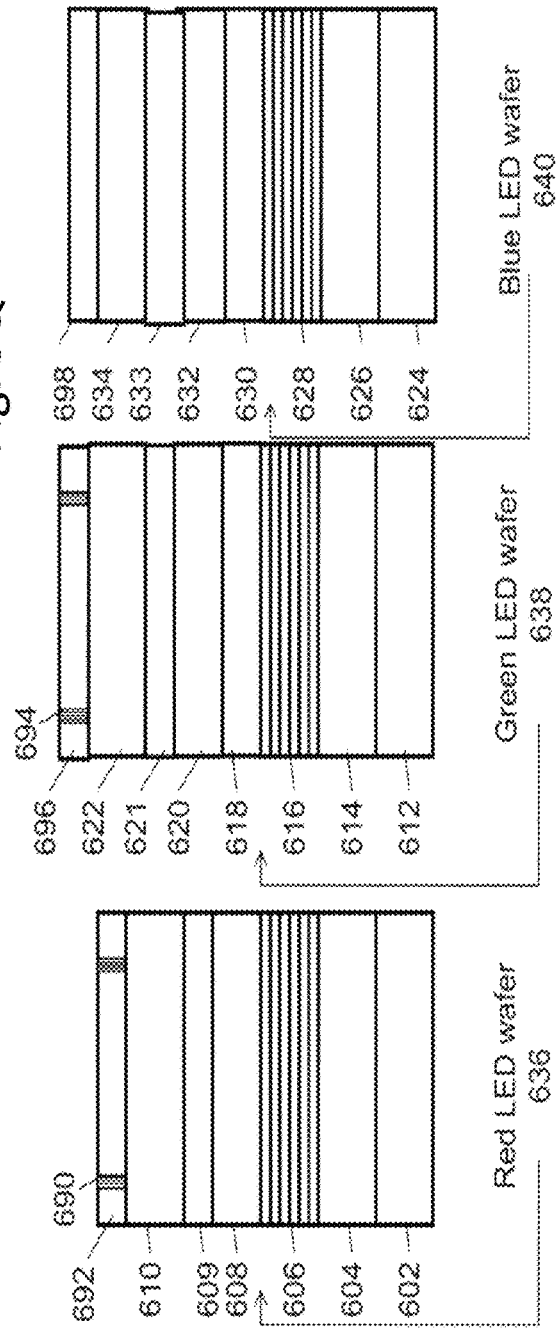
Fig. 5P
Fig. 5Q
Fig. 6A

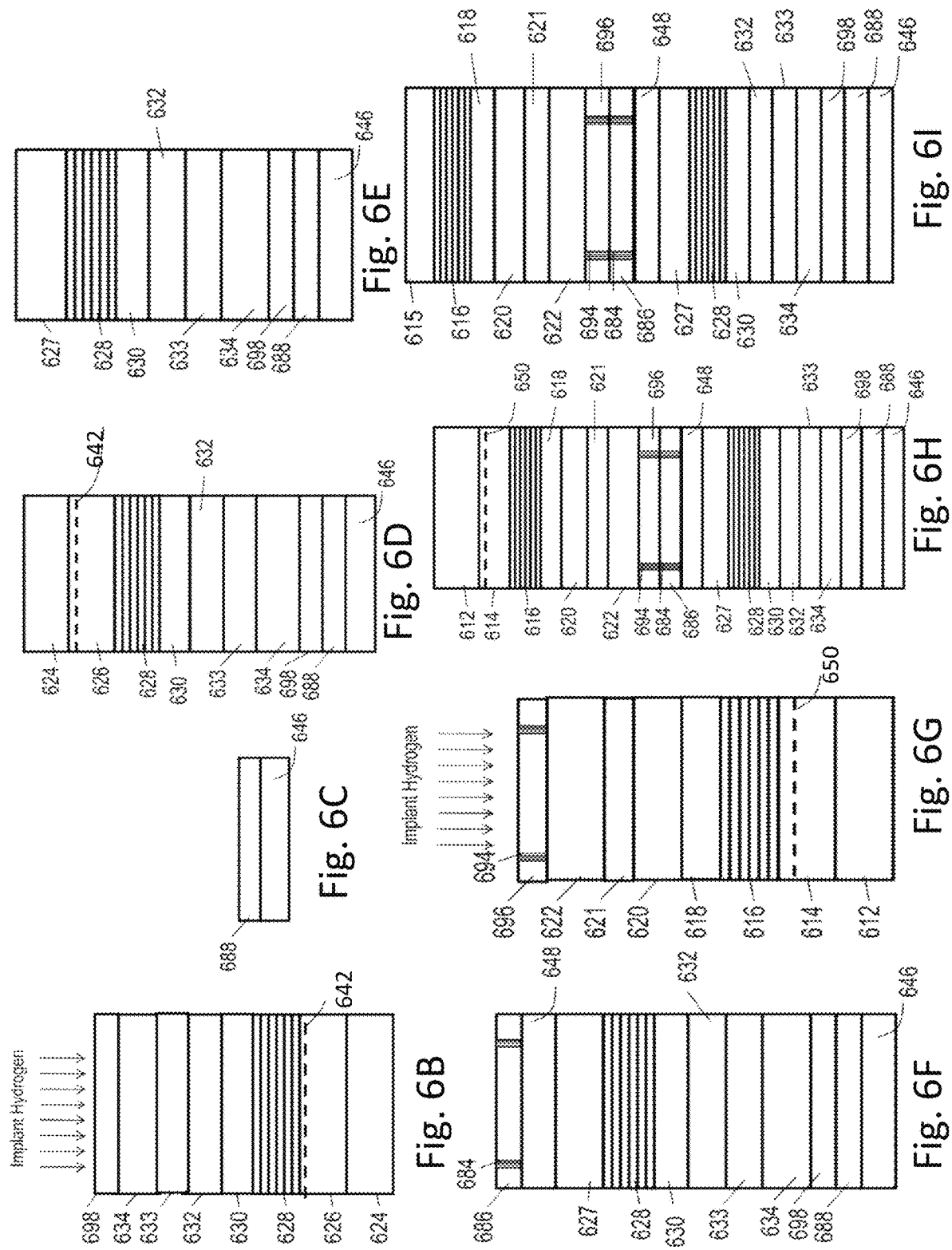

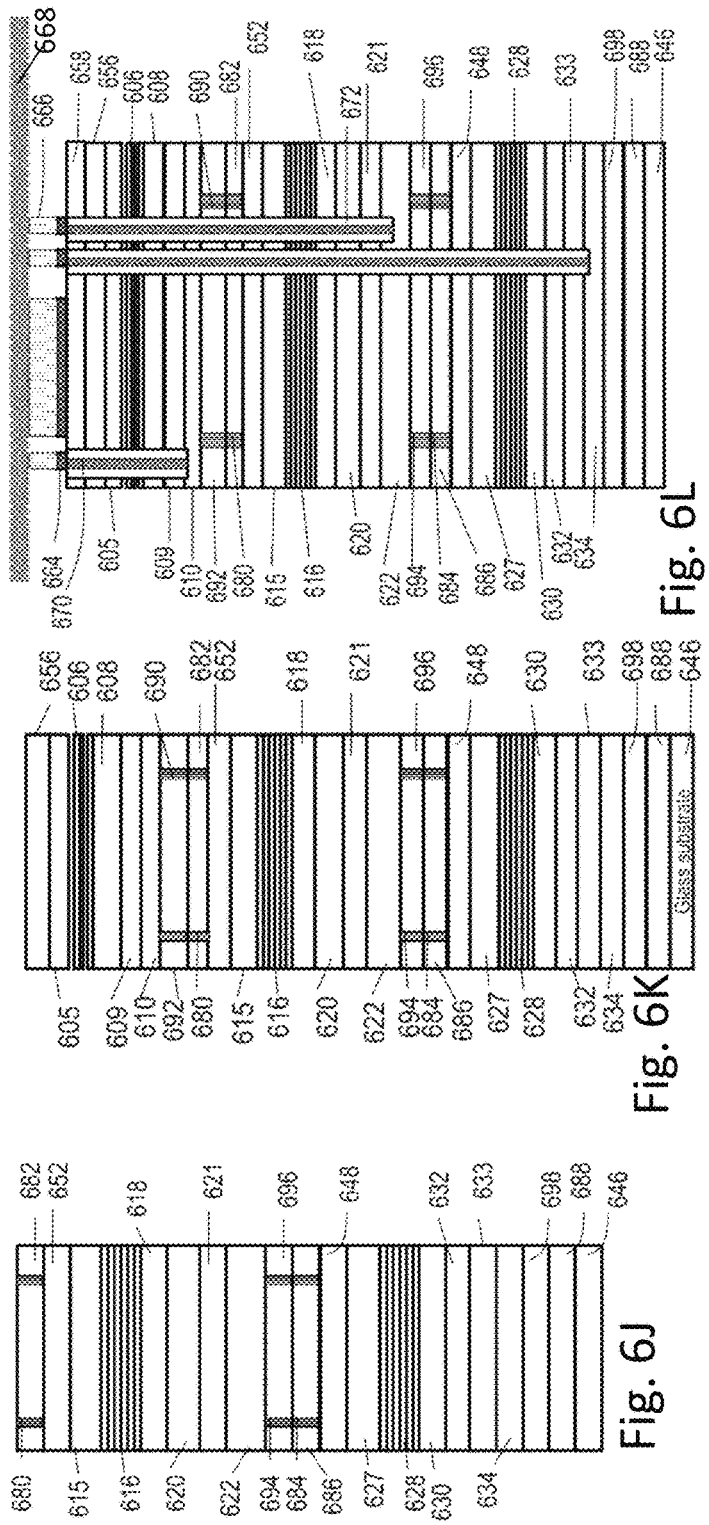
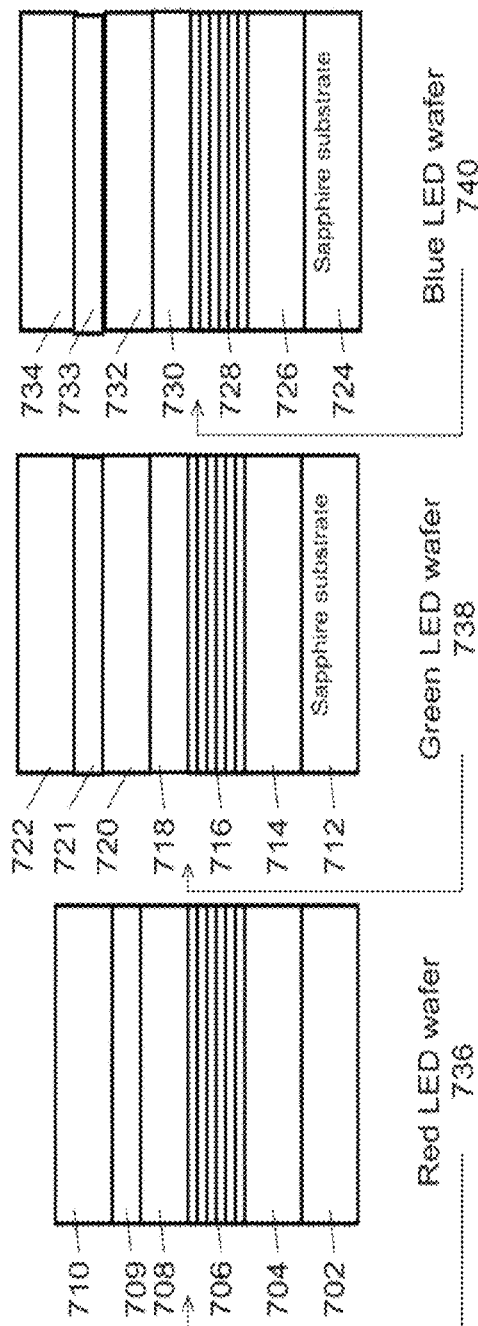

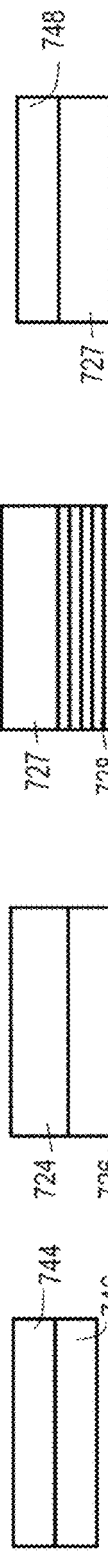
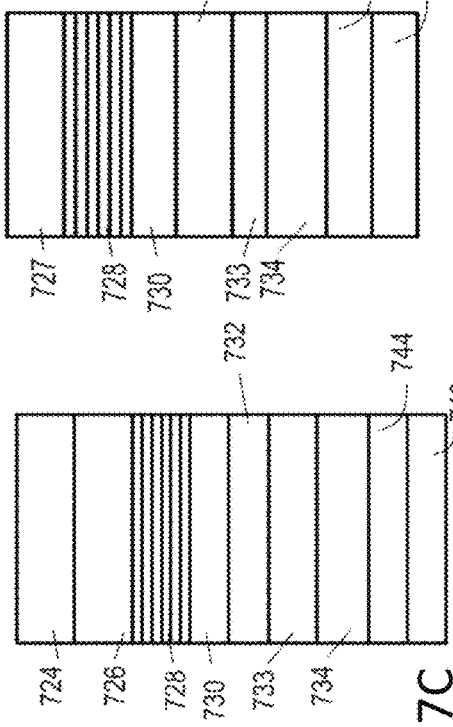
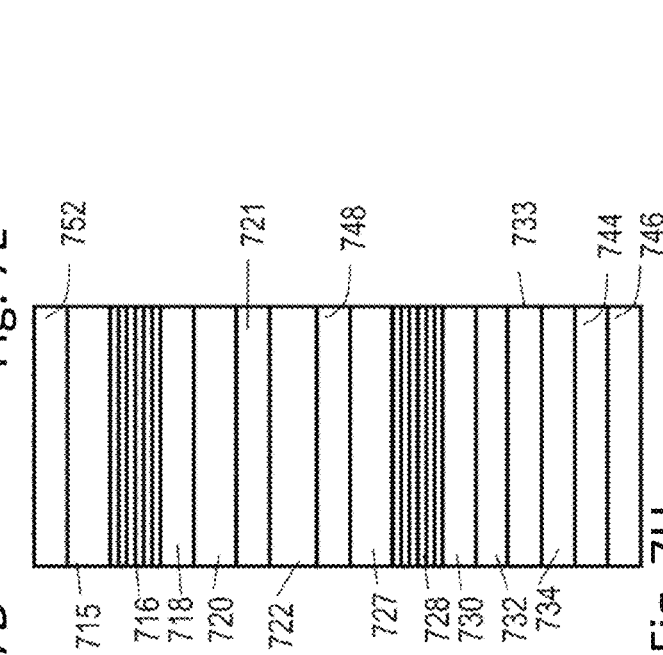
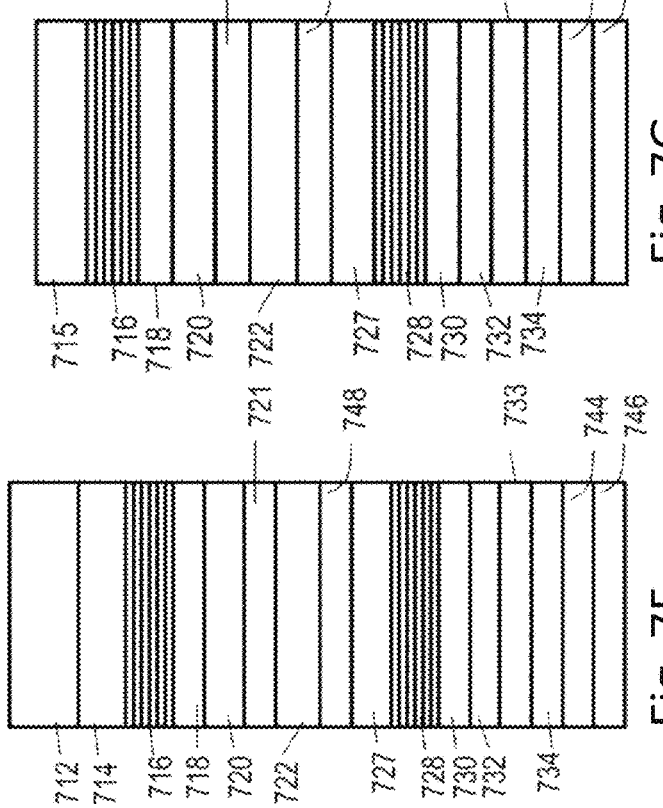

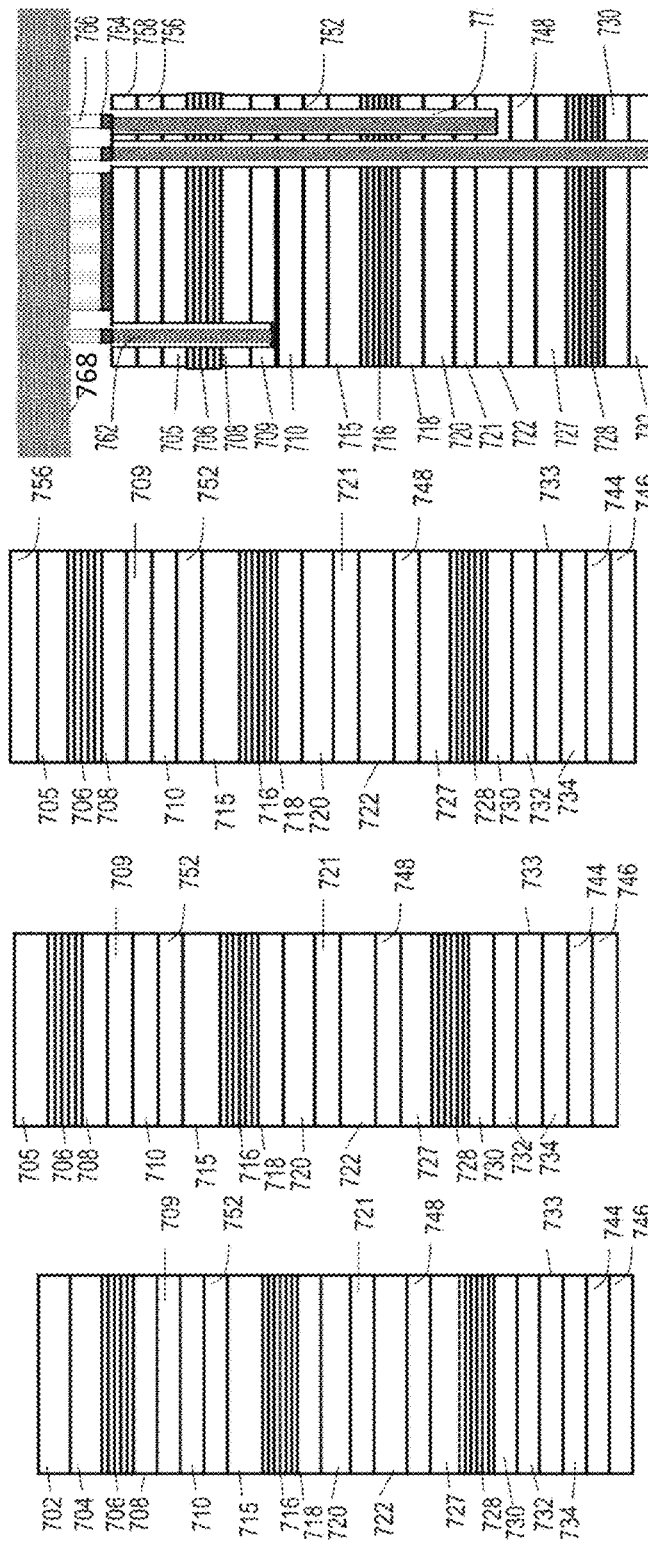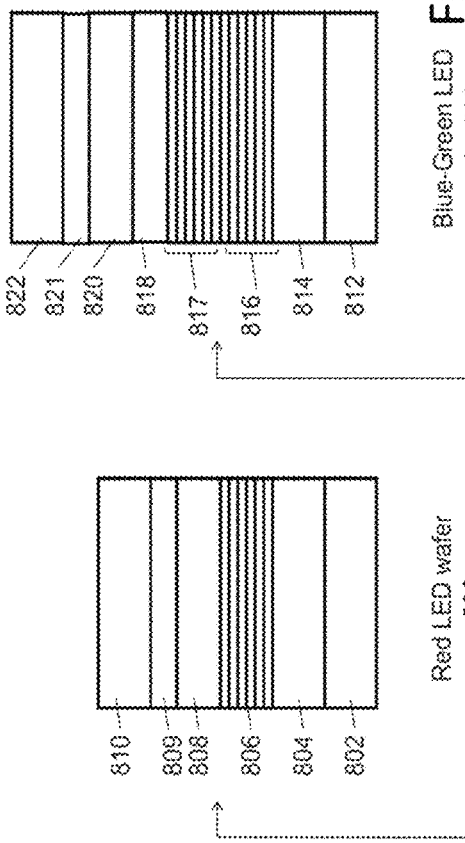

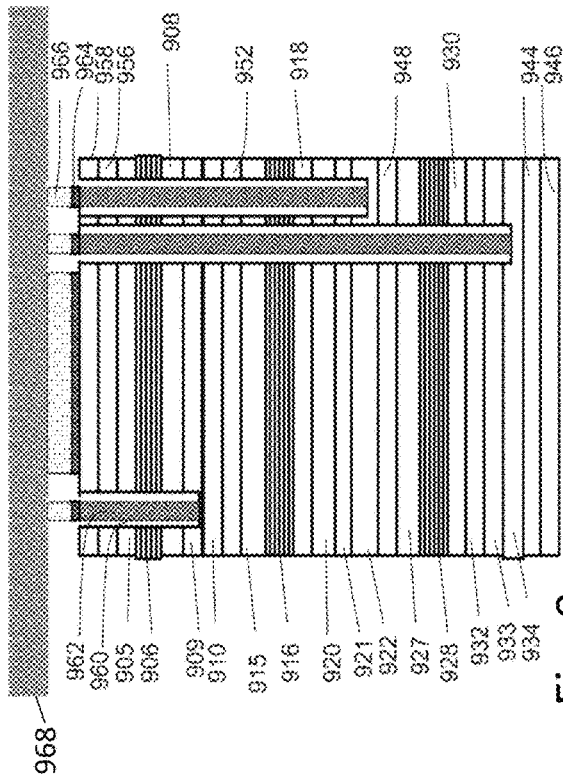
Fig. 9
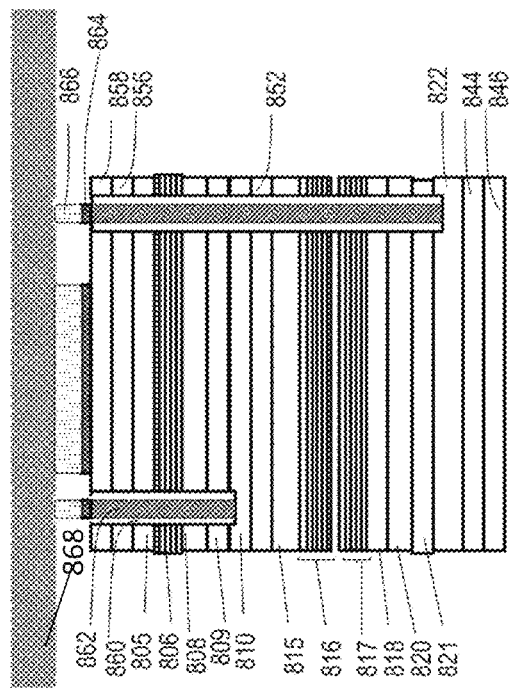
Fig. 8B
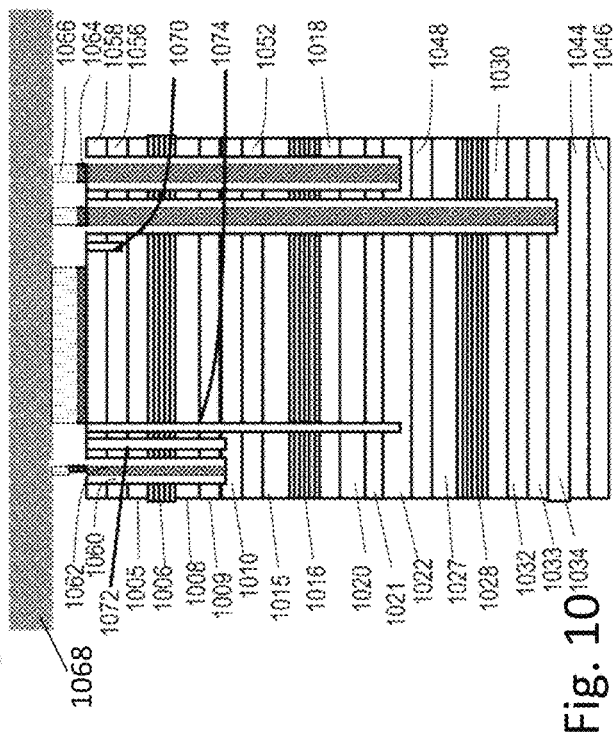
Fig. 10
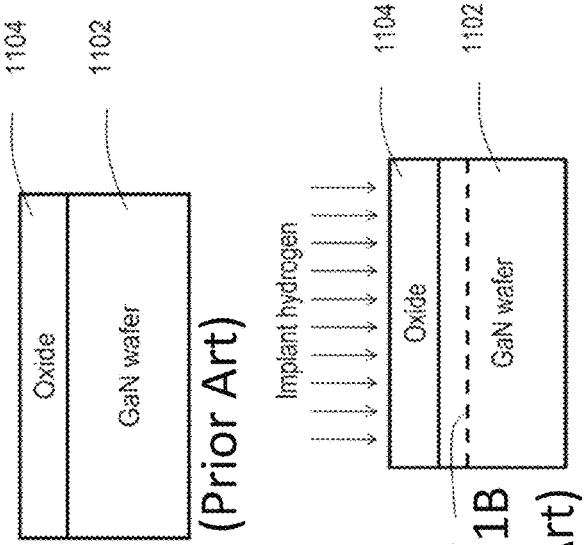
Fig. 11A (Prior Art)
Fig. 11B (Prior Art)

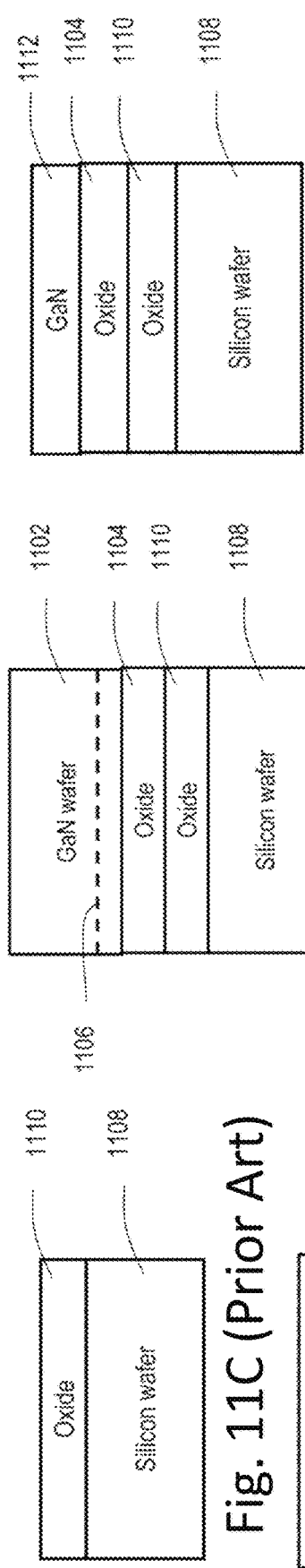
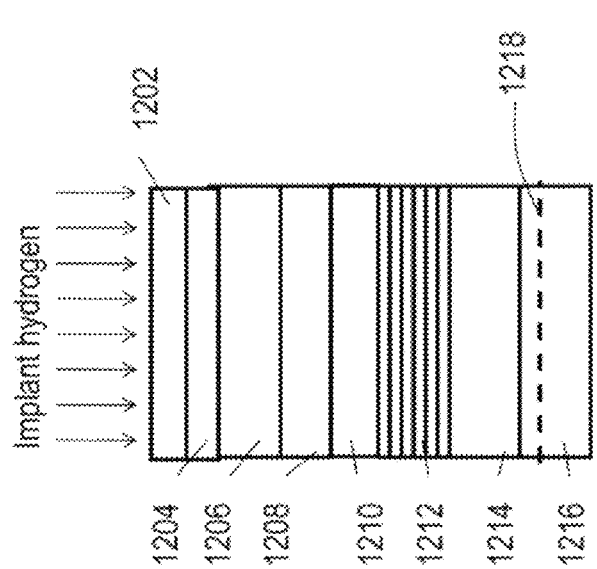
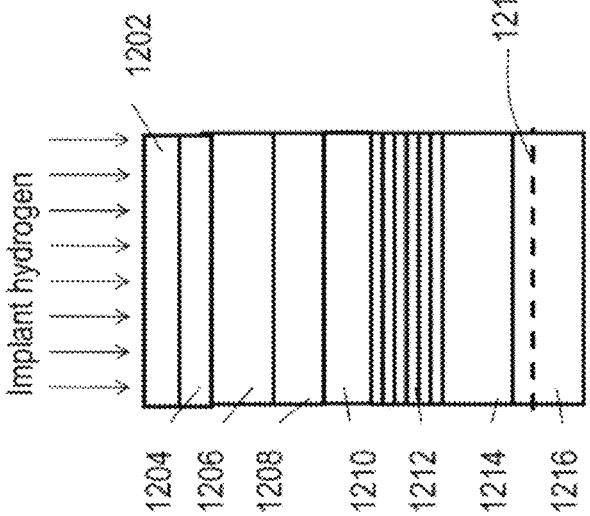
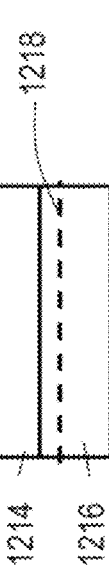

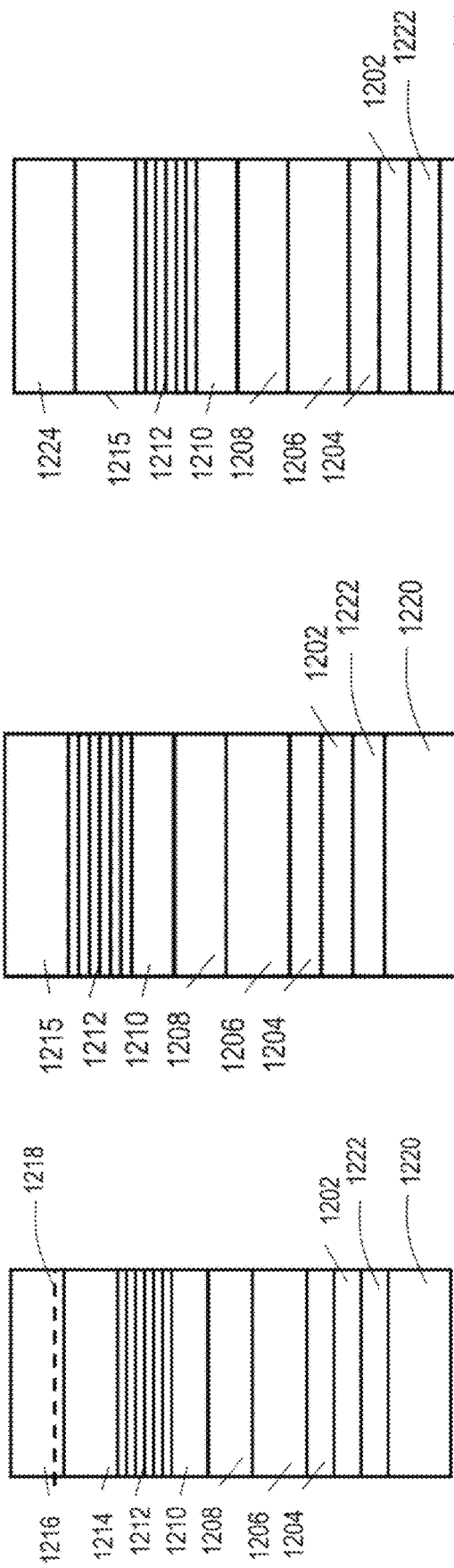
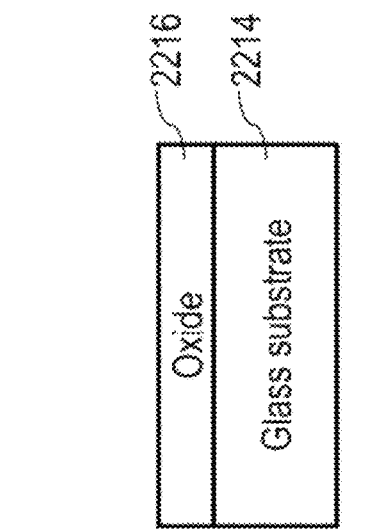
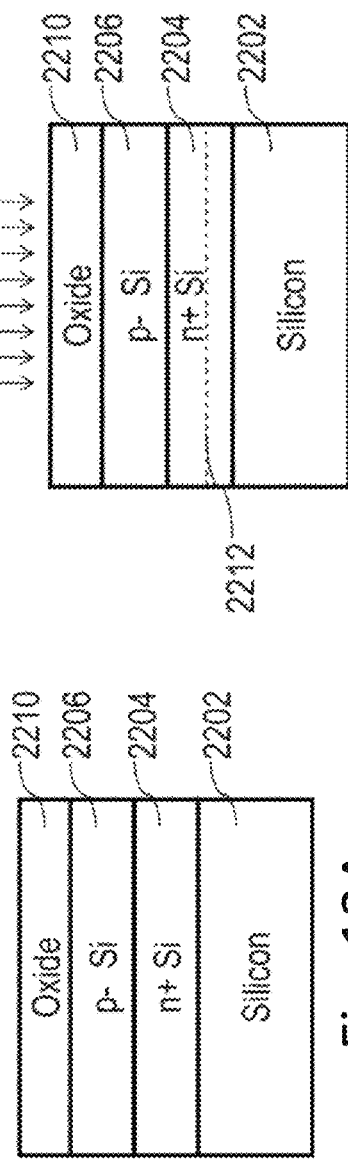

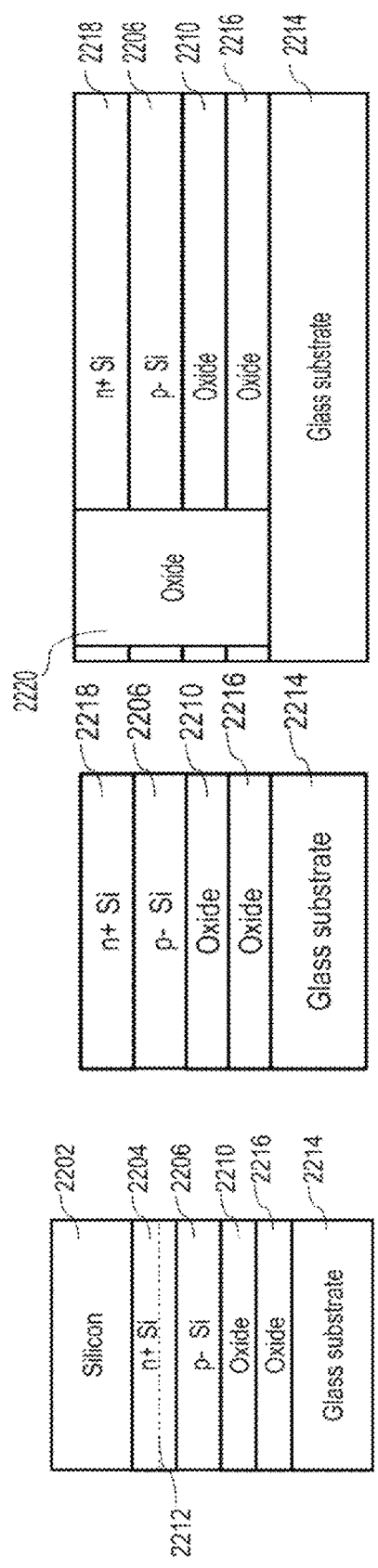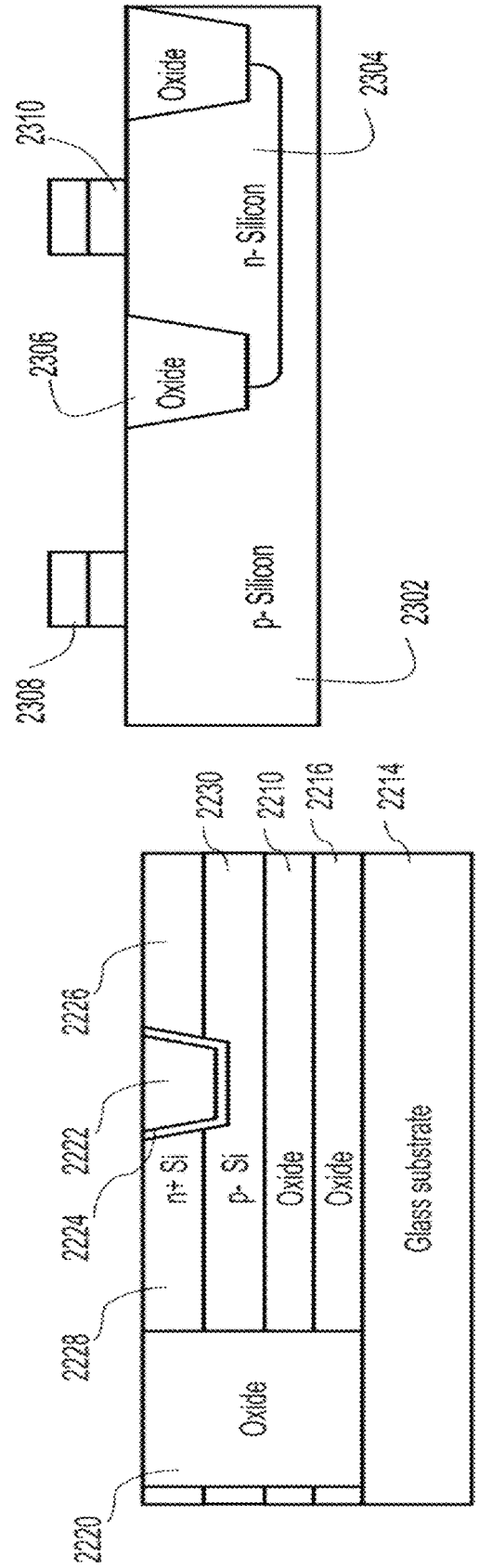

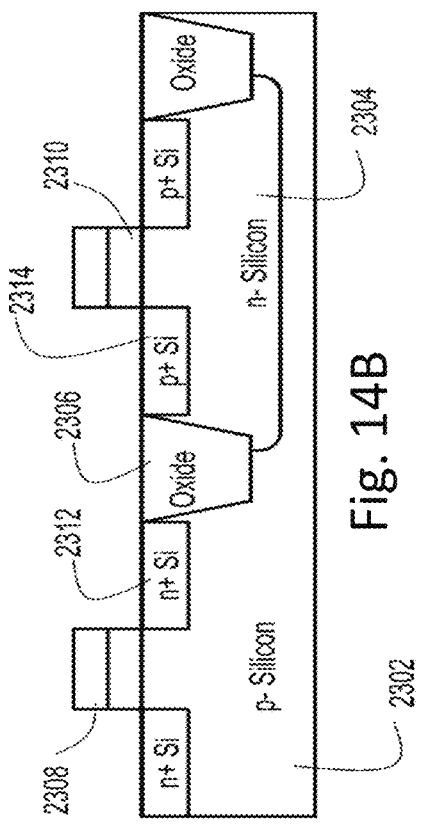

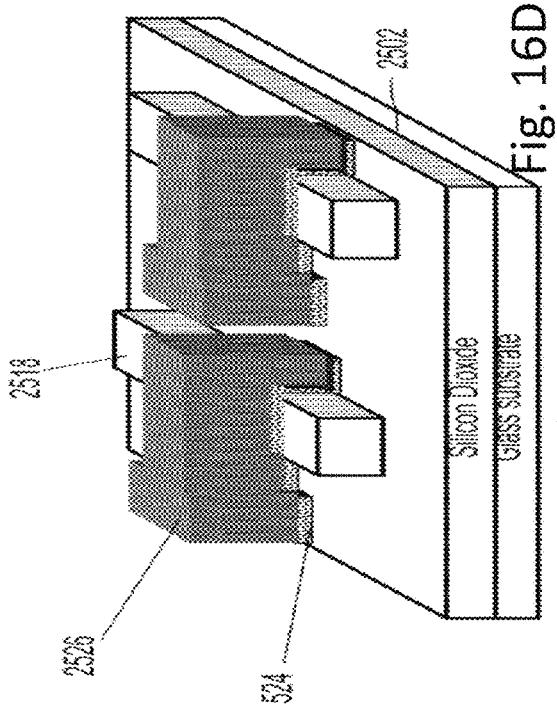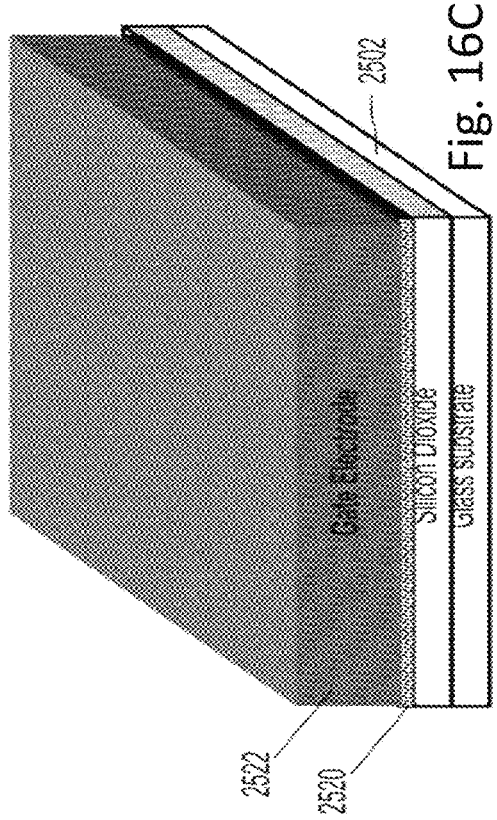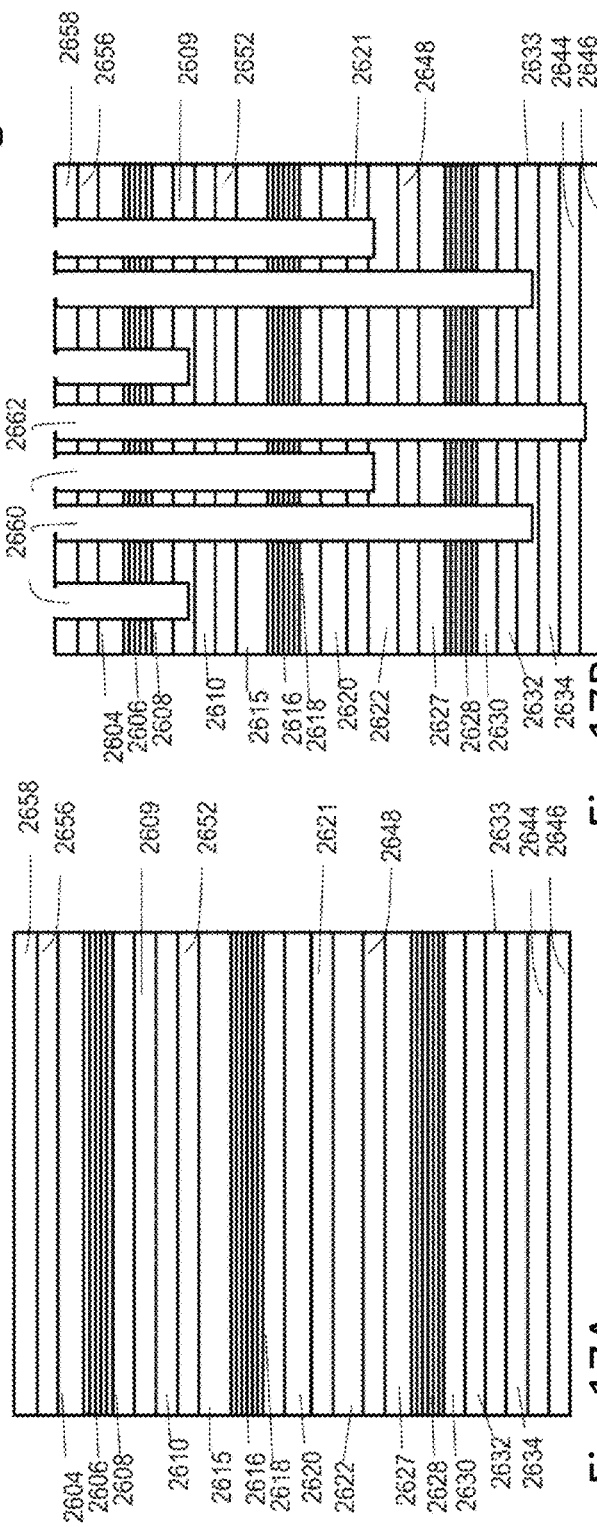

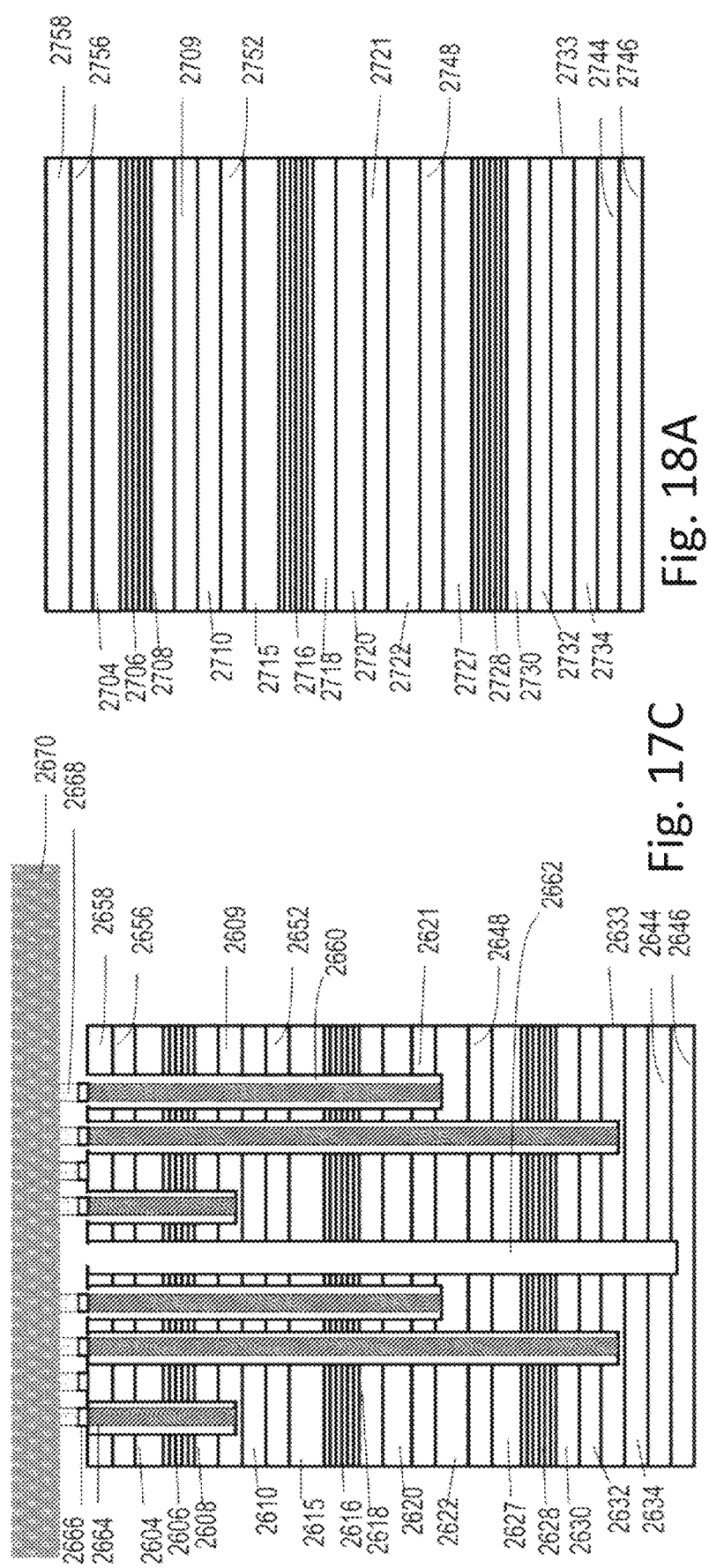

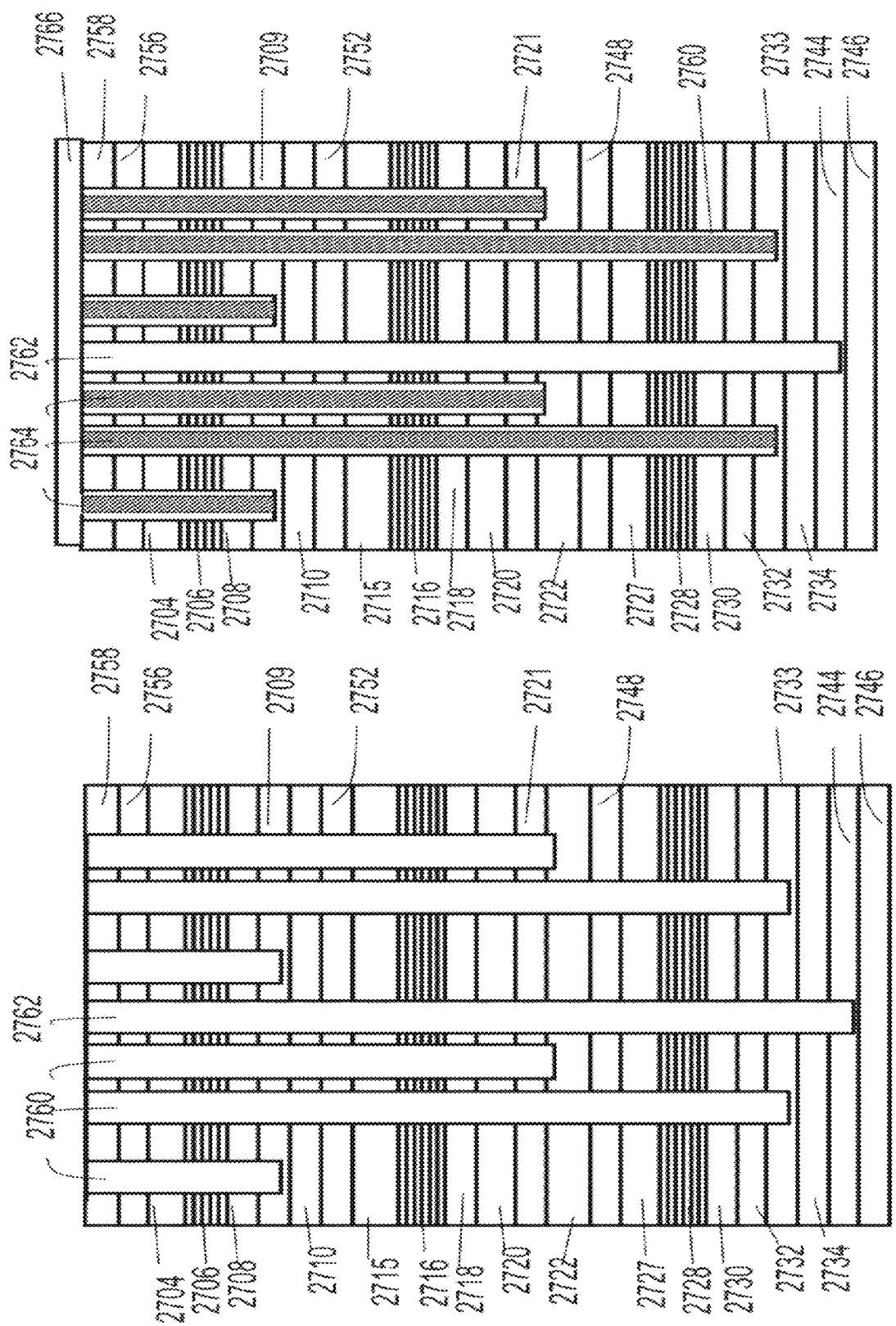

US 11,374,042 B1

3D MICRO DISPLAY SEMICONDUCTOR DEVICE AND STRUCTURE

CROSS-REFERENCE OF RELATED APPLICATION

This application claims priority of and is a continuation of U.S. patent application Ser. No. 17/487,369 filed on Sep. 28, 2021; which is a continuation of U.S. patent application Ser. No. 17/216,597 filed on Mar. 29, 2021, now U.S. Pat. No. 11,164,898 issued on Nov. 2, 2021; which is a continuation-in-part of U.S. patent application Ser. No. 17/113,045 filed on Dec. 5, 2020, now U.S. Pat. No. 10,998,374 issued on May 4, 2021; which is a continuation-in-part of U.S. patent application Ser. No. 17/027,217 filed on Sep. 21, 2020; which is a continuation-in-part of U.S. patent application Ser. No. 16/860,027 filed on Apr. 27, 2020, now U.S. Pat. No. 10,833,108 issued on Nov. 10, 2020; which is a continuation-in-part of U.S. patent application Ser. No. 15/920,499 filed on Mar. 14, 2018, now U.S. Pat. No. 10,679,977 issued on Jun. 9, 2020; which is a continuation-in-part of U.S. patent application Ser. No. 14/936,657 filed on Nov. 9, 2015, now U.S. Pat. No. 9,941,319 issued on Apr. 10, 2018; which is a continuation-in-part of U.S. patent application Ser. No. 13/274,161 filed on Oct. 14, 2011, now U.S. Pat. No. 9,197,804 issued on Nov. 24, 2015; and this application is a continuation-in-part of U.S. patent application Ser. No. 12/904,103 filed on Oct. 13, 2010, now U.S. Pat. No. 8,163,581 issued on Apr. 24, 2012.

BACKGROUND OF THE INVENTION

(A) Field of the Invention

This invention describes applications of monolithic 3D integration to various disciplines, including but not limited to, for example, light-emitting diodes and displays.

(B) Discussion of Background Art

Semiconductor and optoelectronic devices often require thin monocrystalline (or single-crystal) films deposited on a certain wafer. To enable this deposition, many techniques, generally referred to as layer transfer technologies, have been developed. These include:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology", JSAP International, Number 4, July 2001 by T. Yonehara and K. Sakaguchi ("Yonehara").

Lift-off with a temporary substrate, also referred to as epitaxial lift-off. This is described in "Epitaxial lift-off and its applications", 1993 Semicond. Sci. Technol. 8 1124 by P. Demeester, et al ("Demeester").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Rubber stamp layer transfer: This is described in "Solar cells sliced and diced", 19 May 2010, Nature News.

With novel applications of these methods and recognition of their individual strengths and weaknesses, one can significantly enhance today's light-emitting diode (LED), display, image-sensor and solar cell technologies.

Background on LEDs

Light emitting diodes (LEDs) are used in many applications, including automotive lighting, incandescent bulb replacements, and as backlights for displays. Red LEDs are typically made on Gallium Arsenide (GaAs) substrates, and include quantum wells constructed of various materials such as AlInGaP and GaInP. Blue and green LEDs are typically made on Sapphire or Silicon Carbide (SiC) or bulk Gallium Nitride (GaN) substrates, and include quantum wells constructed of various materials such as GaN and InGaN.

A white LED for lighting and display applications can be constructed by either using a blue LED coated with phosphor (called phosphor-coated LED or pcLED) or by combining light from red, blue, and green LEDs (called RGB LED). RGB LEDs are typically constructed by placing red, blue, and green LEDs side-by-side. While RGB LEDs are more energy-efficient than pcLEDs, they are less efficient in mixing red, blue and green colors to form white light. They also are much more costly than pcLEDs. To tackle issues with RGB LEDs, several proposals have been made.

One RGB LED proposal from Hong Kong University is described in "Design of vertically stacked polychromatic light emitting diodes", Optics Express, June 2009 by K. Hui, X. Wang, et al ("Hui"). It involves stacking red, blue, and green LEDs on top of each other after individually packaging each of these LEDs. While this solves light mixing problems, this RGB-LED is still much more costly than a pcLED solution since three LEDs for red, blue, and green color need to be packaged. A pcLED, on the other hand, requires just one LED to be packaged and coated with phosphor.

Another RGB LED proposal from Nichia Corporation is described in "Phosphor Free High-Luminous-Efficiency White Light-Emitting Diodes Composed of InGaN Multi-Quantum Well", Japanese Journal of Applied Physics, 2002 by M. Yamada, Y. Narukawa, et al. ("Yamada"). It involves constructing and stacking red, blue and green LEDs of GaN-based materials on a sapphire or SiC substrate. However, red LEDs are not efficient when constructed with GaN-based material systems, and that hampers usefulness of this implementation. It is not possible to deposit defect-free AlInGaP/InGaP for red LEDs on the same substrate as GaN based blue and green LEDs, due to a mismatch in thermal expansion co-efficient between the various material systems.

Yet another RGB-LED proposal is described in "Cascade Single chip phosphor-free while light emitting diodes", Applied Physics Letters, 2008 by X. Guo, G. Shen, et al. ("Guo"). It involves bonding GaAs based red LEDs with GaN based blue-green LEDs to produce white light. Unfortunately, this bonding process requires 600° C. temperatures, causing issues with mismatch of thermal expansion co-efficients and cracking. Another publication on this topic is "A trichromatic phosphor-free white light-emitting diode by using adhesive bonding scheme", Proc. SPIE, Vol. 7635, 2009 by D. Chuai, X. Guo, et al. ("Chuai"). It involves bonding red LEDs with green-blue LED stacks. Bonding is done at the die level after dicing, which is more costly than a wafer-based approach.

U.S. patent application Ser. No. 12/130,824 describes various stacked RGB LED devices. It also briefly mentions a method for construction of a stacked LED where all layers of the stacked LED are transferred using lift-off with a temporary carrier and Indium Tin Oxide (ITO) to semiconductor bonding. This method has several issues for constructing a RGB LED stack. First, it is difficult to manufacture a lift-off with a temporary carrier of red LEDs for producing a RGB LED stack, especially for substrates larger than 2 inch. This is because red LEDs are typically constructed on non-transparent GaAs substrates, and lift-off with a temporary carrier is done by using an epitaxial lift-off process. Here, the thin film to be transferred typically sits atop a "release-layer" (eg. AlAs), this release layer is removed by etch procedures after the thin film is attached to a temporary substrate. Scaling this process to 4 inch wafers and bigger is difficult. Second, it is very difficult to perform the bonding of ITO to semiconductor materials of a LED layer at reasonable temperatures, as described in the patent application Ser. No. 12/130,824.

It is therefore clear that a better method for constructing RGB LEDs will be helpful. Since RGB LEDs are significantly more efficient than pcLEDs, they can be used as replacements of today's phosphor-based LEDs for many applications, provided a cheap and effective method of constructing RGB LEDs can be invented.

Background on Displays:

Liquid Crystal Displays (LCDs) can be classified into two types based on manufacturing technology utilized: (1) Large-size displays that are made of amorphous/polycrystalline silicon thin-film-transistors (TFTs), and (2) Microdisplays that utilize single-crystal silicon transistors. Microdisplays are typically used where very high resolution is needed, such as camera/camcorder view-finders, projectors and wearable computers.

Microdisplays are made in semiconductor fabs with 200 mm or 300 mm wafers. They are typically constructed with LCOS (Liquid-Crystal-on-Silicon) Technology and are reflective in nature. An exception to this trend of reflective microdisplays is technology from Kopin Corporation (U.S. Pat. No. 5,317,236, filed December 1991). This company utilizes transmittive displays with a lift-off layer transfer scheme. Transmittive displays may be generally preferred for various applications.

While lift-off layer transfer schemes are viable for transmittive displays, they are frequently not used for semiconductor manufacturing due to yield issues. Therefore, other layer transfer schemes will be helpful. However, it is not easy to utilize other layer transfer schemes for making transistors in microdisplays. For example, application of "smart-cut" layer transfer to attach monocrystalline silicon transistors to glass is described in "Integration of Single Crystal Si TFTs and Circuits on a Large Glass Substrate", IEDM 2009 by Y. Takafuji, Y. Fukushima, K. Tomiyasu, et al. ("Takafuji"). Unfortunately, hydrogen is implanted through the gate oxide of transferred transistors in the process, and this degrades performance. Process temperatures are as high as 600° C. in this paper, and this requires costly glass substrates. Several challenges therefore need to be overcome for efficient layer transfer, and require innovation.

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

SUMMARY

Techniques to utilize layer transfer schemes such as ion-cut to form novel light emitting diodes (LEDs), displays, and microdisplays are discussed.

In one aspect, a multi-level semiconductor device, the device including: a first level including integrated circuits; a second level, where the second level is disposed above the first level, where the first level includes crystalline silicon; and an oxide layer disposed between the first level and the second level, where the second level is bonded to the oxide layer, and where the bonded includes oxide to oxide bonds.

In another aspect, a 3D micro display, the 3D micro display including: a first single crystal layer including at least one LED driving circuit; a second single crystal layer including a first plurality of light emitting diodes (LEDs), where the second single crystal layer includes at least ten individual first LED pixels; and a second plurality of light emitting diodes (LEDs), where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm, and where the 3D micro display includes an oxide to oxide bonding structure.

In another aspect, a 3D micro display, the 3D micro display including: a first single crystal layer including at least one LED driving circuit; a second single crystal layer including a first plurality of light emitting diodes (LEDs), where the second single crystal layer is on top of the first single crystal layer, where the second single crystal layer includes at least ten individual first LED pixels; and a second plurality of light emitting diodes (LEDs), where the 3D micro display includes an oxide to oxide bonding structure.

In another aspect, a 3D micro display, the 3D micro display including: a first single crystal layer including at least one LED driving circuit; a second single crystal layer including a first plurality of light emitting diodes (LEDs), where the second single crystal layer includes at least ten individual first LED pixels; and a second plurality of light emitting diodes (LEDs), where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm, and where the 3D micro display includes an oxide to oxide bonding structure.

In another aspect, a light-emitting integrated wafer structure includes three overlying layers, where each of the three overlying layers emits light at a different wavelength and where at least one of the three overlying layers is transferred to the light-emitting integrated wafer structure using one of atomic species implants assisted cleaving, laser lift-off, etch-back, or chemical-mechanical-polishing (CMP).

In another aspect, an integrated image sensor includes two overlying layers, where one of the two overlying layers is an image sensor layer and at least one of the two overlying layers is less than 5 microns thick, and where the two overlying layers are constructed at a temperature not exceeding 450° C.

In another aspect, a display device with junction-less transistors is disclosed.

In yet another aspect, a method for fabricating a light-emitting integrated device, includes overlying three layers, where each of the three layers emits light at a different wavelength, and where the overlying includes one of: performing an atomic species implantation, performing a laser lift-off, performing an etch-back, or chemical-mechanical polishing (CMP).

In another aspect, a method for fabricating an integrated image sensor, includes overlying a first layer on a second layer to form a combined layer, where one of the first and second layers is an image sensor layer and at least one of the first and second layers is less than 5 microns thick, and where the overlying is performed at a temperature not exceeding 450° C.

In yet another aspect, a method is disclosed for forming a display whose pixels are controlled by junction-less transistors.

In another aspect, a method for enabling 3D viewing of objects in an image through actual physical distances of individual objects to the viewer displayed separately on a display screen actuated by a fast motor.

In another aspect, a 3D micro display, the 3D micro display including: a first single crystal layer including a first plurality of light emitting diodes (LEDs), a second single crystal layer including a second plurality of light emitting diodes (LEDs), where the first single crystal layer includes at least ten individual first LED pixels, where the second single crystal layer includes at least ten individual second LED pixels, where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm, and where the 3D micro display includes an oxide to oxide bonding structure.

In another aspect, a 3D micro display, the 3D micro display including: a first single crystal layer including at least one LED driving circuit; a second single crystal layer including a first plurality of light emitting diodes (LEDs), where the second single crystal layer is on top of the first single crystal layer, where the second single crystal layer includes at least ten individual first LED pixels; and a second plurality of light emitting diodes (LEDs), where the 3D micro display includes a bonding structure.

In another aspect, a 3D micro display, the 3D micro display including: a first single crystal layer including at least one LED driving circuit; a second single crystal layer including a first plurality of light emitting diodes (LEDs), where the second single crystal layer includes at least ten individual first LED pixels; and a second plurality of light emitting diodes (LEDs), where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm, and where the 3D micro display includes a bonding structure.

In another aspect, a 3D micro display, the 3D micro display including: a first single crystal layer including a first plurality of light emitting diodes (LEDs); a second single crystal layer including a second plurality of light emitting diodes (LEDs), where the first single crystal layer includes at least ten individual first LED pixels, where the second single crystal layer includes at least ten individual second LED pixels, where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm; and further including a third single crystal layer including at least one LED driving circuit.

In another aspect, a 3D micro display, the 3D micro display including: a first single crystal layer including at least one LED driving circuit; a second single crystal layer including a first plurality of light emitting diodes (LEDs), where the second single crystal layer is disposed on top of the first single crystal layer, where the second single crystal layer includes at least ten individual first LED pixels, where the 3D micro display includes a bonding structure, and where the bonding structure includes oxide to oxide bonding.

In another aspect, a 3D micro display, the 3D micro display including: a first single crystal layer including a plurality of LED driving circuits; a second single crystal layer including a first plurality of light emitting diodes (LEDs), where the second single crystal layer includes at least ten individual first LED pixels; and a second plurality of light emitting diodes (LEDs), where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm, where the plurality of LED driving circuit include individual control of each of the first plurality of light emitting diodes (LEDs), and where the 3D micro display includes a bonding structure.

In another aspect, a 3D micro display, the 3D micro display including: a first level comprising a first single crystal layer, said first single crystal layer comprises at least one LED driving circuit; a second level comprising a first plurality of light emitting diodes (LEDs), said first plurality of LEDs comprising a second single crystal layer, wherein said second level is disposed on top of said first level, wherein said second level comprises at least ten individual first LED pixels; and a bonding structure, wherein said bonding structure comprises oxide to oxide bonding.

In another aspect, a 3D micro display, the 3D micro display including: a first level comprising a first single crystal layer, said first single crystal layer comprises at least one LED driving circuit; a second level comprising a first plurality of light emitting diodes (LEDs), said first plurality of LEDs comprising a second single crystal layer, wherein said second level is disposed on top of said first level, wherein said second level comprises at least ten individual first LED pixels; and a bonding structure, wherein said first level is bonded to said second level, and wherein said bonded comprises oxide to oxide bonding.

In another aspect, a 3D micro display, the 3D micro display including: a first level comprising a first single crystal layer, said first single crystal layer comprises at least one LED driving circuit; a second level comprising a first plurality of light emitting diodes (LEDs), said first plurality of LEDs comprising a second single crystal layer, wherein said second level is disposed on top of said first level, wherein said second level comprises at least ten individual first LED pixels, wherein said first plurality of LEDs comprise at least 10 individual LED pixels, wherein said at least 10 individual LED pixels been made individual by an etch process; and a bonding structure, wherein said first level is bonded to said second level, and wherein said bonded comprises oxide to oxide bonding.

BRIEF DESCRIPTION OF THE DRAWINGS

Various embodiments of the invention will be understood and appreciated more fully from the following detailed description, taken in conjunction with the drawings in which:

FIGS. 1A-1B illustrate red, green and blue type LEDs (prior art);

FIG. 2 illustrates a conventional RGB LED where red, green, and blue LEDs are placed side-by-side (prior art);

FIG. 3 illustrates a prior-art phosphor-based LED (pcLED);

FIGS. 4A-4S illustrate an embodiment of this invention, where RGB LEDs are stacked with ion-cut technology, flip-chip packaging and conductive oxide bonding;

FIGS. 6A-6L illustrate an embodiment of this invention, where stacked RGB LEDs are formed with ion-cut technology, flip-chip packaging and aligned bonding;

FIGS. 7A-7L illustrate an embodiment of this invention, where stacked RGB LEDs are formed with laser lift-off, substrate etch, flip-chip packaging and conductive oxide bonding;

FIGS. 8A-8B illustrate an embodiment of this invention, where stacked RGB LEDs are formed from a wafer having red LED layers and another wafer having both green and blue LED layers;

FIG. 9 illustrates an embodiment of this invention, where stacked RGB LEDs are formed with control and driver circuits for the LED built on the silicon sub-mount;

FIG. 10 illustrates an embodiment of this invention, where stacked RGB LEDs are formed with control and driver circuits as well as image sensors for the LED built on the silicon sub-mount;

FIGS. 11A-11F is a prior art illustration of pcLEDs constructed with ion-cut processes;

FIGS. 12A-12F illustrate an embodiment of this invention, where pcLEDs are constructed with ion-cut processes;

FIGS. 13A-13G are exemplary drawn illustrations of a display constructed using sub-400° C. processed single crystal silicon recessed channel transistors on a glass substrate;

FIGS. 14A-14H are exemplary drawn illustrations of a display constructed using sub-400° C. processed single crystal silicon replacement gate transistors on a glass substrate;

FIGS. 16A-16D are exemplary drawn illustrations of a display constructed using sub-400° C. processed amorphous silicon or polysilicon junction-less transistors on a glass substrate;

FIGS. 17A-17C are exemplary drawn illustrations of a microdisplay constructed using stacked RGB LEDs and control circuits are connected to each pixel with solder bumps;

FIGS. 18A-18D are exemplary drawn illustrations of a microdisplay constructed using stacked RGB LEDs and control circuits are monolithically stacked above the LED.

DETAILED DESCRIPTION

Figure 5L:
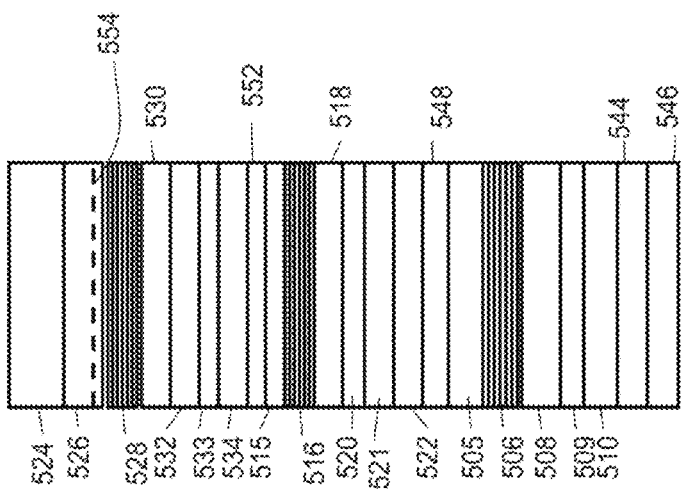
FIGS. 5A-5Q illustrate an embodiment of this invention, where RGB LEDs are stacked with ion-cut technology, wire bond packaging and conductive oxide bonding.

Embodiments of the present invention are now described with reference to FIGS. 1-19, it being appreciated that the figures illustrate the subject matter not to scale or to measure.

NuLED Technology:

FIG. 1A illustrates a cross-section of prior art red LEDs. Red LEDs are typically constructed on a Gallium Arsenide substrate 100. Alternatively, Gallium Phosphide or some other material can be used for the substrate. Since Gallium Arsenide 100 is opaque, a Bragg Reflector 101 is added to ensure light moves in the upward direction. Red light is produced by a p-n junction with multiple quantum wells (MQW). A p-type confinement layer 104, a n-type confinement layer 102 and a multiple quantum well 103 form this part of the device. A current spreading region 105 ensures current flows throughout the whole device and not just close to the contacts. Indium Tin Oxide (ITO) could be used for the current spreading region 105. A top contact 106 and a bottom contact 107 are used for making connections to the LED. It will be obvious to one skilled in the art based on the present disclosure that many configurations and material combinations for making red LEDs are possible. This invention is not limited to one particular configuration or set of materials.

FIG. 1B also illustrates green and blue LED cross-sections. These are typically constructed on a sapphire, SiC or bulk-GaN substrate, indicated by 108. Light is produced by a p-n junction with multiple quantum wells made of $In_xGa_{1-x}N/GaN$. A p-type confinement layer 111, a n-type confinement layer 109 and a multiple quantum well 110 form this part of the device. The value of subscript x in $In_xGa_{1-x}N$ determines whether blue light or green light is produced. For example, blue light typically corresponds to x ranging from 10% to 20% while green light typically corresponds to x ranging from 20% to 30%. A current spreader 112 is typically used as well. ITO could be a material used for the current spreader 112. An alternative material for current spreading could be ZnO. A top contact 113 and a bottom contact 114 are used for making connections to the LED. It will be obvious to one skilled in the art based on the present disclosure that many configurations and material combinations for making blue and green LEDs are possible. This invention is not limited to one particular configuration or set of materials.

White LEDs for various applications can be constructed in two ways. Method 1 is described in FIG. 2 which shows Red LED 201, blue LED 202, and green LED 203 that are constructed separately and placed side-by-side. Red light 204, blue light 205 and green light 206 are mixed to form white light 207. While these "RGB LEDs" are efficient, they suffer from cost issues and have problems related to light mixing. Method 2 is described in FIG. 3 which shows a blue LED 301 constructed and coated with a phosphor layer 302. The yellow phosphor layer converts blue light into white light 303. These "Phosphor-based LEDs" or "pcLEDs" are cheaper than RGB LEDs but are typically not as efficient.

FIG. 4A-S illustrate an embodiment of this invention where Red, Blue, and Green LEDs are stacked on top of each other with smart layer transfer techniques. A smart layer transfer may be defined as one or more of the following processes:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology," JSAP International, Number 4, July 2001 by T. Yonehara and K. Sakaguchi ("Yonehara").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Rubber stamp layer transfer: This is described in "Solar cells sliced and diced," 19 May 2010, Nature News.

This process of constructing RGB LEDs could include several steps that occur in a sequence from Step (A) to Step (S). Many of them share common characteristics, features, modes of operation, etc. When the same reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 4A. A red LED wafer 436 is constructed on a GaAs substrate 402 and includes a N-type confinement layer 404, a multiple quantum well (MQW) 406, a P-type confinement layer 408, an optional reflector 409 and an ITO current spreader 410. Examples of materials used to construct these layers, include, but are not limited to, doped AlInGaP for the N-type confinement layer 404 and P-type confinement layer 408, the multiple quantum well layer 406 could be of AlInGaP and GaInP and the optional reflector 409 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 438 is constructed on a sapphire or SiC or bulk-GaN substrate 412 and includes a N-type confinement layer 414, a multiple quantum well (MQW) 416, a buffer layer 418, a P-type confinement layer 420, an optional reflector 421 and an ITO current spreader 422. Yet another wafer is constructed with a blue LED. The blue LED wafer 440 is constructed on a sapphire or SiC or bulk-GaN substrate 424 and includes a N-type confinement layer 426, a multiple quantum well (MQW) 428, a buffer layer 430, a P-type confinement layer 432, an optional reflector 433 and an ITO current spreader 434. Examples of materials used to construct these blue and green LED layers, include, but are not limited to, doped GaN for the N-type and P-type confinement layers 414, 420, 426 and 432, AlGaN for the buffer layers 430 and 418 and InGaN/GaN for the multiple quantum wells 416 and 428. The optional reflectors 421 and 433 could be distributed Bragg Reflectors or some other type of reflectors. Various other material types and configurations could be used for constructing blue and green LEDs for this process.

Step (B) is illustrated in FIG. 4B. The blue LED wafer 440 from FIG. 4A is used for this step. Various elements in FIG. 4B such as, for example, 424, 426, 428, 430, 432, 433, and 434 have been previously described. Hydrogen is implanted into the wafer at a certain depth indicated by dotted lines 442. Alternatively, helium could be used for this step.

Step (C) is illustrated in FIG. 4C. A glass substrate 446 is taken and an ITO layer 444 is deposited atop it.

Step (D) is illustrated in FIG. 4D. The wafer shown in FIG. 4B is flipped and bonded atop the wafer shown in FIG. 4C using ITO-ITO bonding. Various elements in FIG. 4D such as 424, 426, 428, 430, 432, 433, 434, 442, 446, and 444 have been previously described. The ITO layer 444 is essentially bonded to the ITO layer 434 using an oxide-to-oxide bonding process.

Step (E) is illustrated in FIG. 4E. Various elements in FIG. 4E such as 424, 426, 428, 430, 432, 433, 434, 442, 446, and 444 have been previously described. An ion-cut process is conducted to cleave the structure shown in FIG. 4D at the hydrogen implant plane 442. This ion-cut process may use a mechanical cleave. An anneal process could be utilized for the cleave as well. After the cleave, a chemical mechanical polish (CMP) process is conducted to planarize the surface. The N-type confinement layer present after this cleave and CMP process is indicated as 427.

Step (F) is illustrated in FIG. 4F. Various elements in FIG. 4F such as 446, 444, 434, 433, 432, 430, 428, and 427 have been previously described. An ITO layer 448 is deposited atop the N-type confinement layer 427.

Step (G) is illustrated in FIG. 4G. The green LED wafer 438 shown in Step (A) is used for this step. Various elements in FIG. 4G such as 412, 414, 416, 418, 420, 421, and 422 have been described previously. Hydrogen is implanted into the wafer at a certain depth indicated by dotted lines 450. Alternatively, helium could be used for this step.

Step (H) is illustrated in FIG. 4H. The structure shown in FIG. 4G is flipped and bonded atop the structure shown in FIG. 4F using ITO-ITO bonding. Various elements in FIG. 4H such as 446, 444, 434, 433, 432, 430, 428, 427, 448, 412, 414, 416, 418, 420, 421, 422, and 450 have been described previously.

Step (I) is illustrated in FIG. 4I. The structure shown in FIG. 4H is cleaved at the hydrogen plane indicated by 450. This cleave process may be preferably done with a mechanical force. Alternatively, an anneal could be used. A CMP process is conducted to planarize the surface. Various elements in FIG. 4I such as 446, 444, 434, 433, 432, 430, 428, 427, 448, 416, 418, 420, 421, and 422 have been described previously. The N-type confinement layer present after this cleave and CMP process is indicated as 415.

Step (J) is illustrated in FIG. 4J. An ITO layer 452 is deposited atop the structure shown in FIG. 4I. Various elements in FIG. 4J such as 446, 444, 434, 433, 432, 430, 428, 427, 448, 416, 418, 420, 421, 415, and 422 have been described previously.

Step (K) is illustrated in FIG. 4K. The red LED wafer 436 shown in Step (A) is used for this step. Various elements in FIG. 4K such as 402, 404, 406, 408, 409, and 410 have been described previously. Hydrogen is implanted into the wafer at a certain depth indicated by dotted lines 454. Alternatively, helium could be used for this step.

Step (L) is illustrated in FIG. 4L. The structure shown in FIG. 4K is flipped and bonded atop the structure shown in FIG. 4J using ITO-ITO bonding. Various elements in FIG. 4L such as 446, 444, 434, 433, 432, 430, 428, 427, 448, 416, 418, 420, 421, 415, 422, 452, 402, 404, 406, 408, 409, 410, and 454 have been described previously.

Step (M) is illustrated in FIG. 4M. The structure shown in FIG. 4L is cleaved at the hydrogen plane 454. A mechanical force could be used for this cleave. Alternatively, an anneal could be used. A CMP process is then conducted to planarize the surface. The N-type confinement layer present after this process is indicated as 405. Various elements in FIG. 4M such as 446, 444, 434, 433, 432, 430, 428, 427, 448, 416, 418, 420, 421, 415, 422, 452, 406, 408, 409, and 410 have been described previously.

Step (N) is illustrated in FIG. 4N. An ITO layer 456 is deposited atop the structure shown in FIG. 4M. Various elements in FIG. 4M such as 446, 444, 434, 433, 432, 430, 428, 427, 448, 416, 418, 420, 421, 415, 422, 452, 406, 408, 409, 410, and 405 have been described previously.

Step (O) is illustrated in FIG. 4O. A reflecting material layer 458, constructed for example with Aluminum or Silver, is deposited atop the structure shown in FIG. 4N. Various elements in FIG. 4O such as 446, 444, 434, 433, 432, 430, 428, 427, 448, 416, 418, 420, 421, 415, 422, 452, 406, 408, 409, 410, 456, and 405 have been described previously.

Step (P) is illustrated in FIG. 4P. The process of making contacts to various layers and packaging begins with this step. A contact and bonding process similar to the one used in "High-power AlGaInN flip-chip light-emitting diodes," Applied Physics Letters, vol. 78, no. 22, pp. 3379-3381, May 2001, by Wierer, J. J.; Steigerwald, D. A.; Krames, M. R.; OShea, J. J.; Ludowise, M. J.; Christenson, G.; Shen, Y.-C.; Lowery, C.; Martin, P. S.; Subramanya, S.; Gotz, W.; Gardner, N. F.; Kern, R. S.; Stockman, S. A. is used. Vias 460 are etched to different layers of the LED stack. Various elements in FIG. 4P such as 446, 444, 434, 433, 432, 430, 428, 427, 448, 416, 418, 420, 421, 415, 422, 452, 406, 408, 409, 410, 456, 405, and 458 have been described previously. After the via holes 460 are etched, they may optionally be filled with an oxide layer and polished with CMP. This fill with oxide may be optional, and the preferred process may be to leave the via holes as such without fill. Note that the term contact holes could be used instead of the term via holes. Similarly, the term contacts could be used instead of the term vias.

Step (Q) is illustrated in FIG. 4Q. Aluminum is deposited to fill via holes 460 from FIG. 4P. Following this deposition, a lithography and etch process is utilized to define the aluminum metal to form vias 462. The vias 462 are smaller in diameter than the via holes 460 shown in FIG. 4P. Various elements in FIG. 4Q such as 446, 444, 434, 433, 432, 430, 428, 427, 448, 416, 418, 420, 421, 415, 422, 452, 406, 408, 409, 410, 456, 405, 460, and 458 have been described previously.

Step (R) is illustrated in FIG. 4R. A nickel layer 464 and a solder layer 466 are formed using standard procedures. Various elements in FIG. 4R such as 446, 444, 434, 433, 432, 430, 428, 427, 448, 416, 418, 420, 421, 415, 422, 452, 406, 408, 409, 410, 456, 405, 460, 462, and 458 have been described previously.

Step (S) is illustrated in FIG. 4S. The solder layer 466 is then bonded to pads on a silicon sub-mount 468. Various elements in FIG. 4S such as 446, 444, 434, 433, 432, 430, 428, 427, 448, 416, 418, 420, 421, 415, 422, 452, 406, 408, 409, 410, 456, 405, 460, 462, 458, 464, and 466 have been described previously. The configuration of optional reflectors 433, 421, and 409 determines light output coming from the LED. A preferred embodiment of this invention may not have a reflector 433, and may have the reflector 421 (reflecting only the blue light produced by multiple quantum well 428) and the reflector 409 (reflecting only the green light produced by multiple quantum well 416). In the process described in FIG. 4A-FIG. 4S, the original substrates in FIG. 4A, namely 402, 412 and 424, can be reused after ion-cut. This reuse may make the process more cost-effective.

FIGS. 5A-Q describe an embodiment of this invention, where RGB LEDs are stacked with ion-cut technology, wire bond packaging and conductive oxide bonding. Essentially, smart-layer transfer is utilized to construct this embodiment of the invention. This process of constructing RGB LEDs could include several steps that occur in a sequence from Step (A) to Step (Q). Many of the steps share common characteristics, features, modes of operation, etc. When the same reference numbers are used in different drawing figures, they are used to indicate analogous, similar or identical structures to enhance the understanding of the present invention by clarifying the relationships between the structures and embodiments presented in the various diagrams-particularly in relating analogous, similar or identical functionality to different physical structures.

Step (A): This is illustrated using FIG. 5A. A red LED wafer 536 is constructed on a GaAs substrate 502 and includes a N-type confinement layer 504, a multiple quantum well (MQW) 506, a P-type confinement layer 508, an optional reflector 509 and an ITO current spreader 510. Examples of materials used to construct these layers, include, but are not limited to, doped AlInGaP for the N-type confinement layer 504 and P-type confinement layer 508, the multiple quantum well layer 506 could be of AlInGaP and GaInP and the optional reflector 509 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 538 is constructed on a sapphire or SiC or bulk-GaN substrate 512 and includes a N-type confinement layer 514, a multiple quantum well (MQW) 516, a buffer layer 518, a P-type confinement layer 520, an optional reflector 521 and an ITO current spreader 522. Yet another wafer is constructed with a blue LED. The blue LED wafer 540 is constructed on a sapphire or SiC or bulk-GaN substrate 524 and includes a N-type confinement layer 526, a multiple quantum well (MQW) 528, a buffer layer 530, a P-type confinement layer 532, an optional reflector 533 and an ITO current spreader 534. Examples of materials used to construct these blue and green LED layers, include, but are not limited to, doped GaN (for the N-type and P-type confinement layers 514, 520, 526, and 532), AlGaN (for the buffer layers 530 and 518), and InGaN/GaN (for the multiple quantum wells 516 and 528). The optional reflectors 521 and 533 could be distributed Bragg Reflectors or some other type of reflectors. Various other material types and configurations could be used for constructing blue and green LEDs for this process.

Step (B) is illustrated in FIG. 5B. The red LED wafer 536 from FIG. 5A is used for this step. Various elements in FIG. 5B such as 502, 504, 506, 508, 509, and 510 have been previously described. Hydrogen is implanted into the wafer at a certain depth indicated by dotted lines 542. Alternatively, helium could be used for this step.

Step (C) is illustrated in FIG. 5C. A silicon substrate 546 is taken and an ITO layer 544 is deposited atop it.

Step (D) is illustrated in FIG. 5D. The wafer shown in FIG. 5B is flipped and bonded atop the wafer shown in FIG. 5C using ITO-ITO bonding. Various elements in FIG. 5D such as 502, 504, 506, 508, 509, 510, 542, 544, and 546 have been previously described. The ITO layer 544 is essentially bonded to the ITO layer 510 using an oxide-to-oxide bonding process.

Step (E) is illustrated in FIG. 5E. Various elements in FIG. 5E such as 506, 508, 509, 510, 544 and 546 have been previously described. An ion-cut process is conducted to cleave the structure shown in FIG. 5D at the hydrogen implant plane 542. This ion-cut process could preferably use a mechanical cleave. An anneal process could be utilized for the cleave as well. After the cleave, a chemical mechanical polish (CMP) process is conducted to planarize the surface. The N-type confinement layer present after this cleave and CMP process is indicated as 505.

Step (F) is illustrated in FIG. 5F. Various elements in FIG. 5F such as 505, 506, 508, 509, 510, 544, and 546 have been previously described. An ITO layer 548 is deposited atop the N-type confinement layer 505.

Step (G) is illustrated in FIG. 5G. The green LED wafer 538 shown in Step (A) is used for this step. Various elements in FIG. 5G such as 512, 514, 516, 518, 520, 521, and 522 have been described previously. Hydrogen is implanted into the wafer at a certain depth indicated by dotted lines 550. Alternatively, helium could be used for this step.

Step (H) is illustrated in FIG. 5H. The structure shown in FIG. 5G is flipped and bonded atop the structure shown in FIG. 5F using ITO-ITO bonding. Various elements in FIG. 5H such as 505, 506, 508, 509, 510, 544, 546, 548, 512, 514, 516, 518, 520, 521, 550, and 522 have been described previously.

Step (I) is illustrated in FIG. 5I The structure shown in FIG. 5H is cleaved at the hydrogen plane indicated by 550. This cleave process may be preferably done with a mechanical force. Alternatively, an anneal could be used. A CMP process is conducted to planarize the surface. Various elements in FIG. 5I such as 505, 506, 508, 509, 510, 544, 546, 548, 516, 518, 520, 521, and 522 have been described previously. The N-type confinement layer present after this cleave and CMP process is indicated as 515.

Figure 5K:
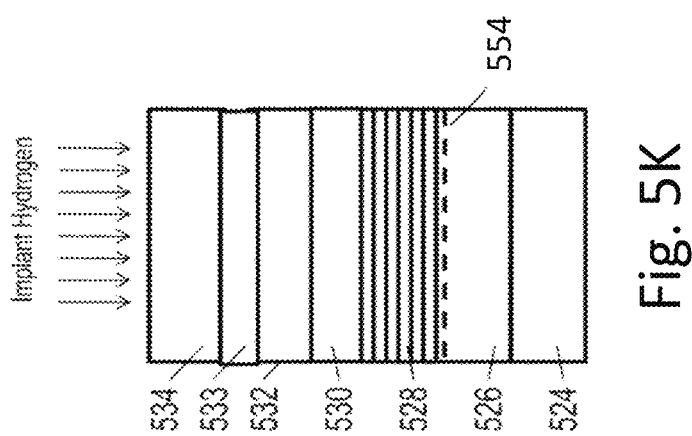
Figure 5J:
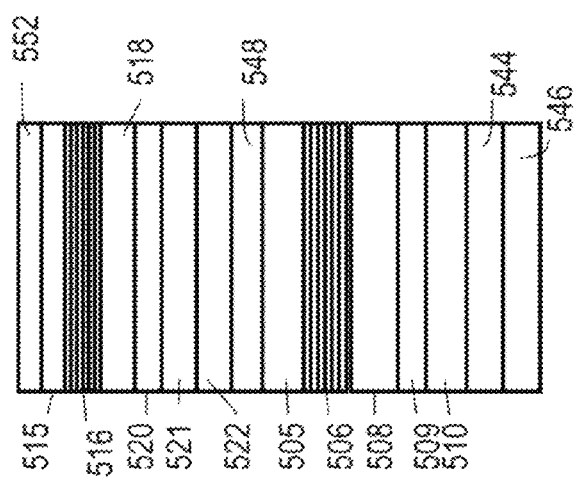

Step (J) is illustrated using FIG. 5J. An ITO layer 552 is deposited atop the structure shown in FIG. 5I Various elements in FIG. 5J such as 505, 506, 508, 509, 510, 544, 546, 548, 516, 518, 520, 521, 515, and 522 have been described previously.

Step (K) is illustrated using FIG. 5K. The blue LED wafer 540 from FIG. 5A is used for this step. Various elements in FIG. 5K such as 524, 526, 528, 530, 532, 533, and 534 have been previously described. Hydrogen is implanted into the wafer at a certain depth indicated by dotted lines 554. Alternatively, helium could be used for this step.

Step (L) is illustrated in FIG. 5L. The structure shown in FIG. 5K is flipped and bonded atop the structure shown in FIG. 5J using ITO-ITO bonding. Various elements in FIG. 4L such as 505, 506, 508, 509, 510, 544, 546, 548, 516, 518, 520, 521, 515, 522, 552, 524, 526, 528, 530, 532, 533, 554, and 534 have been described previously.

Step (M) is illustrated in FIG. 5M. The structure shown in FIG. 5L is cleaved at the hydrogen plane 554. A mechanical force could be used for this cleave. Alternatively, an anneal could be used. A CMP process is then conducted to planarize the surface. The N-type confinement layer present after this process is indicated as 527. Various elements in FIG. 5M such as 505, 506, 508, 509, 510, 544, 546, 548, 516, 518, 520, 521, 515, 522, 552, 528, 530, 532, 533, and 534 have been described previously.

Step (N) is illustrated in FIG. 5N. An ITO layer 556 is deposited atop the structure shown in FIG. 5M. Various elements in FIG. 5N such as 505, 506, 508, 509, 510, 544, 546, 548, 516, 518, 520, 521, 515, 522, 552, 528, 530, 532, 533, and 534 have been described previously.

Step (O) is illustrated in FIG. 5O. The process of making contacts to various layers and packaging begins with this step. Various elements in FIG. 5O such as 505, 506, 508, 509, 510, 544, 546, 548, 516, 518, 520, 521, 515, 522, 552, 528, 530, 532, 533, 556, and 534 have been described previously. Via holes 560 are etched to different layers of the LED stack. After the via holes 560 are etched, they may optionally be filled with an oxide layer and polished with CMP. This fill with oxide may be optional, and the preferred process may be to leave the via holes as such without fill.

Step (P) is illustrated in FIG. 5P. Aluminum is deposited to fill via holes 560 from FIG. 5O. Following this deposition, a lithography and etch process is utilized to define the aluminum metal to form via holes 562. Various elements in FIG. 5P such as 505, 506, 508, 509, 510, 544, 546, 548, 516, 518, 520, 521, 515, 522, 552, 528, 530, 532, 533, 556, 560, and 534 have been described previously.

Step (Q) is illustrated in FIG. 5Q. Bond pads 564 are constructed and wire bonds are attached to these bond pads following this step. Various elements in FIG. 5Q such as 505, 506, 508, 509, 510, 544, 546, 548, 516, 518, 520, 521, 515, 522, 552, 528, 530, 532, 533, 556, 560, 562, and 534 have been described previously. The configuration of optional reflectors 533, 521 and 509 determines light output coming from the LED. The preferred embodiment of this invention is to have reflector 533 reflect only blue light produced by multiple quantum well 528, to have the reflector 521 reflecting only green light produced by multiple quantum well 516 and to have the reflector 509 reflect light produced by multiple quantum well 506. In the process described in FIG. 5A-FIG. 5Q, the original substrates in FIG. 5A, namely 502, 512 and 524, can be re-used after ion-cut. This may make the process more cost-effective.

FIGS. 6A-6L show an alternative embodiment of this invention, where stacked RGB LEDs are formed with ion-cut technology, flip-chip packaging and aligned bonding. A smart layer transfer process, ion-cut, is therefore utilized. This process of constructing RGB LEDs could include several steps that occur in a sequence from Step (A) to Step (K). Many of the steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 6A. A red LED wafer 636 is constructed on a GaAs substrate 602 and includes a N-type confinement layer 604, a multiple quantum well (MQW) 606, a P-type confinement layer 608, an optional reflector 609 and an ITO current spreader 610. Above the ITO current spreader 610, a layer of silicon oxide 692 is deposited, patterned, etched and filled with a metal 690 (e.g., tungsten) which is then CMPed. Examples of materials used to construct these layers, include, but are not limited to, doped AlInGaP for the N-type confinement layer 604 and P-type confinement layer 608, the multiple quantum well layer 606 could be of AlInGaP and GaInP and the optional reflector 609 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 638 is constructed on a sapphire or SiC or bulk-GaN substrate 612 and includes a N-type confinement layer 614, a multiple quantum well (MQW) 616, a buffer layer 618, a P-type confinement layer 620, an optional reflector 621 and an ITO current spreader 622. Above the ITO current spreader 622, a layer of silicon oxide 696 is deposited, patterned, etched and filled with a metal 694 (e.g., tungsten) which is then CMPed. Yet another wafer is constructed with a blue LED. The blue LED wafer 640 is constructed on a sapphire or SiC or bulk-GaN substrate 624 and includes a N-type confinement layer 626, a multiple quantum well (MQW) 628, a buffer layer 630, a P-type confinement layer 632, an optional reflector 633 and an ITO current spreader 634. Above the ITO current spreader 634, a layer of silicon dioxide 698 is deposited. Examples of materials used to construct these blue and green LED layers, include, but are not limited to, doped GaN for the N-type and P-type confinement layers 614, 620, 626 and 632, AlGaN for the buffer layers 630 and 618 and InGaN/GaN for the multiple quantum wells 616 and 628. The optional reflectors 621 and 633 could be distributed Bragg Reflectors or some other type of reflectors. Various other material types and configurations could be used for constructing blue and green LEDs for this process.

Step (B) is illustrated in FIG. 6B. The blue LED wafer 640 from FIG. 6A is used for this step. Various elements in FIG. 6B such as 624, 626, 628, 630, 632, 633, 698, and 634 have been previously described. Hydrogen is implanted into the wafer at a certain depth indicated by dotted lines 642. Alternately, helium could be used for this step.

Step (C) is illustrated in FIG. 6C. A glass substrate 646 is taken and a silicon dioxide layer 688 is deposited atop it.

Step (D) is illustrated in FIG. 6D. The wafer shown in FIG. 6B is flipped and bonded atop the wafer shown in FIG. 6C using oxide-oxide bonding. Various elements in FIG. 6D such as 624, 626, 628, 630, 632, 633, 698, 642, 646, 688, and 634 have been previously described. The oxide layer 688 is essentially bonded to the oxide layer 698 using an oxide-to-oxide bonding process.

Step (E) is illustrated in FIG. 6E. Various elements in FIG. 6E such as 628, 630, 632, 633, 698, 646, 688, and 634 have been previously described. An ion-cut process is conducted to cleave the structure shown in FIG. 6D at the hydrogen implant plane 642. This ion-cut process may be preferably using a mechanical cleave. An anneal process could be utilized for the cleave as well. After the cleave, a chemical mechanical polish (CMP) process is conducted to planarize the surface. The N-type confinement layer present after this cleave and CMP process is indicated as 627.

Step (F) is illustrated in FIG. 6F. Various elements in FIG. 6F such as 628, 630, 632, 633, 698, 646, 688, 627, and 634 have been previously described. An ITO layer 648 is deposited atop the N-type confinement layer 627. Above the ITO layer 648, a layer of silicon oxide 686 is deposited, patterned, etched and filled with a metal 684 (e.g., tungsten) which is then CMPed.

Step (G) is illustrated in FIG. 6G. The green LED wafer 638 shown in Step (A) is used for this step. Various elements in FIG. 6G such as 612, 614, 616, 618, 620, 621, 696, 694, and 622 have been described previously. Hydrogen is implanted into the wafer at a certain depth indicated by dotted lines 650. Alternatively, helium could be used for this step.

Step (H) is illustrated in FIG. 6H. The structure shown in FIG. 6G is flipped and bonded atop the structure shown in FIG. 6F using oxide-oxide bonding. The metal regions 694 and 684 on the bonded wafers are aligned to each other. Various elements in FIG. 6H such as 628, 630, 632, 633, 698, 646, 688, 627, 634, 648, 686, 684, 612, 614, 616, 618, 620, 621, 696, 694, 650, and 622 have been described previously.

Step (I) is illustrated in FIG. 6I. The structure shown in FIG. 6H is cleaved at the hydrogen plane indicated by 650. This cleave process may be preferably done with a mechanical force. Alternatively, an anneal could be used. A CMP process is conducted to planarize the surface. Various elements in FIG. 6I such as 628, 630, 632, 633, 698, 646, 688, 627, 634, 648, 686, 684, 616, 618, 620, 621, 696, 694, and 622 have been described previously. The N-type confinement layer present after this cleave and CMP process is indicated as 615.

Step (J) is illustrated in FIG. 6J. An ITO layer 652 is deposited atop the structure shown in FIG. 6I. Above the ITO layer 652, a layer of silicon oxide 682 is deposited, patterned, etched and filled with a metal 680 (e.g., tungsten) which is then CMPed.

Various elements in FIG. 6J such as 628, 630, 632, 633, 698, 646, 688, 627, 634, 648, 686, 684, 616, 618, 620, 621, 696, 694, 615, and 622 have been described previously.

Step (K) is illustrated in FIG. 6K. Using procedures similar to Step (G)-Step (J), the red LED layer is transferred atop the structure shown in FIG. 6J. The N-type confinement layer after ion-cut is indicated by 605. An ITO layer 656 is deposited atop the N-type confinement layer 605. Various elements in FIG. 6K such as 628, 630, 632, 633, 698, 646, 688, 627, 634, 648, 686, 684, 616, 618, 620, 621, 696, 694, 615, 690, 692, 610, 609, 608, 606, and 622 have been described previously.

Step (L) is illustrated in FIG. 6L. Using flip-chip packaging procedures similar to those described in FIG. 4A-FIG. 4S, the RGB LED stack shown in FIG. 6K is attached to a silicon sub-mount 668. 658 indicates a reflecting material, 664 is a nickel layer, 666 represents solder bumps, 670 is an aluminum via, and 672 is either an oxide layer or an air gap. Various elements in FIG. 6K such as 628, 630, 632, 633, 698, 646, 688, 627, 634, 648, 686, 684, 616, 618, 620, 621, 696, 694, 615, 690, 692, 610, 609, 608, 606, 605, 656, and 622 have been described previously. The configuration of optional reflectors 633, 621 and 609 determines light output coming from the LED. A preferred embodiment of this invention may not have a reflector 633, but may have the reflector 621 (reflecting only the blue light produced by multiple quantum well 628) and the reflector 609 (reflecting only the green light produced by multiple quantum well 616). In the process described in FIG. 6A-FIG. 6L, the original substrates in FIG. 6A, namely 602, 612, and 624, can be re-used after ion-cut. This may make the process more cost-effective.

FIGS. 7A-L illustrate an embodiment of this invention, where stacked RGB LEDs are formed with laser lift-off, substrate etch, flip-chip packaging and conductive oxide bonding. Essentially, smart layer transfer techniques are used. This process could include several steps that occur in a sequence from Step (A) to Step (M). Many of the steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A): This is illustrated using FIG. 7A. A red LED wafer 736 is constructed on a GaAs substrate 702 and includes a N-type confinement layer 704, a multiple quantum well (MQW) 706, a P-type confinement layer 708, an optional reflector 709 and an ITO current spreader 710. Examples of materials used to construct these layers, include, but are not limited to, doped AlInGaP for the N-type confinement layer 704 and P-type confinement layer 708, the multiple quantum well layer 706 could be of AlInGaP and GaInP and the optional reflector 409 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 738 is constructed on a sapphire substrate 712 (or some other transparent substrate) and includes a N-type confinement layer 714, a multiple quantum well (MQW) 716, a buffer layer 718, a P-type confinement layer 720, an optional reflector 721 and an ITO current spreader 722. Yet another wafer is constructed with a blue LED. The blue LED wafer 740 is constructed on a sapphire substrate 724 (or some other transparent substrate) and includes a N-type confinement layer 726, a multiple quantum well (MQW) 728, a buffer layer 730, a P-type confinement layer 732, an optional reflector 733 and an ITO current spreader 734. Examples of materials used to construct these blue and green LED layers, include, but are not limited to, doped GaN for the N-type and P-type confinement layers 714, 720, 726 and 732, AlGaN for the buffer layers 730 and 718 and InGaN/GaN for the multiple quantum wells 716 and 728. The optional reflectors 721 and 733 could be distributed Bragg Reflectors or some other type of reflectors. Various other material types and configurations could be used for constructing blue and green LEDs for this process.

Step (B) is illustrated in FIG. 7B. A glass substrate 746 is taken and an ITO layer 744 is deposited atop it.

Step (C) is illustrated in FIG. 7C. The blue LED wafer 740 shown in FIG. 7A is flipped and bonded atop the wafer shown in FIG. 7B using ITO-ITO bonding. Various elements in FIG. 7C such as 724, 726, 728, 730, 732, 733, 734, 746, and 744 have been previously described. The ITO layer 744 is essentially bonded to the ITO layer 734 using an oxide-to-oxide bonding process.

Step (D) is illustrated in FIG. 7D. A laser is used to shine radiation through the sapphire substrate 724 of FIG. 7C and a laser lift-off process is conducted. The sapphire substrate 724 of FIG. 7C is removed with the laser lift-off process. Further details of the laser lift-off process are described in U.S. Pat. No. 6,071,795 by Nathan W. Cheung, Timothy D. Sands and William S. Wong ("Cheung"). A CMP process is conducted to planarize the surface of the N confinement layer 727 after laser lift-off of the sapphire substrate. Various elements in FIG. 7D such as 728, 730, 732, 733, 734, 746, and 744 have been previously described.

Step (E) is illustrated in FIG. 7E. Various elements in FIG. 7E such as 728, 730, 732, 733, 734, 746, 727, and 744 have been previously described. An ITO layer 748 is deposited atop the N confinement layer 727.

Step (F) is illustrated in FIG. 7F. The green LED wafer 738 is flipped and bonded atop the structure shown in FIG. 7E using ITO-ITO bonding of layers 722 and 748. Various elements in FIG. 7F such as 728, 730, 732, 733, 734, 746, 727, 748, 722, 721, 720, 718, 716, 714, 712 and 744 have been previously described.

Step (G) is illustrated in FIG. 7G. A laser is used to shine radiation through the sapphire substrate 712 of FIG. 7F and a laser lift-off process is conducted. The sapphire substrate 712 of FIG. 7F is removed with the laser lift-off process. A CMP process is conducted to planarize the surface of the N-type confinement layer 715 after laser lift-off of the sapphire substrate. Various elements in FIG. 7G such as 728, 730, 732, 733, 734, 746, 727, 748, 722, 721, 720, 718, 716, and 744 have been previously described.

Step (H) is illustrated in FIG. 7H. An ITO layer 752 is deposited atop the N-type confinement layer 715. Various elements in FIG. 7H such as 728, 730, 732, 733, 734, 746, 727, 748, 722, 721, 720, 718, 716, 715, and 744 have been previously described.

Step (I) is illustrated in FIG. 7I. The red LED wafer 736 from FIG. 7A is flipped and bonded atop the structure shown in FIG. 7H using ITO-ITO bonding of layers 710 and 752. Various elements in FIG. 7I such as 728, 730, 732, 733, 734, 746, 727, 748, 722, 721, 720, 718, 716, 715, 752, 710, 709, 708, 706, 704, 702, and 744 have been previously described.

Step (J) is illustrated in FIG. 7J. The GaAs substrate 702 from FIG. 7I is removed using etch and/or CMP. Following this etch and/or CMP process, the N-type confinement layer 704 of FIG. 7I is planarized using CMP to form the N-type confinement layer 705. Various elements in FIG. 7J such as 728, 730, 732, 733, 734, 746, 727, 748, 722, 721, 720, 718, 716, 715, 752, 710, 709, 708, 706, and 744 have been previously described.

Step (K) is illustrated in FIG. 7K. An ITO layer 756 is deposited atop the N confinement layer 705 of FIG. 7J. Various elements in FIG. 7K such as 728, 730, 732, 733, 734, 746, 727, 748, 722, 721, 720, 718, 716, 715, 752, 710, 709, 708, 706, 705, and 744 have been previously described.

Step (L) is illustrated in FIG. 7L. Using flip-chip packaging procedures similar to those described in FIG. 4A-FIG. 4S, the RGB LED stack shown in FIG. 7K is attached to a silicon sub-mount 768. 758 indicates a reflecting material, 764 is a nickel layer, 766 represents solder bumps, 762 is an aluminum via, and 772 is either an oxide layer or an air gap. Various elements in FIG. 7L such as 728, 730, 732, 733, 734, 746, 727, 748, 722, 721, 720, 718, 716, 715, 752, 710, 709, 708, 706, 705, and 756 have been described previously. The configuration of optional reflectors 733, 721 and 709 determines light output coming from the LED. The preferred embodiment of this invention may not have a reflector 733, but may have the reflector 721 (reflecting only the blue light produced by multiple quantum well 728) and the reflector 709 (reflecting only the green light produced by multiple quantum well 716).

FIGS. 8A-B show an embodiment of this invention, where stacked RGB LEDs are formed from a wafer having red LED layers and another wafer having both green and blue LED layers. Therefore, a smart layer transfer process is used to form the stacked RGB LED. FIG. 8A shows that a red LED wafer 836 and another wafer called a blue-green LED wafer 836 are used. The red LED wafer 836 is constructed on a GaAs substrate 802 and includes a N-type confinement layer 804, a multiple quantum well (MQW) 806, a P-type confinement layer 808, an optional reflector 809 and an ITO current spreader 810. Examples of materials used to construct these layers, include, but are not limited to, doped AlInGaP for the N-type confinement layer 804 and P-type confinement layer 808, the multiple quantum well layer 806 could be of AlInGaP and GaInP and the optional reflector 809 could be a distributed Bragg Reflector. A double heterostructure configuration or single quantum well configuration could be used instead of a multiple quantum well configuration. Various other material types and configurations could be used for constructing the red LEDs for this process. The blue-green LED wafer 838 is constructed on a sapphire or bulk GaN or SiC substrate 812 (or some other transparent substrate) and includes a N-type confinement layer 814, a green multiple quantum well (MQW) 816, a blue multiple quantum well 817, a buffer layer 818, a P-type confinement layer 820, an optional reflector 821, and an ITO current spreader 822. Examples of materials used to construct the blue-green LED wafers, include, but are not limited to, doped GaN for the N-type and P-type confinement layers 814, 820, AlGaN for the buffer layer 818 and InGaN/GaN for the multiple quantum wells 816 and 817. The optional reflector 821 could be a distributed Bragg Reflector or some other type of reflector. The optional reflector 821 could alternatively be built between the N-type confinement layer 814 or below it, and this is valid for all LEDs discussed in the patent application. Various other material types and configurations could be used for constructing blue-green LED wafers for this process. Using smart layer transfer procedures similar to those shown in FIG. 4-FIG. 7, the stacked RGB LED structure shown in FIG. 8B is constructed. Various elements in FIG. 8B such as 806, 808, 809, 810, 816, 817, 818, 820, 821, and 822 have been described previously. 846 is a glass substrate, 844 is an ITO layer, 815 is a N-type confinement layer for a blue-green LED, 852 is an ITO layer, 805 is a N-type confinement layer for a red LED, 856 is an ITO layer, 858 is a reflecting material such as, for example, silver or aluminum, 864 is a nickel layer, 866 is a solder layer, 862 is a contact layer constructed of aluminum or some other metal, 860 may be preferably an air gap but could be an oxide layer and 868 is a silicon sub-mount. The configuration of optional reflectors 821 and 809 determines light produced by the LED. For the configuration shown in FIG. 8B, the preferred embodiment may not have the optional reflector 821 and may have the optional reflector 809 reflecting light produced by the blue and green quantum wells 816 and 817.

FIG. 9 illustrates an embodiment of this invention, where stacked RGB LEDs are formed with control and driver circuits for the LED built on the silicon sub-mount. Procedures similar to those described in FIG. 4-FIG. 7 are utilized for constructing and packaging the LED. Control and driver circuits are integrated on the silicon sub-mount 968 and can be used for controlling and driving the stacked RGB LED. 946 is a glass substrate, 944 and 934 are ITO layers, 933 is an optional reflector, 932 is a P-type confinement layer for a blue LED, 930 is a buffer layer for a blue LED, 928 is a blue multiple quantum well, 927 is a N-type confinement layer for a blue LED, 948 and 922 are ITO layers, 921 is an optional reflector, 920 is a P-type confinement layer for a green LED, 918 is a buffer layer for a green LED, 916 is a multiple quantum well for a green LED, 915 is a N-type confinement layer for a green LED, 952 and 910 are ITO layers, 909 is a reflector, 908 is a P-type confinement layer for a red LED, 906 is a red multiple quantum well, 905 is a N-type confinement layer for a red LED, 956 is an ITO layer, 958 is a reflecting layer such as aluminum or silver, 962 is a metal via constructed, for example, out of aluminum, 960 is an air-gap or an oxide layer, 964 is a nickel layer, and 966 is a solder bump.

FIG. 10 illustrates an embodiment of this invention, where stacked RGB LEDs are formed with control and driver circuits as well as image sensors for the LED built on the silicon sub-mount 1068. Image sensors essentially monitor the light coming out of the LED and tune the voltage and current given by control and driver circuits such that light output of the LED is the right color and intensity. 1046 is a glass substrate, 1044 and 1034 are ITO layers, 1033 is an optional reflector, 1032 is a P-type confinement layer for a blue LED, 1030 is a buffer layer for a blue LED, 1028 is a blue multiple quantum well, 1027 is a N-type confinement layer for a blue LED, 1048 and 1022 are ITO layers, 1021 is an optional reflector, 1020 is a P-type confinement layer for a green LED, 1018 is a buffer layer for a green LED, 1016 is a multiple quantum well for a green LED, 1015 is a N-type confinement layer for a green LED, 1052 and 1010 are ITO layers, 1009 is a reflector, 1008 is a P-type confinement layer for a red LED, 1006 is a red multiple quantum well, 1005 is a N-type confinement layer for a red LED, 1056 is an ITO layer, 1058 is a reflecting layer such as aluminum or silver, 1062 is a metal via constructed for example out of aluminum, 1060 is an air-gap or an oxide layer, 1064 is a nickel layer and 1066 is a solder bump. The via hole 1074 helps transfer light produced by the blue multiple quantum well 1028 reach an image sensor on the silicon sub-mount 1068. The via hole 1072 helps transfer light produced by the green multiple quantum well 1016 to an image sensor on the silicon sub-mount 1068. The via hole 1070 helps transfer light produced by the red multiple quantum well 1006 reach an image sensor on the silicon sub-mount 1068. By sampling the light produced by each of the quantum wells on the LED, voltage and current drive levels to different terminals of the LED can be determined. Color tunability, temperature compensation, better color stability, and many other features can be obtained with this scheme. Furthermore, circuits to communicate wirelessly with the LED can be constructed on the silicon sub-mount. Light output of the LED can be modulated by a signal from the user delivered wirelessly to the light.

While three LED layers, namely, red, green, and blue, are shown as stacked in various embodiments of this invention, it will be clear to one skilled in the art based on the present disclosure that more than three LED layers can also be stacked. For example, red, green, blue and yellow LED layers can be stacked.

The embodiments of this invention described in FIG. 4-FIG. 10 share a few common features. They have multiple stacked (or overlying) layers, they are constructed using smart layer transfer techniques and at least one of the stacked layers has a thickness less than 50 microns. When cleave is done using ion-cut, substrate layers that are removed using cleave can be reused after a process flow that often includes a CMP.

FIGS. 11A-F show a prior art illustration of phosphor-coated LEDs (pcLEDs) constructed with ion-cut processes. The process begins in FIG. 11A with a bulk-GaN substrate 1102, and an oxide layer 1104 is deposited atop it. The oxide layer 1104 is an oxide compatible with GaN. FIG. 11B depicts hydrogen being implanted into the structure shown in FIG. 11A at a certain depth (for ion-cut purposes). 1102 and 1104 have been described previously with respect to FIG. 11A. Dotted lines 1106 indicate the plane of hydrogen ions. Alternatively, helium can be implanted instead of hydrogen or hydrogen and helium can be co-implanted. FIG. 11C shows a silicon wafer 1108 with an oxide layer 1110 atop it. The structure shown in FIG. 11B is flipped and bonded atop the structure shown in FIG. 11C using oxide-to-oxide bonding of layers 1104 and 1110. This is depicted in FIG. 11D. 1108, 1110 and 1106 have been described previously. FIG. 11E shows the next step in the process. Using an anneal, a cleave is conducted at the plane of hydrogen atoms 1106 shown in FIG. 11D, and a CMP is done to form GaN layer 1112. 1104, 1110 and 1108 have been described previously. FIG. 11F shows the following step in the process. A blue LED 1114 is grown epitaxially above the GaN layer 1112. 1104, 1108 and 1110 have been described previously. A phosphor layer can be coated atop the blue LED 1114 to form a white phosphor coated LED.

There may be some severe challenges with the prior art process shown in FIGS. 11A-F. The thermal expansion coefficients for GaN layers 1112 in FIG. 11F are very different from that for silicon layers 1108. This difference can cause cracks and defects while growing the blue LED layer 1114 at high temperatures (>600° C.), which usually occurs. These cracks and defects, in turn, cause bad efficiency and can in turn cause the phosphor coated LED process in FIG. 11A-F to be difficult to manufacture. Furthermore, an anneal (typically >400° C.) is typically used in FIG. 11E to cleave the bulk GaN layers. This can again cause issues with mismatch of thermal expansion co-efficients and cause cracking and defects.

FIGS. 12A-F describe an embodiment of this invention, where phosphor coated LEDs are formed with an ion-cut process (i.e. a smart layer transfer process). It minimizes the problem with mismatch of thermal expansion co-efficients that is inherent to the process described in FIGS. 11A-F. This process could include several steps as described in the following sequence:

Step (A): FIG. 12A illustrates this step. A blue LED wafer is constructed on a bulk-GaN substrate 1216. For discussions within this document, the bulk-GaN substrate could be semi-polar or non-polar or polar. The blue LED wafer includes a N-type confinement layer 1214, a multiple quantum well (MQW) 1212, a buffer layer 1210, a P-type confinement layer 1208, an optional reflector 1204 and an ITO current spreader 1206. Examples of materials used to construct these blue LED layers, include, but are not limited to, doped GaN for the N-type and P-type confinement layers 1214 and 1208, AlGaN for the buffer layer 1210 and InGaN/GaN for the multiple quantum wells 1212. The optional reflector 1204 could be distributed Bragg Reflector, an Aluminum or silver layer or some other type of reflectors. A silicon dioxide layer 1202 is deposited atop the optional reflector 1204.

Step (B): FIG. 12B illustrates this step. The blue LED wafer described in FIG. 12A has hydrogen implanted into it at a certain depth. The dotted lines 1218 depict the hydrogen implant. Alternatively, helium can be implanted. Various elements in FIG. 12B such as 1216, 1214, 1212, 1210, 1208, 1206, 1204, and 1202 have been described previously.

Step (C): FIG. 12C illustrates this step. A wafer 1220, preferably of silicon, having the same wafer size as the structure in FIG. 12B is taken and an oxide layer 1222 is grown or deposited atop it.

Step (D): FIG. 12D illustrates this step. The structure shown in FIG. 12B is flipped and bonded atop the structure shown in FIG. 12C using oxide-to-oxide bonding of layers 1202 and 1222. Various elements in FIG. 12D such as 1216, 1214, 1212, 1210, 1208, 1206, 1204, 1220, 1222, 1218 and 1202 have been described previously.

Step (E): FIG. 12E illustrates this step. The structure shown in FIG. 12D is cleaved at its hydrogen plane 1218. A mechanical cleave may be preferably used for this process. However, an anneal could be used as well. The mechanical cleave process typically happens at room temperatures, and therefore can avoid issues with thermal expansion co-efficients mismatch. After cleave, the wafer is planarized and the N-type confinement layer 1215 is formed. Various elements in FIG. 12E such as 1212, 1210, 1208, 1206, 1204, 1220, 1222, and 1202 have been described previously. The bulk GaN substrate 1216 from FIG. 12D that has been cleaved away can be reused. This may be attractive from a cost perspective, since bulk GaN substrates are quite costly.

Step (F): This is illustrated in FIG. 12F. An ITO layer 1224 is deposited atop the structure shown in FIG. 12E. Various elements in FIG. 12F such as 1212, 1210, 1208, 1206, 1204, 1220, 1222, 1215, 1224, and 1202 have been described previously.

A phosphor coating can be applied over the structure shown in FIG. 12F to produce a phosphor-coated LED. The advantage of the process shown in FIG. 12A-F over the process shown in FIG. 11A-F may include low process temperatures, even less than 250° C. Therefore, issues with thermal expansion co-efficients mismatch are substantially mitigated. While the description in FIG. 12A-F is for a LED, many other devices, such as, for example, laser diodes, high power transistors, high frequencies transistors, special transmitter circuits and many other devices can be constructed, according to a similar description, with bulk-GaN.

In the description of FIG. 12A-F, silicon is described as a preferred material for the substrate 1220. Silicon has a co-efficient of thermal expansion of about 2.6 ppm/° C., while bulk-GaN, which is the substrate 1216 on which the LED is epitaxially grown, has a co-efficient of thermal expansion of 5.6 ppm/° C. In an alternate embodiment of this invention, the substrate 1220 used in FIG. 12A-F could be constructed of a material that has a co-efficient of thermal expansion (CTE) fairly close to bulk-GaN. Preferably, the CTE of the substrate 1220 could be any value in between (the CTE of bulk GaN−2 ppm/° C.) and (the CTE of bulk GaN+2 ppm/° C.). Examples of materials that could be used for the substrate 1220 could include, but are not limited to, Germanium, that has a CTE of 5.8 ppm/° C., and various ceramic materials. Having CTE for the substrate 1220 close to bulk-GaN prevents defects and cracks being formed due to issues with mismatch of CTE, even if higher temperature processing (>250° C.) is used.

In an alternative embodiment of this invention, the flow in FIG. 11A-F can be used with the substrate 1108 having a CTE fairly close to the CTE of bulk GaN. Preferably, the CTE of the substrate 1108 could be any value in between (the CTE of bulk GaN−2 ppm/° C.) and (the CTE of bulk GaN+2 ppm/° C.). Examples of materials that could be used for the substrate 1108 could include, but are not limited to, Germanium, that has a CTE of 5.8 ppm/° C., and various ceramic materials.

NuDisplay Technology:

In displays and microdisplays (small size displays where optical magnification is needed), transistors need to be formed on glass or plastic substrates. These substrates typically cannot withstand high process temperatures (e.g., >400° C.). Layer transfer can be advantageously used for constructing displays and microdisplays as well, since it may enable transistors to be processed on these substrates at <400° C. Various embodiments of transistors constructed on glass substrates are described in this patent application. These transistors constructed on glass substrates could form part of liquid crystal displays (LCDs) or other types of displays. It will be clear to those skilled in the art based on the present disclosure that these techniques can also be applied to plastic substrates.

FIGS. 22A-G describe a process for forming recessed channel single crystal (or monocrystalline) transistors on glass substrates at a temperature approximately less than 400° C. for display and microdisplay applications. This process could include several steps that occur in a sequence from Step (A) to Step (G). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 13A. A silicon wafer 2202 is taken and a n+ region 2204 is formed by ion implantation. Following this formation, a layer of p− Silicon 2206 is epitaxially grown. An oxide layer 2210 is then deposited. Following this deposition, an anneal is performed to activate dopants in various layers. It will be clear to one skilled in the art based on the present disclosure that various other procedures can be used to get the structure shown in FIG. 13A. Step (B) is illustrated in FIG. 22B. Hydrogen is implanted into the structure shown in FIG. 13A at a certain depth indicated by 2212. Alternatively, Helium can be used for this purpose. Various elements in FIG. 22B, such as 2202, 2204, 2006, and 2210 have been described previously. Step (C) is illustrated in FIG. 13C. A glass substrate 2214 is taken and a silicon oxide layer 2216 is deposited atop it at compatible temperatures. Step (D) is illustrated in FIG. 13D. Various elements in FIG. 13D, such as 2202, 2204, 2206, 2210, 2214, and 2216 have been described previously. The structure shown in FIG. 13B is flipped and bonded to the structure shown in FIG. 13C using oxide-to-oxide bonding of layers 2210 and 2216. Step (E) is illustrated in FIG. 13E. The structure shown in FIG. 13D is cleaved at the hydrogen plane 2212 of FIG. 13D. A CMP is then done to planarize the surface and yield the n+Si layer 2218. Various other elements in FIG. 13E, such as 2214, 2216, 2210 and 2206 have been described previously. Step (F) is illustrated in FIG. 13F. Various elements in FIG. 13F such as 2214, 2216, 2210, and 2206 have been described previously. An oxide layer 2220 is formed using a shallow trench isolation (STI) process. This helps isolate transistors. Step (G) is illustrated in FIG. 13G. Various elements in FIG. 13G such as 2210, 2216, 2220 and 2214 have been described previously. Using etch techniques, part of the n+ Silicon layer from FIG. 13F and optionally p− Silicon layer from FIG. 13F are etched. After this a thin gate dielectric is deposited, after which a gate dielectrode is deposited. The gate dielectric and gate electrode are then polished away to form the gate dielectric layer 2224 and gate electrode layer 2222. The n+ Silicon layers 2228 and 2226 form the source and drain regions of the transistors while the p− Silicon region after this step is indicated by 2230. Contacts and other parts of the display/microdisplay are then fabricated. It can be observed that during the whole process, the glass substrate substantially always experiences temperatures less than 400° C., or even lower. This is because the crystalline silicon can be transferred atop the glass substrate at a temperature less than 400° C., and dopants are pre-activated before layer transfer to glass.

FIG. 14A-H describes a process of forming both nMOS and pMOS transistors with single-crystal silicon on a glass substrate at temperatures less than 400° C., and even lower. Ion-cut technology (which is a smart layer transfer technology) is used. While the process flow described is shown for both nMOS and pMOS on a glass substrate, it could also be used for just constructing nMOS devices or for just constructing pMOS devices. This process could include several steps that occur in a sequence from Step (A) to Step (H). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 14F:
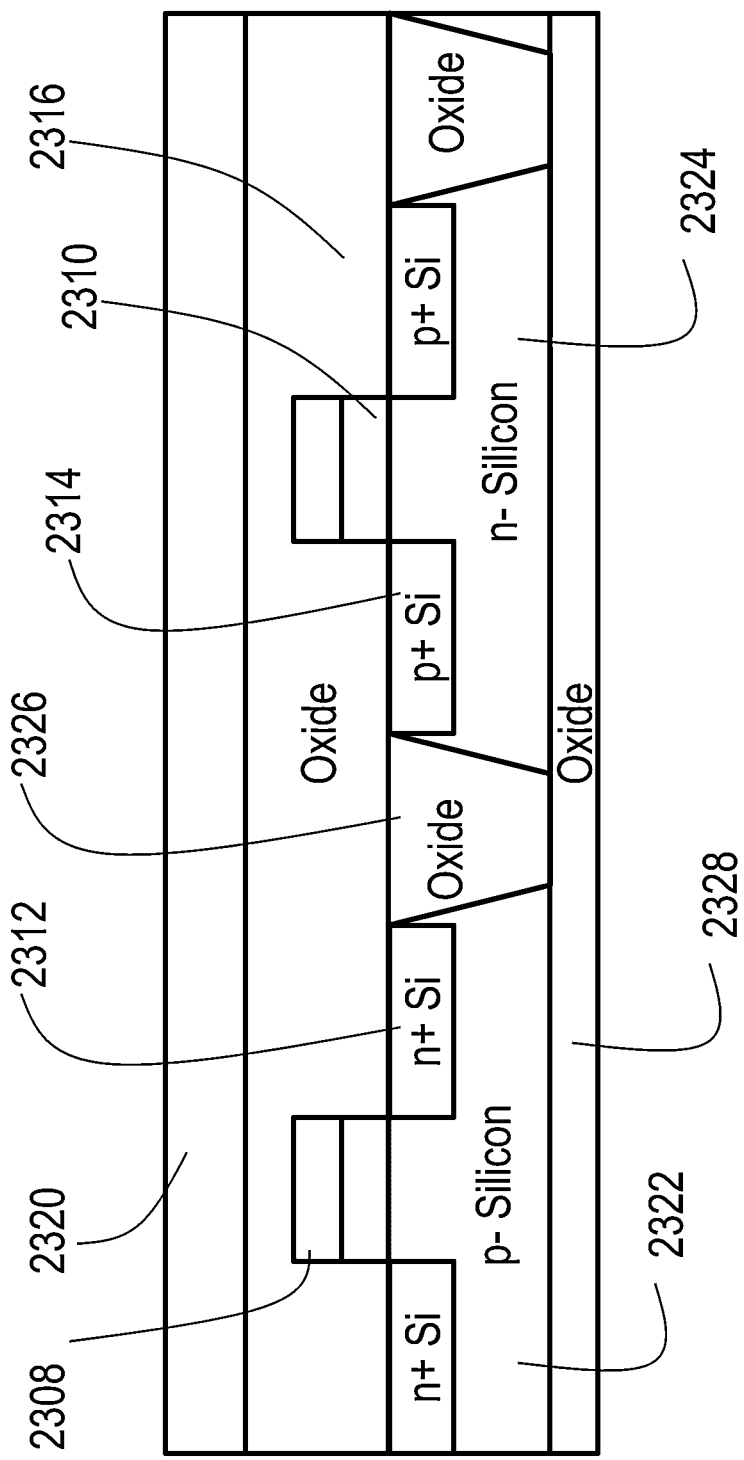
Figure 14G:
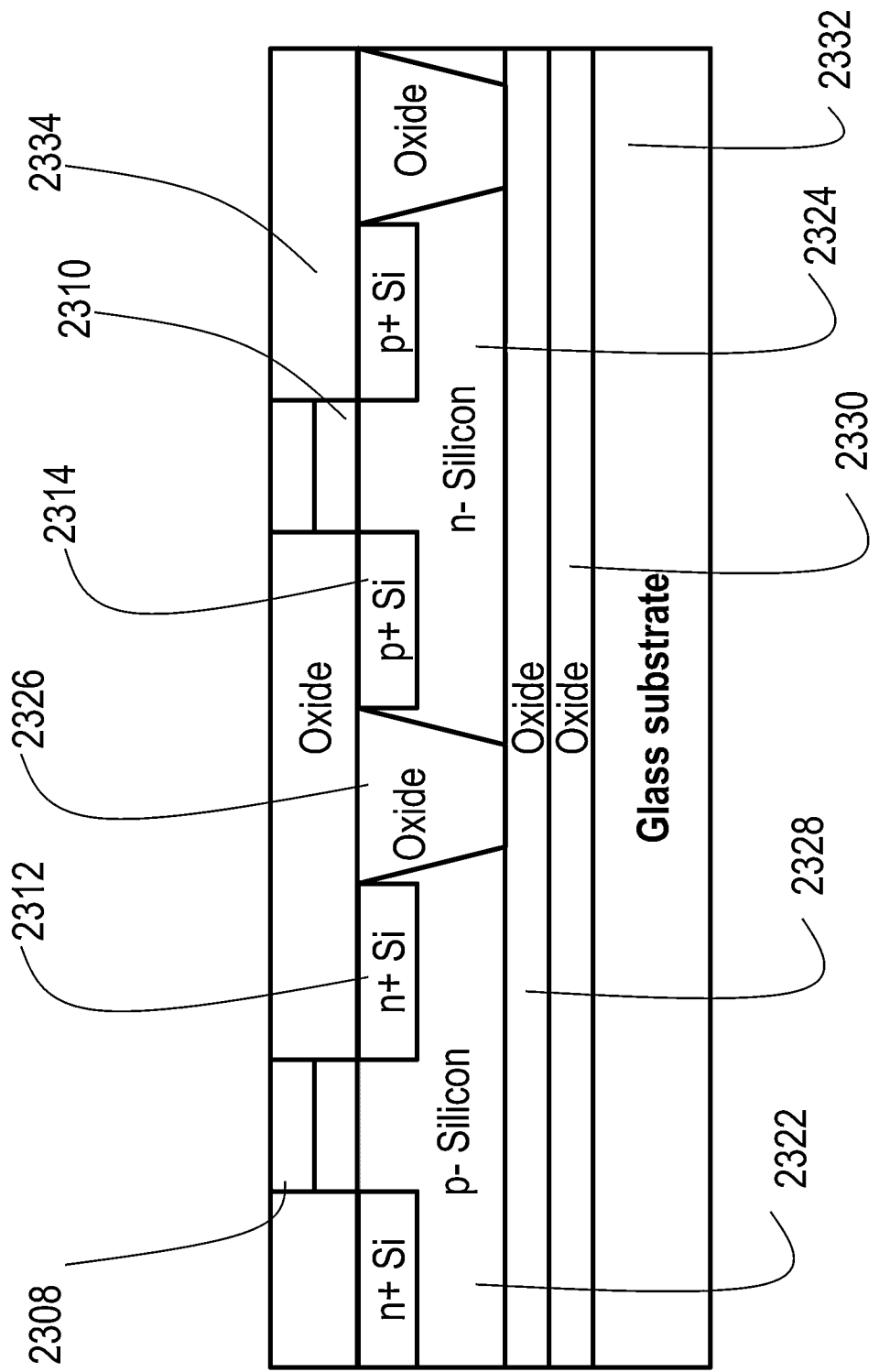
Figure 14H:
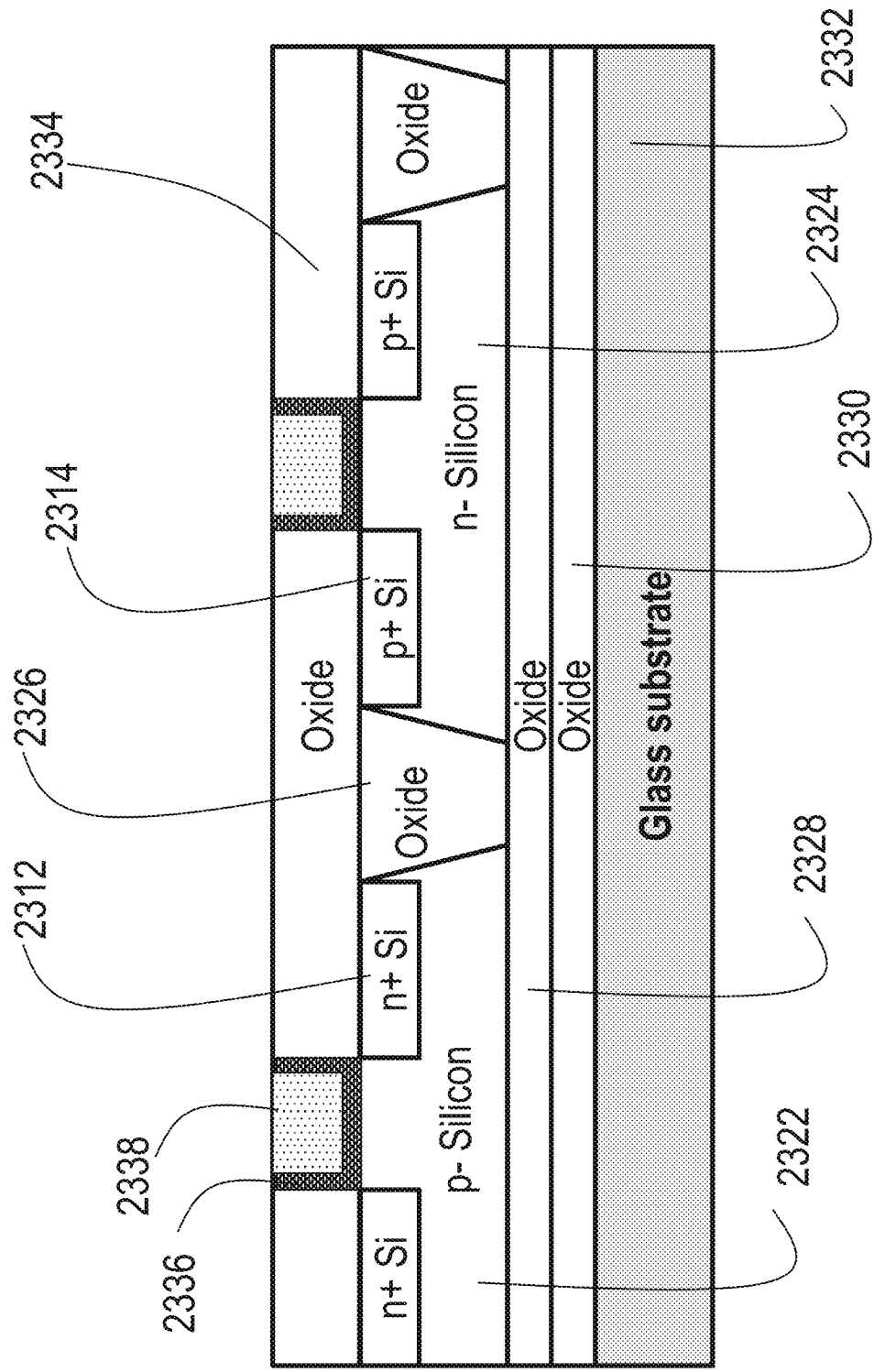

Step (A) is illustrated in FIG. 14A. A p− Silicon wafer 2302 is taken and a n well 2304 is formed on the p− Silicon wafer 2302. Various additional implants to optimize dopant profiles can also be done. Following this formation, an isolation process is conducted to form isolation regions 2306. A dummy gate dielectric 2310 made of silicon dioxide and a dummy gate electrode 2308 made of polysilicon are constructed. Step (B) is illustrated in FIG. 14B. Various elements of FIG. 14B, such as 2302, 2304, 2306, 2308 and 2310 have been described previously. Implants are done to form source-drain regions 2312 and 2314 for both nMOS and pMOS transistors. A rapid thermal anneal (RTA) is then done to activate dopants. Alternatively, a spike anneal or a laser anneal could be done. Step (C) is illustrated in FIG. 14C. Various elements of FIG. 14C such as 2302, 2304, 2306, 2308, 2310, 2312 and 2314 have been described previously. An oxide layer 2316 is deposited and planarized with CMP. Step (D) is described in FIG. 14D. Various elements of FIG. 14D such as 2302, 2304, 2306, 2308, 2310, 2312, 2314, and 2316 have been described previously. Hydrogen is implanted into the wafer at a certain depth indicated by 2318. Alternatively, helium can be implanted. Step (E) is illustrated in FIG. 14E. Various elements of FIG. 14E such as 2302, 2304, 2306, 2308, 2310, 2312, 2314, 2316, and 2318 have been described previously. Using a temporary bonding adhesive, the oxide layer is bonded to a temporary carrier wafer 2320. An example of a temporary bonding adhesive is a polyimide that can be removed by shining a laser. An example of a temporary carrier wafer is glass. Step (F) is described in FIG. 14F. The structure shown in FIG. 14E is cleaved at the hydrogen plane using a mechanical force. Alternatively, an anneal could be used. Following this cleave, a CMP is done to planarize the surface. An oxide layer is then deposited. FIG. 14F shows the structure after all these steps are done, with the deposited oxide layer indicated as 2328. After the cleave, the p− Silicon region is indicated as 2322, the n− Silicon region is indicated as 2324, and the oxide isolation regions are indicated as 2326. Various other elements in FIG. 14F such as 2308, 2320, 2312, 2314, 2310, and 2316 have been described previously. Step (G) is described in FIG. 14G. The structure shown in FIG. 14F is bonded to a glass substrate 2332 with an oxide layer 2330 using oxide-to-oxide bonding. Various elements in FIG. 14G such as 2308, 2326, 2322, 2324, 2312, 2314, and 2310 have been described previously. Oxide regions 2328 and 2330 are bonded together. The temporary carrier wafer from FIG. 14F is removed by shining a laser through it. A CMP process is then conducted to reach the surface of the gate electrode 2308. The oxide layer remaining is denoted as 2334. Step (H) is described in FIG. 14H. Various elements in FIG. 14H such as 2312, 2314, 2328, 2330, 2332, 2334, 2326, 2324, and 2322 have been described previously. The dummy gate dielectric and dummy gate electrode are etched away in this step and a replacement gate dielectric 2336 and a replacement gate electrode 2338 are deposited and planarized with CMP. Examples of replacement gate dielectrics could be hafnium oxide or aluminum oxide while examples of replacement gate electrodes could be TiN or TaN or some other material. Contact formation, metallization and other steps for building a display/microdisplay are then conducted. It can be observed that after attachment to the glass substrate, no process step requires a processing temperature above 400° C.

FIGS. 24A-F describe an embodiment of this invention, where single-crystal Silicon junction-less transistors are constructed above glass substrates at a temperature approximately less than 400° C. An ion-cut process (which is a smart layer transfer process) is utilized for this purpose. This process could include several steps that occur in a sequence from Step (A) to Step (F). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 15B:
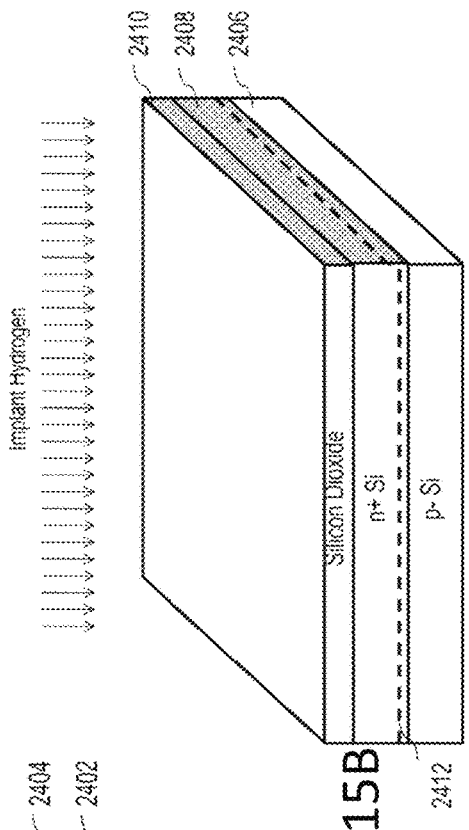
FIGS. 15A-15F are exemplary drawn illustrations of a display constructed using sub-400° C. processed single crystal junction-less transistors on a glass substrate.
Figure 15A:
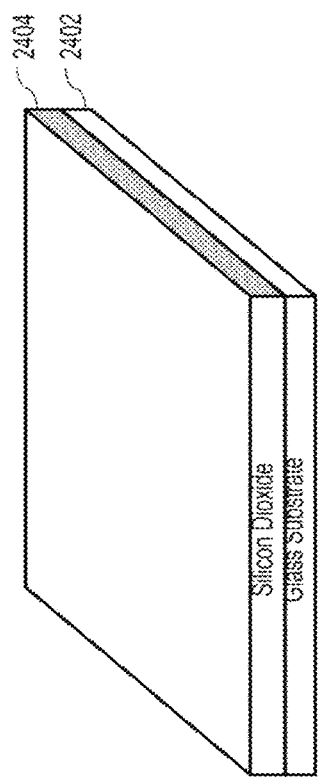

Step (A) is illustrated in FIG. 15A. A glass substrate 2402 is taken and a layer of silicon oxide 2404 is deposited on the glass substrate 2402.

Step (B) is illustrated in FIG. 15B. A p− Silicon wafer 2406 is implanted with a n+ Silicon layer 2408 above which an oxide layer 2410 is deposited. A RTA or spike anneal or laser anneal is conducted to activate dopants. Following this, hydrogen is implanted into the wafer at a certain depth indicated by 2412. Alternatively, helium can be implanted. Step (C) is illustrated in FIG. 15C. The structure shown in FIG. 15B is flipped and bonded onto the structure shown in FIG. 15A using oxide-to-oxide bonding. This bonded structure is cleaved at its hydrogen plane, after which a CMP is done. FIG. 15C shows the structure after all these processes are completed. 2414 indicates the n+ Si layer, while 2402, 2404, and 2410 have been described previously.

Figure 15D:
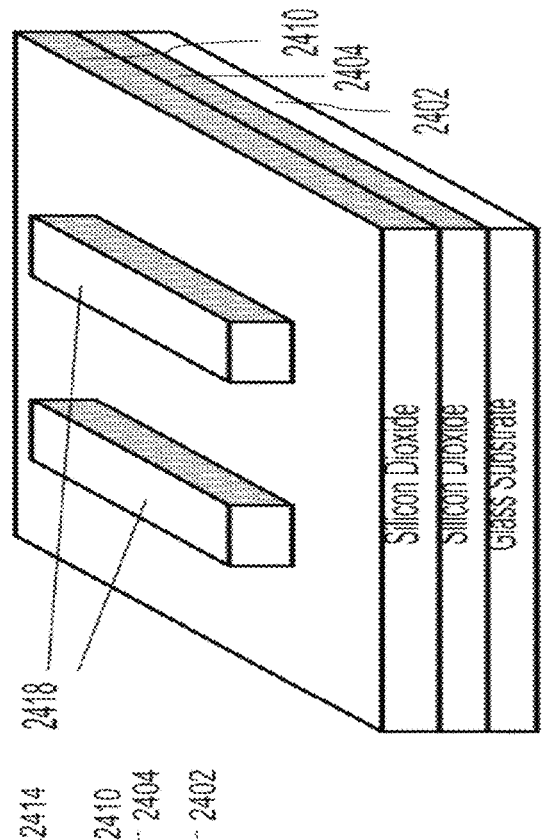
Figure 15C:
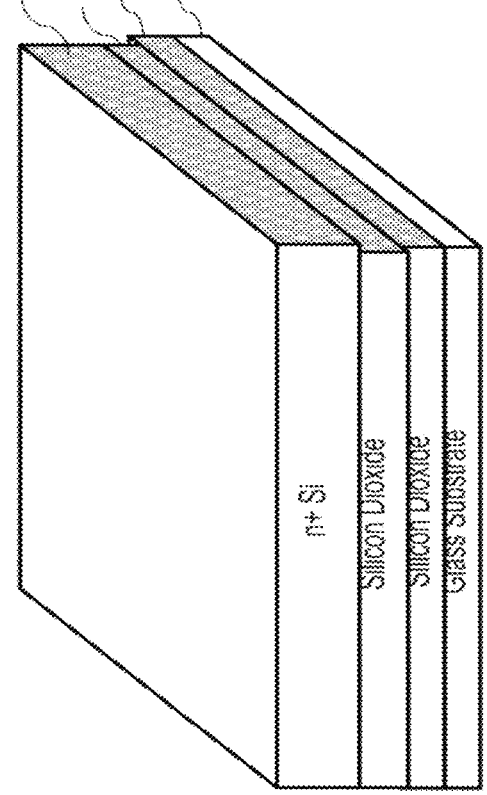

Step (D) is illustrated in FIG. 15D. A lithography and etch process is conducted to pattern the n+ Silicon layer 2414 in FIG. 15C to form n+ Silicon regions 2418 in FIG. 15D. The glass substrate is indicated as 2402 and the bonded oxide layers 2404 and 2410 are shown as well.

Figure 15E:
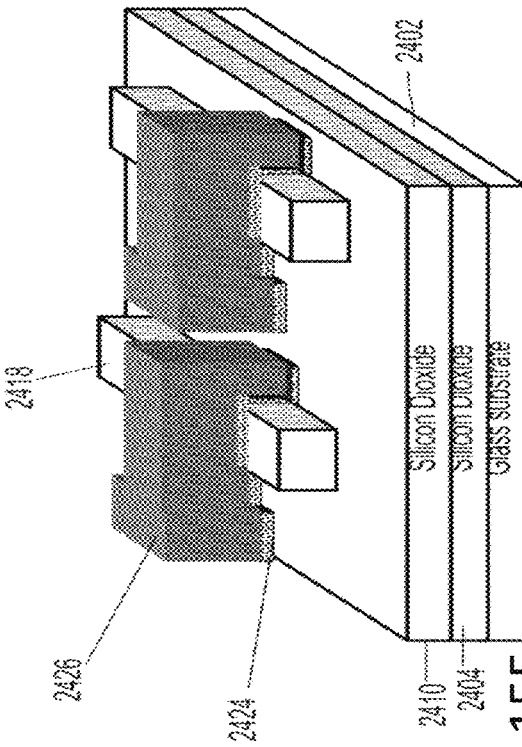

Step (E) is illustrated in FIG. 15E. A gate dielectric 2420 and gate electrode 2422 are deposited, following which a CMP is done. 2402 is as described previously. The n+Si regions 2418 are not visible in this figure, since they are covered by the gate electrode 2422. Oxide regions 2404 and 2410 have been described previously.

Figure 15F:
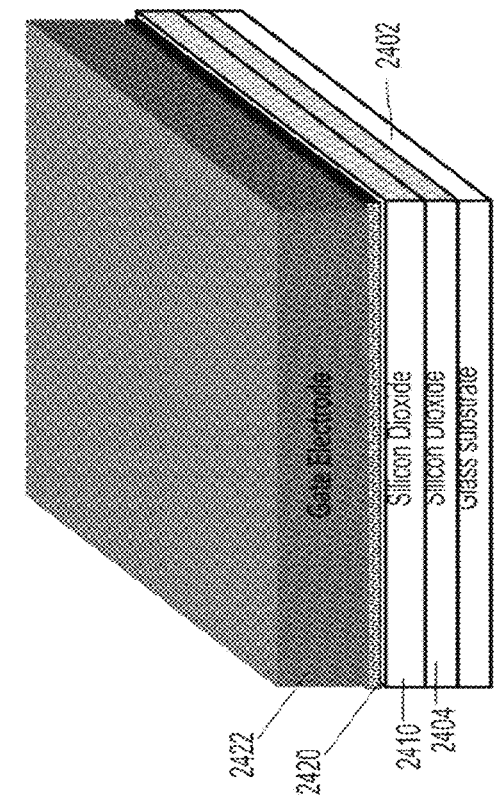

Step (F) is illustrated in FIG. 15F. The gate dielectric 2420 and gate electrode 2422 from FIG. 15E are patterned and etched to form the structure shown in FIG. 15F. The gate dielectric after the etch process is indicated as 2424 while the gate electrode after the etch process is indicated as 2426. n+ Si regions are indicated as 2418 while the glass substrate is indicated as 2402. Oxide regions 2404 and 2410 have been described previously. It can be observed that a three-side gated junction-less transistor is formed at the end of the process described with respect of FIGS. 24A-F. Contacts, metallization and other steps for constructing a display/microdisplay are performed after the steps indicated by FIGS. 24A-F. It can be seen that the glass substrate is not exposed to temperatures greater than approximately 400° C. during any step of the above process for forming the junction-less transistor.

FIGS. 25A-D describe an embodiment of this invention, where amorphous Si or polysilicon junction-less transistors are constructed above glass substrates at a temperature less than 400° C. This process could include several steps that occur in a sequence from Step (A) to Step (D). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 16A:
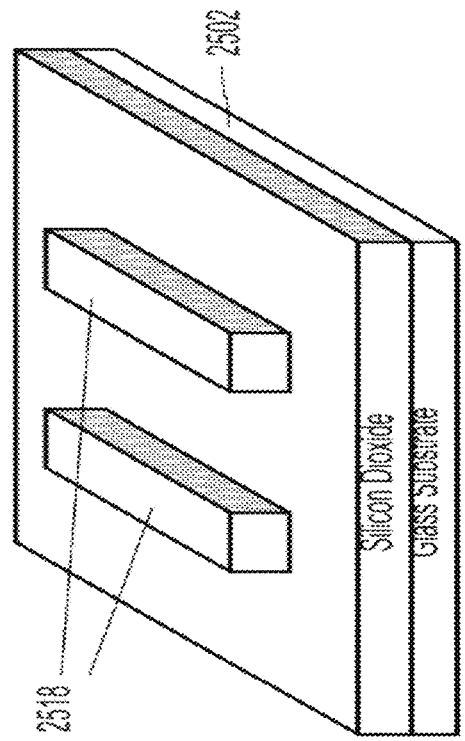
Figure 16B:
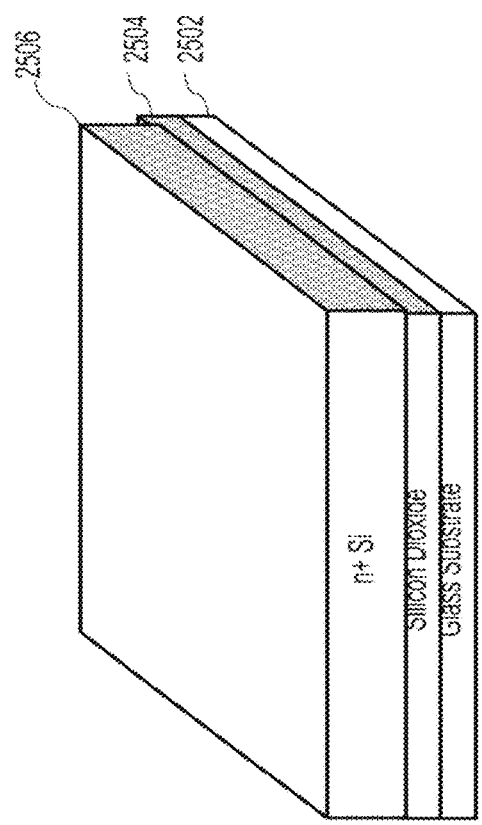

Step (A) is illustrated in FIG. 16A. A glass substrate 2502 is taken and a layer of silicon oxide 2504 is deposited on the glass substrate 2502. Following this deposition, a layer of n+ Si 2506 is deposited using low-pressure chemical vapor deposition (LPCVD) or plasma enhanced chemical vapor deposition (PECVD). This layer of n+ Si could optionally be hydrogenated. Step (B) is illustrated in FIG. 16B. A lithography and etch process is conducted to pattern the n+ Silicon layer 2506 in FIG. 16A to form n+ Silicon regions 2518 in FIG. 16B. 2502 and 2504 have been described previously. Step (C) is illustrated in FIG. 16C. A gate dielectric 2520 and gate electrode 2522 are deposited, following which a CMP is optionally done. 2502 is as described previously. The n+ Si regions 2518 are not visible in this figure, since they are covered by the gate electrode 2522.

Step (D) is illustrated in FIG. 16D. The gate dielectric 2520 and gate electrode 2522 from FIG. 16C are patterned and etched to form the structure shown in FIG. 16D. The gate dielectric after the etch process is indicated as 2524 while the gate electrode after the etch process is indicated as 2526. n+ Si regions are indicated as 2518 while the glass substrate is indicated as 2502. It can be observed that a three-side gated junction-less transistor is formed at the end of the process described with respect of FIGS. 25A-D. Contacts, metallization and other steps for constructing a display/microdisplay are performed after the steps indicated by FIGS. 25A-D. It can be seen that the glass substrate is not exposed to temperatures greater than 400° C. during any step of the above process for forming the junction-less transistor.

FIGS. 26A-C illustrate an embodiment of this invention, where a microdisplay is constructed using stacked RGB LEDs and control circuits are connected to each pixel with solder bumps. This process could include several steps that occur in a sequence from Step (A) to Step (C). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 17A. Using procedures similar to FIG. 4A-S, the structure shown in FIG. 17A is constructed. Various elements of FIG. 17A are as follows:

2646—a glass substrate,

2644—an oxide layer, could be a conductive oxide such as ITO,

2634—an oxide layer, could be a conductive oxide such as ITO

2633—a an optional reflector, could be a Distributed Bragg Reflector or some other type of reflector,

2632—a P-type confinement layer that is used for a Blue LED (One example of a material for this region is GaN),

2630—a buffer layer that is typically used for a Blue LED (One example of a material for this region is AlGaN),

2628—a multiple quantum well used for a Blue LED (One example of materials for this region is InGaN/GaN),

2627—a N-type confinement layer that is used for a Blue LED (One example of a material for this region is GaN).

2648—an oxide layer, may be preferably a conductive metal oxide such as ITO,

2622—an oxide layer, may be preferably a conductive metal oxide such as ITO,

2621—an optional reflector (for example, a Distributed Bragg Reflector),

2620—a P-type confinement layer that is used for a Green LED (One example of a material for this region is GaN),

2618—a buffer layer that is typically used for a Green LED (One example of a material for this region is AlGaN),

2616—a multiple quantum well used for a Green LED (One example of materials for this region are InGaN/GaN),

2615—a N-type confinement layer that is used for a Green LED (One example of a material for this region is GaN),

2652—an oxide layer, may be preferably a conductive metal oxide such as ITO,

2610—an oxide layer, may be preferably a conductive metal oxide such as ITO,

2609—an optional reflector (for example, a Distributed Bragg Reflector),

2608—a P-type confinement layer used for a Red LED (One example of a material for this region is AlInGaP),

2606—a multiple quantum well used for a Red LED (One example of materials for this region are AlInGaP/GaInP),

2604—a P-type confinement layer used for a Red LED (One example of a material for this region is AlInGaP),

2656—an oxide layer, may be preferably a transparent conductive metal oxide such as ITO, and

2658—a reflector (for example, aluminum or silver).

Step (B) is illustrated in FIG. 17B. Via holes 2662 are etched to the substrate layer 2646 to isolate different pixels in the microdisplay/display. Also, via holes 2660 are etched to make contacts to various layers of the stack. These via holes may be preferably not filled. An alternative is to fill the via holes with a compatible oxide and planarize the surface with CMP. Various elements in FIG. 17B such as 2646, 2644, 2634, 2633, 2632, 2630, 2628, 2627, 2648, 2622, 2621, 2620, 2618, 2616, 2615, 2652, 2610, 2609, 2608, 2606, 2604, 2656 and 2658 have been described previously.

Step (C) is illustrated in FIG. 17C. Using procedures similar to those described in respect to FIGS. 4A-S, the via holes 2660 have contacts 2664 (for example, with Aluminum) made to them. Also, using procedures similar to those described in FIGS. 4A-S, nickel layers 2666, solder layers 2668, and a silicon sub-mount 2670 with circuits integrated on them are constructed. The silicon sub-mount 2670 has transistors to control each pixel in the microdisplay/display. Various elements in FIG. 17C suchs 2646, 2644, 2634, 2633, 2632, 2630, 2628, 2627, 2648, 2622, 2621, 2620, 2618, 2616, 2615, 2652, 2610, 2609, 2608, 2606, 2604, 2656, 2660, 2662, and 2658 have been described previously.

It can be seen that the structure shown in FIG. 17C can have each pixel emit a certain color of light by tuning the voltage given to the red, green and blue layers within each pixel. This microdisplay may be constructed using the ion-cut technology, a smart layer transfer technique.

FIGS. 27A-D illustrate an embodiment of this invention, where a microdisplay is constructed using stacked RGB LEDs and control circuits are integrated with the RGB LED stack. This process could include several steps that occur in a sequence from Step (A) to Step (D). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams-particularly in relating analogous, similar or identical functionality to different physical structures.

Step (A) is illustrated in FIG. 18A. Using procedures similar to those illustrated in FIGS. 4A-S, the structure shown in FIG. 18A is constructed. Various elements of FIG. 18A are as follows:

2746—a glass substrate,

2744—an oxide layer, could be a conductive oxide such as ITO,

2734—an oxide layer, could be a conductive oxide such as ITO,

2733—a an optional reflector (e.g., a Distributed Bragg Reflector or some other type of reflector),

2732—a P-type confinement layer that is used for a Blue LED (One example of a material for this region is GaN),

2730—a buffer layer that is typically used for a Blue LED (One example of a material for this region is AlGaN),

2728—a multiple quantum well used for a Blue LED (One example of materials for this region are InGaN/GaN),

2727—a N-type confinement layer that is used for a Blue LED (One example of a material for this region is GaN),

2748—an oxide layer, may be preferably a conductive metal oxide such as ITO,

2722—an oxide layer, may be preferably a conductive metal oxide such as ITO,

2721—an optional reflector (e.g., a Distributed Bragg Reflector),

2720—a P-type confinement layer that is used for a Green LED (One example of a material for this region is GaN),

2718—a buffer layer that is typically used for a Green LED (One example of a material for this region is AlGaN),

2716—a multiple quantum well used for a Green LED (One example of materials for this region are InGaN/GaN),

2715—a N-type confinement layer that is used for a Green LED (One example of a material for this region is GaN),

2752—an oxide layer, may be preferably a conductive metal oxide such as ITO,

2710—an oxide layer, may be preferably a conductive metal oxide such as ITO,

2709—an optional reflector (e.g., a Distributed Bragg Reflector),

2708—a P-type confinement layer used for a Red LED (One example of a material for this region is AlInGaP),

2706—a multiple quantum well used for a Red LED (One example of materials for this region are AlInGaP/GaInP),

2704—a P-type confinement layer used for a Red LED (One example of a material for this region is AlInGaP),

2756—an oxide layer, may be preferably a transparent conductive metal oxide such as ITO,

2758—a reflector (e.g., aluminum or silver).

Figure 18D:
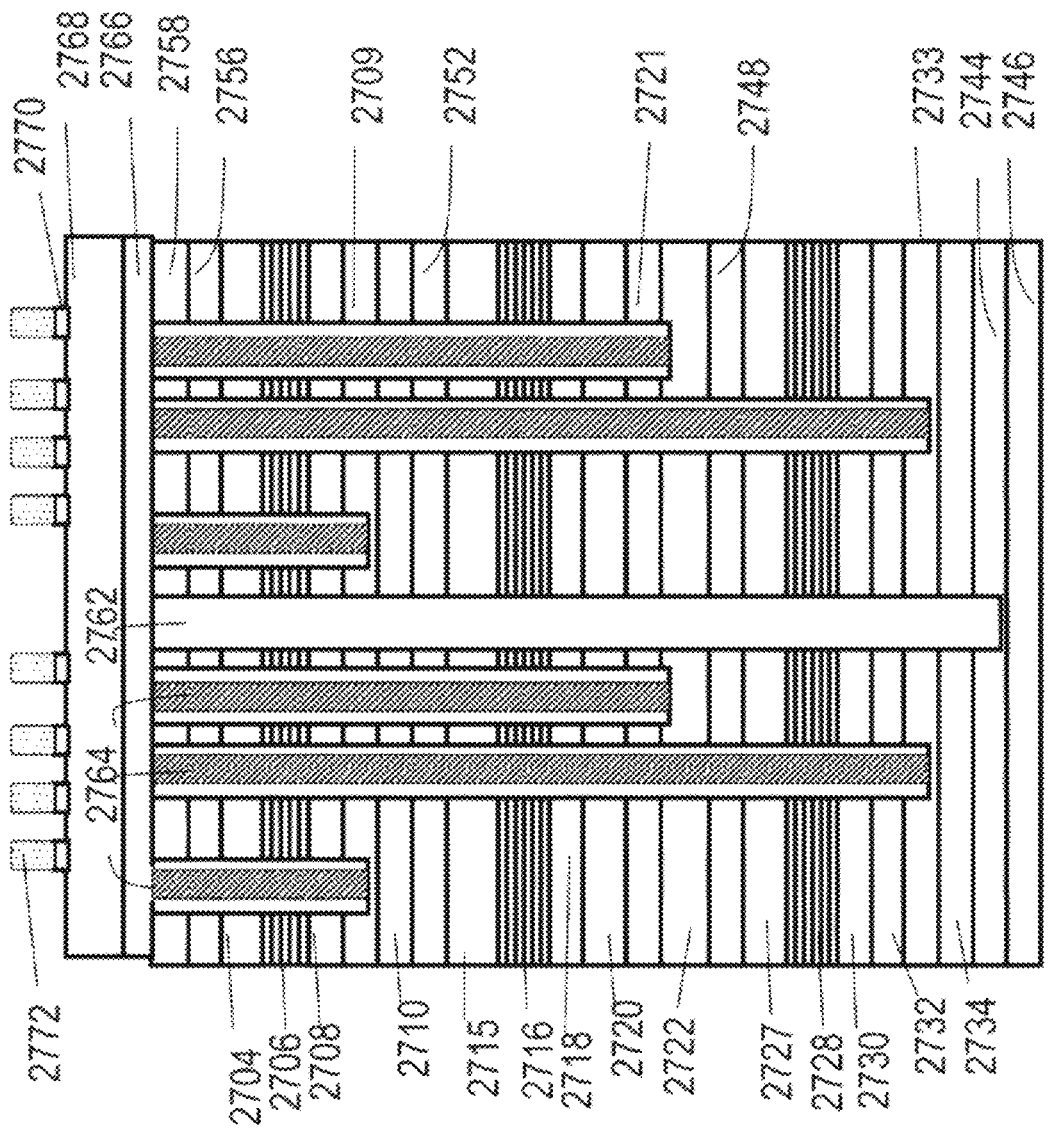

Step (B) is illustrated in FIG. 18B. Via holes 2762 are etched to the substrate layer 2746 to isolate different pixels in the microdisplay/display. Also, via holes 2760 are etched to make contacts to various layers of the stack. These via holes may be preferably filled with a compatible oxide and the surface can be planarized with CMP. Various elements of FIG. 18B such as 2746, 2744, 2734, 2733, 2732, 2730, 2728, 2727, 2748, 2722, 2721, 2720, 2718, 2716, 2715, 2752, 2710, 2709, 2708, 2706, 2704, 2756 and 2758 have been described previously. Step (C) is illustrated in FIG. 18C. Metal 2764 (for example) is constructed within the via holes 2760 using procedures similar to those described in respect to FIGS. 4A-S. Following this construction, an oxide layer 2766 is deposited. Various elements of FIG. 18C such as 2746, 2744, 2734, 2733, 2732, 2730, 2728, 2727, 2748, 2722, 2721, 2720, 2718, 2716, 2715, 2752, 2710, 2709, 2708, 2706, 2704, 2756, 2760, 2762 and 2758 have been described previously. Step (D) is illustrated in FIG. 18D. Using procedures described in co-pending U.S. patent application Ser. No. 12/901,890, the content of which is incorporated herein by reference, a single crystal silicon transistor layer 2768 can be monolithically integrated using ion-cut technology atop the structure shown in FIG. 18C. This transistor layer 2768 is connected to various contacts of the stacked LED layers (not shown in the figure for simplicity). Following this connection, nickel layer 2770 is constructed and solder layer 2772 is constructed. The packaging process then is conducted where the structure shown in FIG. 18D is connected to a silicon sub-mount. It can be seen that the structure shown in FIG. 18D can have each pixel emit a certain color of light by tuning the voltage given to the red, green and blue layers within each pixel. This microdisplay is constructed using the ion-cut technology, a smart layer transfer technique. This process where transistors are integrated monolithically atop the stacked RGB display can be applied to the LED concepts disclosed in association with FIGS. 4-10.

The embodiments of this invention described in FIGS. 26-27 may enable novel implementations of "smart-lighting concepts" (also known as visible light communications) that are described in "Switching LEDs on and off to enlighten wireless communications", EETimes, June 2010 by R. Colin Johnson. For these prior art smart lighting concepts, LED lights could be turned on and off faster than the eye can react, so signaling or communication of information with these LED lights is possible. An embodiment of this invention involves designing the displays/microdisplays described in FIGS. 26-27 to transmit information, by modulating wavelength of each pixel and frequency of switching each pixel on or off. One could thus transmit a high bandwidth through the visible light communication link compared to a LED, since each pixel could emit its own information stream, compared to just one information stream for a standard LED. The stacked RGB LED embodiment described in FIGS. 4A-S could also provide a improved smart-light than prior art since it allows wavelength tunability besides the ability to turn the LED on and off faster than the eye can react.

3-D Micro-Display

Figure 19A:
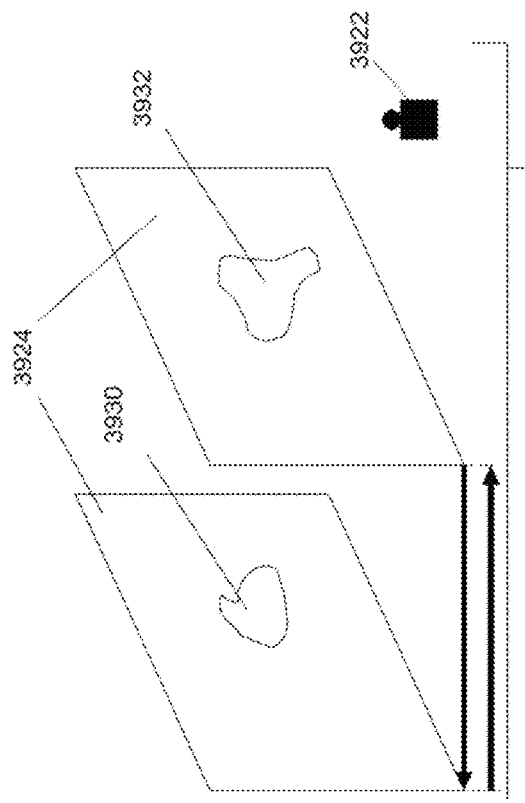
FIGS. 19A-19D illustrate embodiments of this invention, where multiple screens which may be actuated by motors are used to render displays in 3D.

The three-dimensional (3D) display of images has been demonstrated by the use of holography to the use of 3D glasses that use either color or polarization. The main technique in common with these methods is to induce stereoscopic vision by making each eye see a slightly offset image on the screen. Though effective in fooling the human brain into seeing images in 3D, the problem with these techniques is that even though the desired effect can be achieved, the brain eventually is strained, resulting in headaches for several individuals. FIG. 19A illustrates the source of the straining of the brain. A system 3900 may be set up such that the viewer 3902 is observing an object 3910 projected on a display 3904. The source of the strain is from the fact that the actual image of the object 3910 is still a fixed distance on the screen, while the image of the object perceived in the brain 3912 can be within a few inches of the viewer 3902 or several miles away in perceived distance. As such, the eyes are focused on a screen several feet away while the brain perceives an image at a different location, and this separation of reality and image leads to brain and/or eye strain.

In micro-displays, where the actual images are small but through the use of lenses are magnified to possibly life-size as interpreted by the brain, this problem of eye/brain separation may also exist. The distances, however, are compressed by the magnification ratio of the lenses and thus the result is not as severe and is easier to rectify. A possible solution is to move the display physically so as to show images according to their apparent distance from the viewer. If the objects at their respective distances are shown in succession faster than the brain can perceive movement, then the brain will see all objects at various apparent distances all at once, hence creating a total image containing all the object distance information, and will appear as an actual 3D image.

As the brain perceives distance in greater detail when close than farther away, the physical steps of the plane of the display may be arranged in nonlinear fashion, with more steps related to distances closer to the viewer and less steps related to distances further away, that is, of increasing intervals as the distance grows larger with for example, a geometric relationship.

Assuming enough 3D details of the objects in the image are available, an external joystick may also be used to control the vantage point of the image or object/s to allow for virtual stage rotation.

Figure 19B:
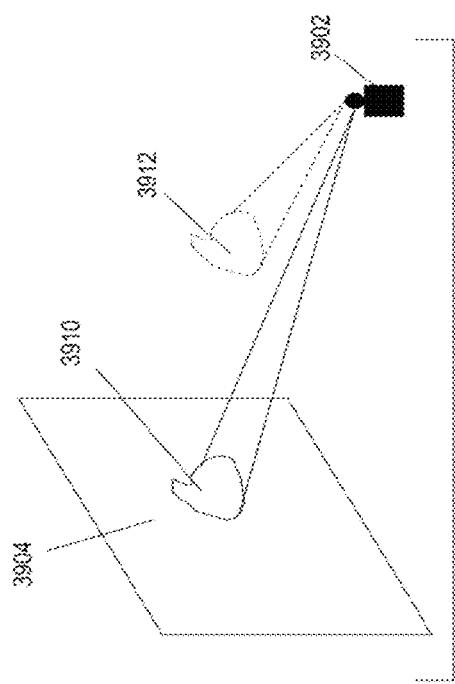

FIG. 19B illustrates an embodiment of the invention, where a display system 3920 may be set-up such that viewer 3922 observes an image which may consist of far object 3930 and near object 3932 projected onto the display 3924. The display 3924 is enabled to physically move back and forth with respect to the viewer 3922 such that it may start from the far end displaying only the far object 3930 and move forward to the near end (nearer to viewer 3922) displaying only the near object 3932. Any objects that may be of intermediate distance from the viewer may then be displayed on the display 3924 during the sweep at their respective distances, but only one-at-a-time if the distances are distinct. In order to make the objects appear as one 3D image perceived by the brain, this forward and backward sweep of the display 3924 may be performed at a rate faster than about 24 cycles per second. If the image is intended to show progression as in a movie, then the forward and backward sweep of the display 3924 may be performed at a rate faster than the frame rate of the movie multiplied by 24 cycles per second. An actuator with a fast motor which may be used to achieve such actuation speed may include, for example, a piezo-electric motor (not shown).

Figure 19C:
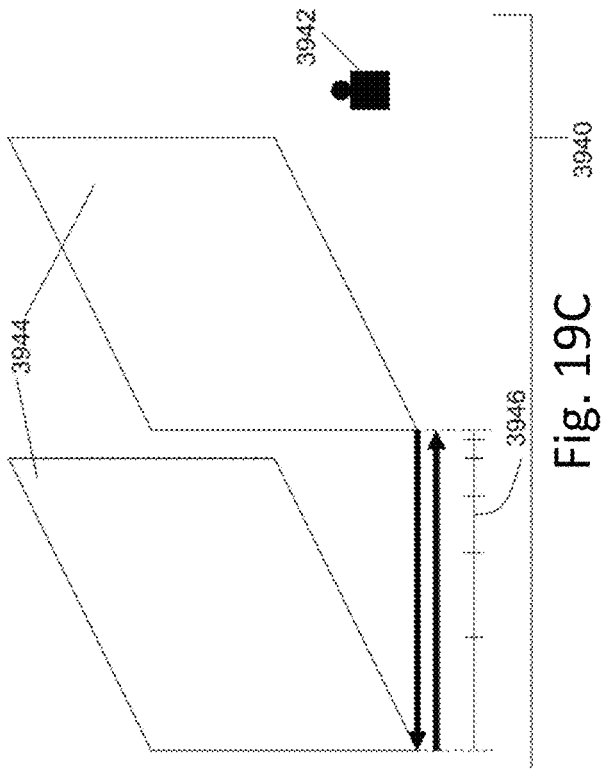

FIG. 19C illustrates another embodiment of the invention, where a display system 3940 may be setup similar to display system 3920 in FIG. 19B with viewer 3942 observing an image projected onto the moving display 3944. The moving display 3944 may sweep forward and backward with respect to viewer 3942 similar to display system 3920 but the sweep steps 3946 may not be of constant value but may be of nonlinear magnitudes of the distance of the image objects. This takes advantage of the fact that the brain, by result of angular perception, recognizes differences in distances in greater detail when objects are closer and lesser detail when objects are further, so thus the display step resolution for closer objects is necessarily dense but may be progressively relaxed at greater object distances, such as shown by exemplary sweep steps 3946.

Figure 19D:
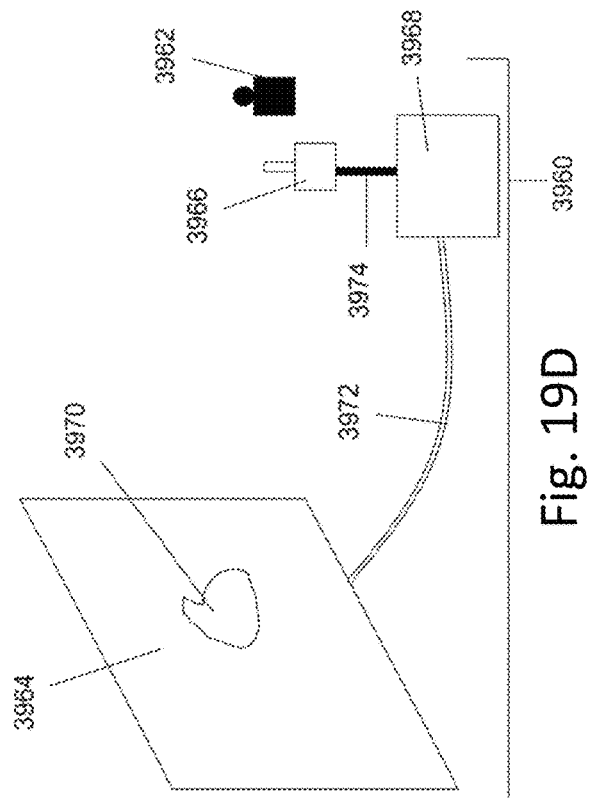

FIG. 19D illustrates another embodiment of the invention, where a display system 3960 may be setup similar to display system 3920 in FIG. 19B with viewer 3962 observing an image object 3970 projected onto the moving display 3964. Computer 3968 may contain 3D data of image object 3970 available for display and may be connected via link 3972 to the display 3964. Computer 3968 may also be connected via link 3974 to joystick 3966, which allows viewer 3962 to control the orientation of the image object 3970 according to available 3D data stored in computer 3968.

Persons of ordinary skill in the art will appreciate that while image "objects" has been referred to as display targets, these may equivalently be replaced by the term image "pixels". Moreover, the nonlinear steps of the display forward-backward sweep described in FIG. 39 FIG. 19C may be of any resolution and may involve any type of nonlinear relationships with viewer distance as desired. Many other modifications within the scope of the illustrated embodiments of the invention will suggest themselves to such skilled persons after reading this specification. Thus the invention is to be limited only by the appended claims Persons of ordinary skill in the art will appreciate that while image "objects" has been referred to as display targets, these may equivalently be replaced by the term image "pixels". Moreover, the nonlinear steps of the display forward-backward sweep described in FIG. 19C may be of any resolution and may involve any type of nonlinear relationships with viewer distance as desired.

Many other modifications within the scope of the illustrated embodiments of the invention will suggest themselves to such skilled persons after reading this specification. Thus the invention is to be limited only by the appended claims

We claim:

1. A 3D micro display, the 3D micro display comprising:
a first level comprising a first single crystal layer, said first single crystal layer comprises at least one LED driving circuit;
a second level comprising a first plurality of light emitting diodes (LEDs), said first plurality of LEDs comprising a second single crystal layer,
wherein said second level is disposed on top of said first level,
wherein said second level comprises at least ten individual first LED pixels; and
a bonding structure,
wherein said bonding structure comprises oxide to oxide bonding.

2. The 3D micro display according to claim 1,
wherein a plurality of said at least ten individual first LED pixels are individually driven, and
wherein each of said plurality of said at least ten individual first LED pixels is driven by a unique said at least one LED driving circuit.

3. The 3D micro display according to claim 1, further comprising:
a top surface of said first single crystal layer; and
a bottom surface of said second single crystal layer,
wherein a vertical distance is a distance from said top surface of said first single crystal layer to said bottom surface of said second single crystal layer, and
wherein said vertical distance is less than ten microns and greater than 0.1 microns.

4. The 3D micro display according to claim 1, further comprising:
a second plurality of light emitting diodes (LEDs),
wherein said first plurality of LEDs emits a first light with a first wavelength,
wherein said second plurality of LEDs emits a second light with a second wavelength, and
wherein said first wavelength and said second wavelength differ by greater than 10 nm.

5. The 3D micro display according to claim 1,
wherein said first single crystal layer thickness is greater than 10 nm and smaller than 50 micrometers.

6. The 3D micro display according to claim 1,
wherein said second single crystal layer thickness is greater than 10 nm and smaller than 50 micrometers.

7. The 3D micro display according to claim 1,
wherein said at least one LED driving circuit comprises n type devices and p type devices.

8. A 3D micro display, the 3D micro display comprising:
a first level comprising a first single crystal layer, said first single crystal layer comprises at least one LED driving circuit;
a second level comprising a first plurality of light emitting diodes (LEDs), said first plurality of LEDs comprising a second single crystal layer,
wherein said second level is disposed on top of said first level,
wherein said second level comprises at least ten individual first LED pixels; and a bonding structure,
  wherein said first level is bonded to said second level, and
  wherein said bonded comprises oxide to oxide bonding.

9. The 3D micro display according to claim 8,
wherein a plurality of said at least ten individual first LED pixels are individually driven, and
wherein each of said plurality of said at least ten individual first LED pixels is driven by a unique said at least one LED driving circuit.

10. The 3D micro display according to claim 8, further comprising:
a top surface of said first single crystal layer; and
a bottom surface of said second single crystal layer,
  wherein a vertical distance is a distance from said top surface of said first single crystal layer to said bottom surface of said second single crystal layer, and
  wherein said vertical distance is less than ten microns and greater than 0.1 microns.

11. The 3D micro display according to claim 8, further comprising:
a second plurality of light emitting diodes (LEDs),
  wherein said first plurality of LEDs emits a first light with a first wavelength,
  wherein said second plurality of LEDs emits a second light with a second wavelength, and
  wherein said first wavelength and said second wavelength differ by greater than 10 nm.

12. The 3D micro display according to claim 8,
wherein said first single crystal layer thickness is greater than 10 nm and smaller than 50 micrometers.

13. The 3D micro display according to claim 8,
wherein said second single crystal layer thickness is greater than 10 nm and smaller than 50 micrometers.

14. The 3D micro display according to claim 8,
wherein said at least one LED driving circuit comprises n type devices and p type devices.

15. A 3D micro display, the 3D micro display comprising:
a first level comprising a first single crystal layer, said first single crystal layer comprises at least one LED driving circuit;
a second level comprising a first plurality of light emitting diodes (LEDs), said first plurality of LEDs comprising a second single crystal layer,
  wherein said second level is disposed on top of said first level,
  wherein said second level comprises at least ten individual first LED pixels,
  wherein said first plurality of LEDs comprise at least 10 individual LED pixels,
  wherein said at least 10 individual LED pixels been made individual by an etch process; and
a bonding structure,
  wherein said first level is bonded to said second level, and
  wherein said bonded comprises oxide to oxide bonding.

16. The 3D micro display according to claim 15,
wherein a plurality of said first LED pixels are individually driven, and
wherein each of said plurality of said first LED pixels is driven by a unique said at least one LED driving circuit.

17. The 3D micro display according to claim 15, further comprising:
a top surface of said first single crystal layer; and
a bottom surface of said second single crystal layer,
  wherein a vertical distance is a distance from said top surface of said first single crystal layer to said bottom surface of said second single crystal layer, and
  wherein said vertical distance is less than ten microns and greater than 0.1 microns.

18. The 3D micro display according to claim 15, further comprising:
a second plurality of light emitting diodes (LEDs),
  wherein said first plurality of LEDs emits a first light with a first wavelength,
  wherein said second plurality of LEDs emits a second light with a second wavelength, and
  wherein said first wavelength and said second wavelength differ by greater than 10 nm.

19. The 3D micro display according to claim 15,
wherein said first single crystal layer thickness is greater than 10 nm and smaller than 50 micrometers.

20. The 3D micro display according to claim 15,
wherein said at least one LED driving circuit comprises n type devices and p type devices.

* * * * *